(12) United States Patent
Sasada et al.

(10) Patent No.: US 11,005,044 B2
(45) Date of Patent: May 11, 2021

(54) LIGHT EMITTING DEVICE

(71) Applicant: Sumitomo Chemical Company, Limited, Tokyo (JP)

(72) Inventors: Toshiaki Sasada, Ibaraki (JP); Makoto Anryu, Tokyo (JP); Nobuhiko Akino, Ibaraki (JP); Takakazu Saito, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 370 days.

(21) Appl. No.: 15/759,890

(22) PCT Filed: Sep. 30, 2016

(86) PCT No.: PCT/JP2016/079042
§ 371 (c)(1),
(2) Date: Mar. 14, 2018

(87) PCT Pub. No.: WO2017/061332
PCT Pub. Date: Apr. 13, 2017

(65) Prior Publication Data
US 2018/0240978 A1 Aug. 23, 2018

(30) Foreign Application Priority Data
Oct. 6, 2015 (JP) .............................. JP2015-198252

(51) Int. Cl.
| | |
|---|---|
| *H01L 51/00* | (2006.01) |
| *C09K 11/06* | (2006.01) |
| *C08F 2/44* | (2006.01) |
| *C07F 15/00* | (2006.01) |
| *H01L 51/50* | (2006.01) |
| *C08F 12/26* | (2006.01) |
| *C08G 61/12* | (2006.01) |
| *C09K 11/02* | (2006.01) |

(52) U.S. Cl.
CPC .......... *H01L 51/0039* (2013.01); *C07F 15/00* (2013.01); *C07F 15/0033* (2013.01); *C08F 2/44* (2013.01); *C08F 12/26* (2013.01); *C08G 61/122* (2013.01); *C09K 11/025* (2013.01); *C09K 11/06* (2013.01); *H01L 51/0043* (2013.01);
(Continued)

(58) Field of Classification Search
CPC ........................... H01L 51/039; C07F 15/0033
See application file for complete search history.

(56) References Cited

U.S. PATENT DOCUMENTS

2010/0207105 A1 8/2010 Katakura et al.
2011/0114926 A1 5/2011 Okabe et al.
(Continued)

FOREIGN PATENT DOCUMENTS

JP 2004522264 A 7/2004
JP 2009152435 A 7/2009
(Continued)

OTHER PUBLICATIONS

Levell et al. "Carbazole/iridium dendrimer side-chain phosphorescent copolymers for efficient light emitting devices" New J. Chem., 2012, 36, 407-413. (Year: 2012).*
(Continued)

*Primary Examiner* — Peter F Godenschwager
(74) *Attorney, Agent, or Firm* — Panitch Schwarze Belisario & Nadel LLP

(57) ABSTRACT

A light emitting device is provided which contains an anode, a cathode, and two organic layers disposed between the anode and the cathode. The first organic layer contains a phosphorescent material and the second organic layer contains a crosslinked body of a crosslinkable material and a phosphorescent material. The two phosphorescent materials contain the same phosphorescent compound represented by formula (1), and the crosslinkable material is a compound represented by formula (3):

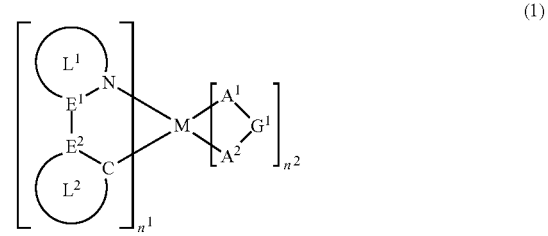

(1)

In formula (1), M represents a metal atom, $n^1$ is $\geq 1$, $n^2$ is $\geq 0$, $E^1$ and $E^2$ represent a carbon atom, $L^1$ and $L^2$ represent an aromatic heterocyclic ring, and $A^1\text{-}G^1\text{-}A^2$ represents an anionic bidentate ligand.

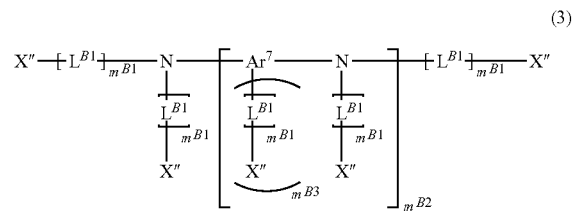

(3)

In formula (3), $m^{B1}$ to $m^{B3}$ represent an integer of $\geq 0$, $Ar^7$ may represent an aromatic hydrocarbon group, $L^{B1}$ may represent a divalent group, and X″ may represent a crosslinkable group.

14 Claims, No Drawings

(52) U.S. Cl.
CPC .......... *H01L 51/0085* (2013.01); *H01L 51/50* (2013.01); *C08G 2261/124* (2013.01); *C08G 2261/148* (2013.01); *C08G 2261/1412* (2013.01); *C08G 2261/18* (2013.01); *C08G 2261/312* (2013.01); *C08G 2261/3142* (2013.01); *C08G 2261/3162* (2013.01); *C08G 2261/3221* (2013.01); *C08G 2261/95* (2013.01); *C09K 2211/1007* (2013.01); *C09K 2211/1011* (2013.01); *C09K 2211/1029* (2013.01); *C09K 2211/1044* (2013.01); *C09K 2211/1059* (2013.01); *C09K 2211/1074* (2013.01); *C09K 2211/185* (2013.01); *H01L 51/504* (2013.01); *H01L 51/5016* (2013.01); *H01L 51/5056* (2013.01); *H01L 51/5072* (2013.01)

(56) References Cited

U.S. PATENT DOCUMENTS

| | | |
|---|---|---|
| 2011/0233383 A1 | 9/2011 | Oku |
| 2015/0115204 A1 | 4/2015 | Sekine et al. |
| 2016/0163987 A1 | 6/2016 | Heun et al. |
| 2017/0117491 A1 | 4/2017 | Sasada et al. |
| 2017/0194584 A1 | 7/2017 | Anryu et al. |

FOREIGN PATENT DOCUMENTS

| | | |
|---|---|---|
| JP | 201067960 A | 3/2010 |
| JP | 201236388 A | 2/2012 |
| JP | 201429875 A | 2/2014 |
| JP | 2014508394 A | 4/2014 |
| JP | 2015174824 A | 10/2015 |
| JP | 2015174931 A | 10/2015 |
| JP | 2015174932 A | 10/2015 |
| JP | 201612551 A | 1/2016 |
| JP | 5867580 B2 | 2/2016 |
| JP | 2016219567 A | 12/2016 |
| WO | 02071813 A1 | 9/2002 |
| WO | 2008146838 A1 | 12/2008 |
| WO | 2009107497 A1 | 9/2009 |
| WO | 2010028262 A1 | 3/2010 |
| WO | 2011132550 A1 | 10/2011 |
| WO | 2012052704 A2 | 4/2012 |
| WO | 2012052713 A1 | 4/2012 |
| WO | 2013021180 A1 | 2/2013 |
| WO | 2013146806 A1 | 10/2013 |
| WO | 2015014427 A1 | 2/2015 |
| WO | 2015156235 A1 | 10/2015 |
| WO | 2015186539 A1 | 12/2015 |

OTHER PUBLICATIONS

Int'l Search Report dated Dec. 20, 2016 in Int'l Application No. PCT/JP2016/079042.
Office Action dated May 12, 2017 in JP Application No. 2017516976.
Office Action dated Aug. 28, 2017 in JP Application No. 2017516976.
Written Opinion dated Dec. 20, 2016 in Int'l Application No. PCT/JP2016/079042.
Office Action dated Mar. 23, 2018 in JP Application No. 2018-008663.
Extended European Search Report dated Jun. 12, 2019 in EP Application No. 16853486.5.
Office Action dated Nov. 25, 2019 in CN Application No. 201680057772.6.
Office Action dated Mar. 7, 2019 in CN Application No. 201680057772.6.
Office Action dated Mar. 9, 2020 in EP Application No. 16853486.5.

* cited by examiner

LIGHT EMITTING DEVICE

CROSS-REFERENCE TO RELATED APPLICATION

This application is a Section 371 of International Application No. PCT/JP2016/079042, filed Sep. 30, 2016, which was published in the Japanese language on Apr. 13, 2017 under International Publication No. WO 2017/061332 A1, which claims priority under 35 U.S.C. § 119(b) to Japanese Application No. 2015-198252, filed Oct. 6, 2015, the disclosures of which are incorporated herein by reference in their entirety.

TECHNICAL FIELD

The present invention relates to a light emitting device.

BACKGROUND ART

Light emitting devices such as an organic electroluminescent device (organic EL device) can be suitably used for display and illumination because of properties such as high light emission efficiency and driving at low voltage, and are drawing attention in recent years. This light emitting device comprises organic layers such as a light emitting layer and a charge transporting layer.

Patent document 1 discloses a light emitting device comprising a first organic layer comprising a phosphorescent compound (B), (G) or (R) represented by the following formula and a second organic layer composed only of a crosslinked body of a crosslinkable material XL represented by the following formula.

(Chemical Formula 1)

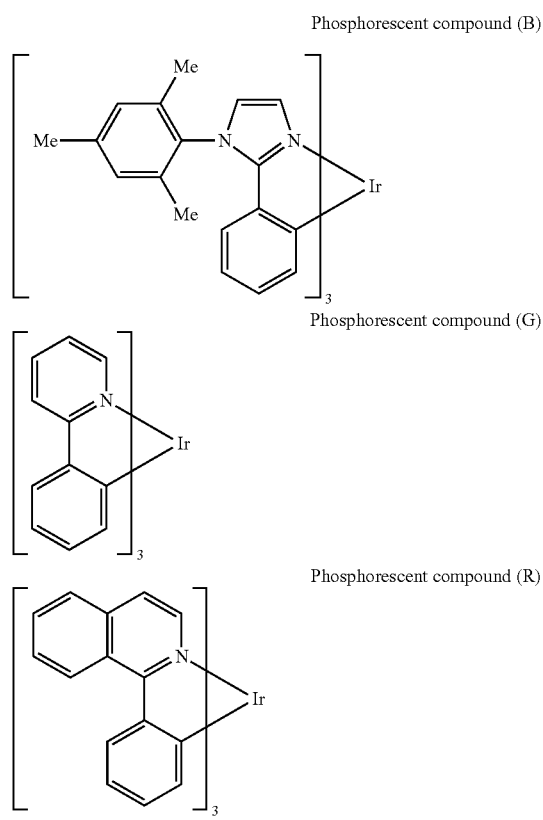

Phosphorescent compound (B)

Phosphorescent compound (G)

Phosphorescent compound (R)

(Chemical Formula 2)

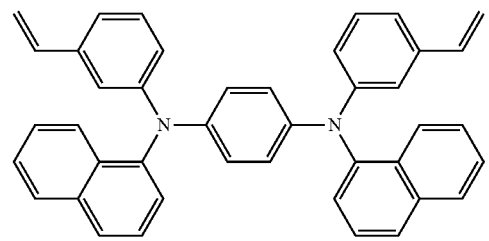

Crosslinkable Material XL

PRIOR ART DOCUMENT

Patent Document (Patent document 1) International Publication WO2009/107497

SUMMARY OF THE INVENTION

Problem to be Solved by the Invention

However, the luminance life of the light emitting device disclosed in Patent document 1 is not always sufficient.

Then, the present invention has an object of providing a light emitting device excellent in luminance life.

Means for Solving the Problem

The present invention provides the following [1] to [14].
[1] A light emitting device comprising
an anode,
a cathode,
a first organic layer disposed between the anode and the cathode and comprising a phosphorescent material, and
a second organic layer disposed between the anode and the cathode and comprising a crosslinked body of a crosslinkable material and a phosphorescent material,
wherein the phosphorescent material contained in the first organic layer and the phosphorescent material contained in the second organic layer comprise the same phosphorescent compound represented by the formula (1), and
the crosslinkable material is a compound represented by the formula (3):

(Chemical Formula 3)

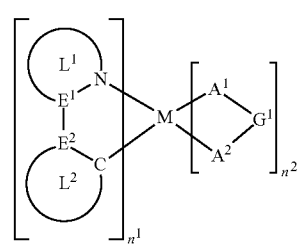

(1)

[wherein,
M represents a ruthenium atom, a rhodium atom, a palladium atom, an iridium atom or a platinum atom.

$n^1$ represents an integer of 1 or more, n represents an integer of 0 or more, and $n^1+n^2$ is 2 or 3. $n^1+n^2$ is 3 when M is a ruthenium atom, a rhodium atom or an iridium atom, while $n^1+n^2$ is 2 when M is a palladium atom or a platinum atom.

$E^1$ and $E^2$ each independently represent a carbon atom or a nitrogen atom. At least one of $E^1$ and $E^2$ is a carbon atom.

The ring $L^1$ represents an aromatic heterocyclic ring, and this aromatic heterocyclic ring optionally has a substituent. When a plurality of the substituents are present, they may be the same or different and may be combined together to form a ring together with the atoms to which they are attached. When a plurality of rings $L^1$ are present, they may be the same or different.

The ring $L^2$ represents an aromatic hydrocarbon ring or an aromatic heterocyclic ring, and these rings each optionally have a substituent. When a plurality of the substituents are present, they may be the same or different and may be combined together to form a ring together with the atoms to which they are attached. When a plurality of rings $L^2$ are present, they may be the same or different.

At least one of the ring $L^1$ and the ring $L^2$ has a group represented by the formula (2).

$A^1$-$G^1$-$A^2$ represents an anionic bidentate ligand. $A^1$ and $A^2$ each independently represent a carbon atom, an oxygen atom or a nitrogen atom, and these atoms each may be an atom constituting a ring. $G^1$ represents a single bond or an atomic group constituting the bidentate ligand together with $A^1$ and $A^2$. When a plurality of $A^1$-$G^1$-$A^1$ are present, they may be the same or different.]

$$—R^2 \quad (2)$$

[wherein, $R^2$ represents an aryl group, a monovalent heterocyclic group or an substituted amino group, and these groups each optionally have a substituent.]

(Chemical Formula 4)

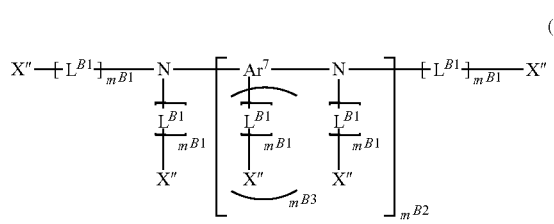

(3)

[wherein, $m^{B1}$, $m^{B2}$ and $m^{B3}$ each independently represent an integer of 0 or more. The plurality of $m^{B1}$ may be the same or different. When a plurality of $m^{B3}$ are present, they may be the same or different.

$Ar^7$ represents an aromatic hydrocarbon group, a heterocyclic group or a group in which at least one aromatic hydrocarbon ring and at least one heterocyclic ring are bonded directly to each other, and these groups each optionally have a substituent. When a plurality of $Ar^7$ are present, they may be the same or different.

$L^{B1}$ represents an alkylene group, a cycloalkylene group, an arylene group, a divalent heterocyclic group, a group represented by —N(R''')—, an oxygen atom or a sulfur atom, and these groups each optionally have a substituent. R''' represents a hydrogen atom, an alkyl group, a cycloalkyl group, an aryl group or a monovalent heterocyclic group, and these groups each optionally have a substituent. When a plurality of $L^{B1}$ are present, they may be the same or different.

X" represents a crosslinkable group, a hydrogen atom, an alkyl group, a cycloalkyl group, an aryl group or a monovalent heterocyclic group, and these groups each optionally have a substituent. The plurality of X" may be the same or different. At least one of the plurality of X' is a crosslinkable group.].

[2] The light emitting device according to [1], wherein the first organic layer and the second organic layer are adjacent to each other.

[3] The light emitting device according to [1] or [2], wherein the second organic layer is a layer disposed between the anode and the first organic layer.

[4] The light emitting device according to any one of [1] to [3], wherein the crosslinkable group is at least one crosslinkable group selected from Group A of crosslinkable group:

(Group A of Crosslinkable Group)

(Chemical Formula 5)

(XL-1)

(XL-2)

(XL-3)

(XL-4)

(XL-5)

(XL-6)

(XL-7)

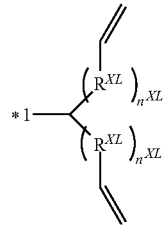

(XL-8)

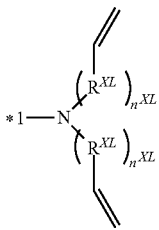

(XL-9)

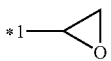

(XL-10)

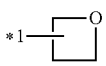

(XL-11)

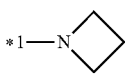

(XL-12)

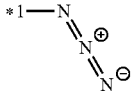

(XL-13)

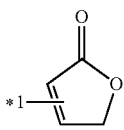

(XL-14)

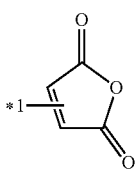

(XL-15)

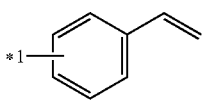

(XL-16)

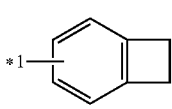

(XL-17)

[wherein, $R^{XL}$ represents a methylene group, an oxygen atom or a sulfur atom, and $n^{XL}$ represents an integer of 0 to 5. When a plurality of $R^{XL}$ are present, they may be the same or different, and when a plurality of $n^{XL}$ are present, they may be the same or different. *1 represents a binding position. These crosslinkable groups each optionally have a substituent.].

It is preferable that the crosslinkable group represented by at least one X" in the compound represented by the formula (3) is at least one crosslinkable group selected from the group consisting of crosslinkable groups represented by the formula (XL-1) to the formula (XL-9) and the formula (XL-11) to the formula (XL-16) in Group A of crosslinkable group, because the compound represented by the formula (3) is excellent in crosslinkability.

[5] The light emitting device according to any one of [1] to [4], wherein the phosphorescent compound represented by the formula (1) is a phosphorescent compound represented by the formula (1-A):

(Chemical Formula 6)

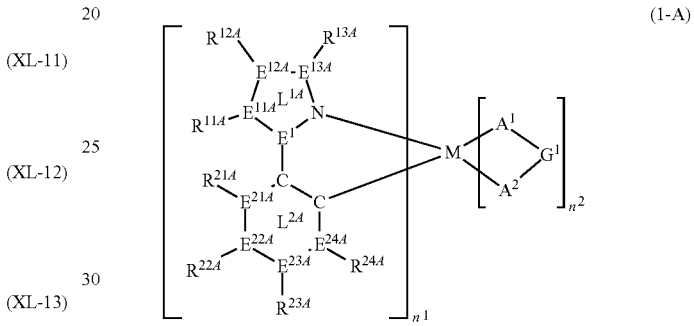

(1-A)

[wherein,

M, $n^1$, $n^2$, $E^1$ and $A^1$-$G^1$-$A^2$ represent the same meaning as described above.

$E^{11A}$, $E^{12A}$, $E^{13A}$, $E^{21A}$, $E^{22A}$, $E^{23A}$ and $E^{24A}$ each independently represent a nitrogen atom or a carbon atom. When a plurality of $E^{11A}$, $E^{12A}$, $E^{13A}$, $E^{21A}$, $E^{22A}$, $E^{23A}$ and $E^{24A}$ are present, they may be the same or different at each occurrence. $R^{11A}$ may be either present or not present when $E^{11A}$ is a nitrogen atom. $R^{12A}$ may be either present or not present when $E^{12A}$ is a nitrogen atom. $R^{13A}$ may be either present not present when $E^{13A}$ is a nitrogen atom. $R^{21A}$ is not present when $E^{21A}$ is a nitrogen atom. $R^{22A}$ is not present when $E^{22A}$ is a nitrogen atom. $R^{23A}$ is not present when $E^{23A}$ is a nitrogen atom. $R^{24A}$ is not present when $E^{24A}$ is a nitrogen atom.

$R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, a group represented by the formula (2), an aryloxy group or a halogen atom, and these groups each optionally have a substituent. When a plurality of $R^{11A}$, $R^{12A}$, $R^{13A}$, $R^{21A}$, $R^{22A}$, $R^{23A}$ and $R^{24A}$ are present, they may be the same or different at each occurrence. $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each may be combined together to form a ring together with the atoms to which they are attached. At least one of $R^{11A}$, $R^{12A}$, $R^{13A}$, $R^{21A}$, $R^{22A}$, $R^{23A}$ and $R^{24A}$ is a group represented by the formula (2).

The ring $L^{1A}$ represents a triazole ring or a diazole ring constituted of a nitrogen atom, $E^1$, $E^{11A}$, $E^{12A}$ and $E^{13A}$.

The ring $L^{2A}$ represents a benzene ring, a pyridine ring or a pyrimidine ring constituted of two carbon atoms, $E^{21A}$, $E^{22A}$, $E^{23A}$ and $E^{24A}$.]

[6] The light emitting device according to [5], wherein the phosphorescent compound represented by the formula (1-A) is a phosphorescent compound represented by the formula (1-A1), a phosphorescent compound represented by the formula (1-A2), a phosphorescent compound represented by the formula (1-A3) or a phosphorescent compound represented by the formula (1-A4):

(Chemical Formula 7)

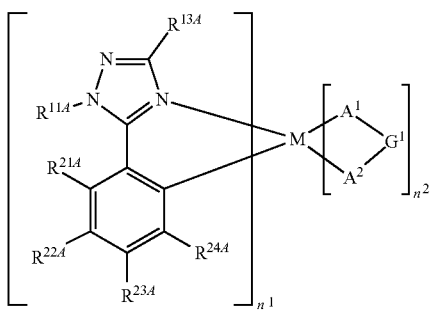
(1-A1)

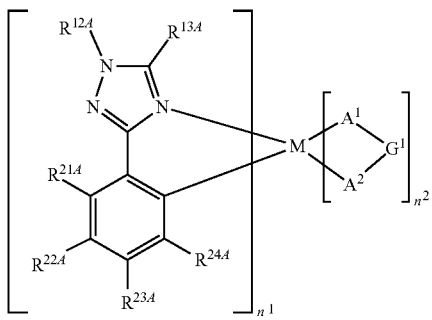
(1-A2)

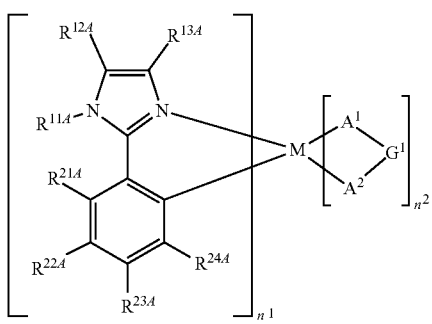
(1-A3)

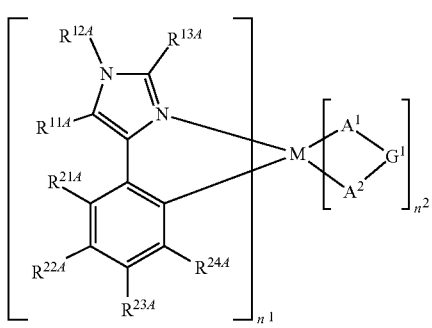
(1-A4)

[wherein,
M, $n^1$, $n^2$, $R^{11A}$, $R^{12A}$, $R^{13A}$, $R^{21A}$, $R^{22A}$, $R^{23A}$, $R^{24A}$ and $A^1$-$G^1$-$A^2$ represent the same meaning as described above.].

[7] The light emitting device according to any one of [1] to [4], wherein the phosphorescent compound represented by the formula (1) is a phosphorescent compound represented by the formula (1-B):

(Chemical Formula 8)

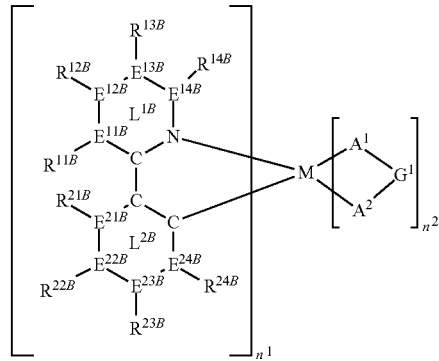
(1-B)

[wherein,
M, $n^1$, $n^2$ and $A^1$-$G^1$-$A^2$ represent the same meaning as described above.

$E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom. When a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence. $R^{11B}$ is not present when $E^{11B}$ is a nitrogen atom. $R^{12B}$ is not present when $E^{12B}$ is a nitrogen atom. $R^{13B}$ is not present when $E^{13B}$ is a nitrogen atom. $R^{14B}$ is not present when $E^{14B}$ is a nitrogen atom. $R^{21B}$ is not present when $E^{21B}$ is a nitrogen atom. $R^{22B}$ is not present when $E^{22B}$ is a nitrogen atom. $R^{23B}$ is not present when $E^{23B}$ is a nitrogen atom. $R^{24B}$ is not present when $E^{24B}$ is a nitrogen atom.

$R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, a group represented by the formula (2), an aryloxy group or a halogen atom, and these groups each optionally have a substituent. When a plurality of $R^{11B}$, $R^{12B}$, $R^{13B}$, $R^{14B}$, $R^{21B}$, $R^{22B}$, $R^{23B}$ and $R^{24B}$ are present, they may be the same or different at each occurrence. $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{23B}$ and $R^{24B}$ each may be combined together to form a ring together with the atoms to which they are attached. At least one of $R^{11B}$, $R^{12B}$, $R^{13B}$, $R^{14B}$, $R^{21B}$, $R^{22B}$, $R^{23B}$ and $R^{24B}$ is a group represented by the formula (2).

The ring $L^{1B}$ represents a pyridine ring or a pyrimidine ring constituted of a nitrogen atom, a carbon atom, $E^{11B}$, $E^{12B}$, $E^{13B}$ and $E^{14B}$.

The ring $L^{2B}$ represents a benzene ring, a pyridine ring or a pyrimidine ring constituted of two carbon atoms, $E^{21B}$, $E^{22B}$, $E^{23B}$ and $E^{24B}$.].

[8] The light emitting device according to [7], wherein the phosphorescent compound represented by the formula (1-B) is a phosphorescent compound represented by the formula (1-B1), a phosphorescent compound represented by the formula (1-B2), a phosphorescent compound represented by the formula (1-B3), a phosphorescent compound represented by the formula (1-B4) or a phosphorescent compound represented by the formula (1-B5):

(Chemical Formula 9)

(1-B1)
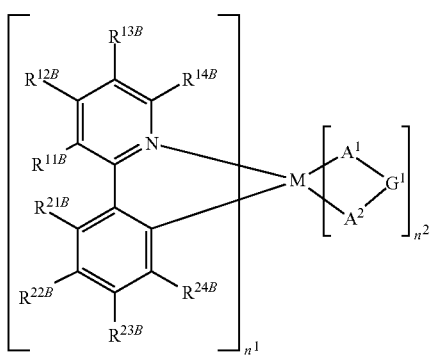

(1-B2)
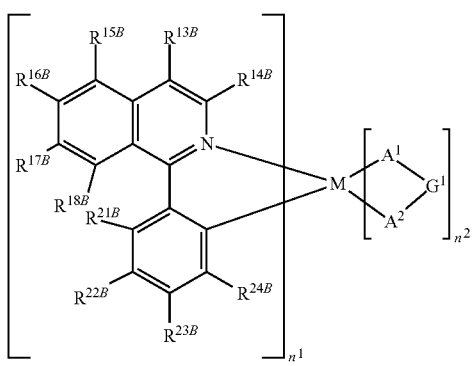

(1-B3)
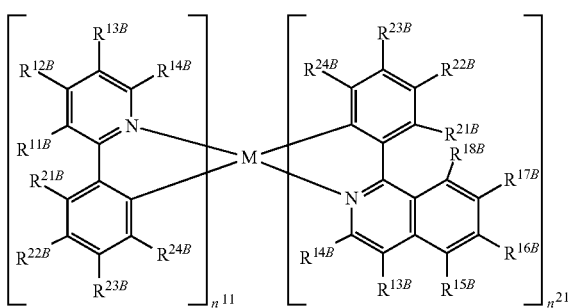

(1-B4)
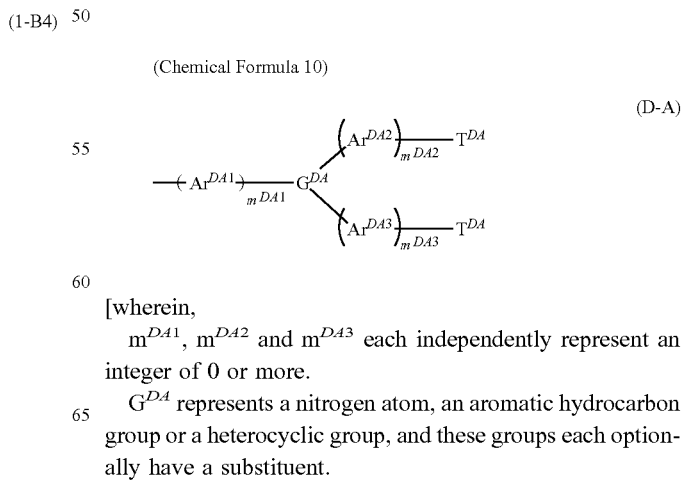

(1-B5)
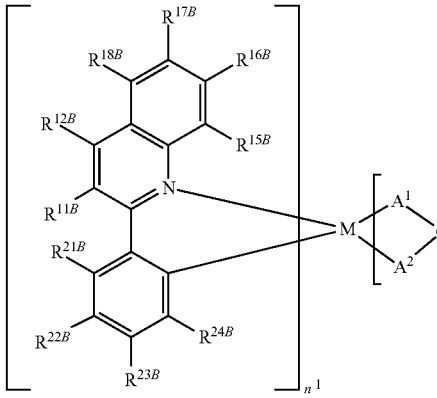

[wherein,

M, $n^1$, $n^2$, $E^1$ and $A^1$-$G^1$-$A^2$, $R^{11B}$, $R^{12B}$, $R^{13B}$, $R^{14B}$, $R^{21B}$, $R^{22B}$, $R^{23B}$ and $R^{24B}$ represent the same meaning as described above.

$n^{11}$ and $n^{12}$ each independently represent an integer of 1 or more, and $n^{11}+n^{12}$ is 2 or 3. $n^{11}+n^{12}$ is 3 when M is a ruthenium atom, a rhodium atom or an iridium atom, while $n^{11}+n^{12}$ is 2 when M is a palladium atom or a platinum atom.

$R^{15B}$, $R^{16B}$, $R^{17B}$ and $R^{18B}$ each independently represent a hydrogen atom, an alkyl group, a cycloalkyl group, an alkoxy group, a cycloalkoxy group, a group represented by the formula (2), an aryloxy group or a halogen atom, and these groups each optionally have a substituent. When a plurality of $R^{15B}$, $R^{16B}$, $R^{17B}$ and $R^{18B}$ are present, they may be the same or different at each occurrence. $R^{13B}$ and $R^{15B}$, $R^{15B}$ and $R^{16B}$, $R^{16B}$ and $R^{17B}$, $R^{17B}$ and $R^{18B}$, and $R^{18B}$ and $R^{21B}$ each may be combined together to form a ring together with the atoms to which they are attached.

At least one of $R^{11B}$, $R^{12B}$, $R^{13B}$, $R^{14B}$, $R^{21B}$, $R^{22B}$, $R^{23B}$ and $R^{24B}$ is a group represented by the formula (2).].

[9] The light emitting device according to any one of [1] to [8], wherein the group represented by the formula (2) is a group represented by the formula (D-A), a group represented by the formula (D-B) or a group represented by the formula (D-C):

(Chemical Formula 10)

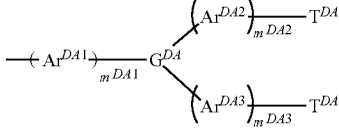

(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and these groups each optionally have a substituent.

$Ar^{DA1}$, $Ar^{DA2}$ and $Ar^{DA3}$ each independently represent an arylene group or a divalent heterocyclic group, and these groups each optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, and these groups each optionally have a substituent. The plurality of $T^{DA}$ may be the same or different.]

(Chemical Formula 11)

(D-B)

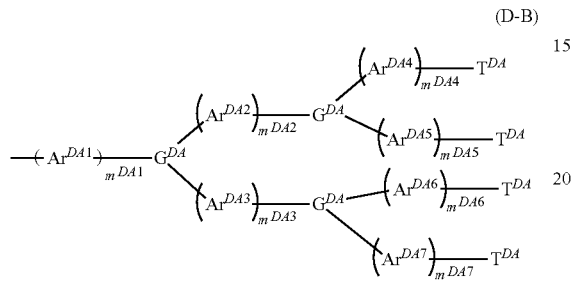

[wherein, $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA}$ represents a nitrogen atom, an aromatic hydrocarbon group or a heterocyclic group, and these groups each optionally have a substituent. The plurality of $G^{DA}$ may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and these groups each optionally have a substituent. When a plurality of $Ar^{DA1}$, $Ar^{DA2}$, $Ar^{DA3}$, $Ar^{A4}$, $Ar^{DA5}$, $Ar^{DA6}$ and $Ar^{DA7}$ are present, they may be the same or different at each occurrence.

$T^{DA}$ represents an aryl group or a monovalent heterocyclic group, and these groups each optionally have a substituent. The plurality of $T^{DA}$ may be the same or different.]

(Chemical Formula 12)

(D-C)

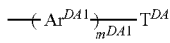

[wherein, $m^{DA1}$ represents an integer of 0 or more.

$Ar^{DA1}$ represents an arylene group or a divalent heterocyclic group, and these groups each optionally have a substituent. When a plurality of $Ar^{DA1}$ are present, they may be the same or different.

$T^{DA}$ represents an aryl group or a monovalent heterocyclic group, and these groups each optionally have a substituent.].

[10] The light emitting device according to [9], wherein the group represented by the formula (D-A) is a group represented by the formula (D-A1), a group represented by the formula (D-A2), a group represented by the formula (D-A3) or a group represented by the formula (D-A4):

(Chemical Formula 13)

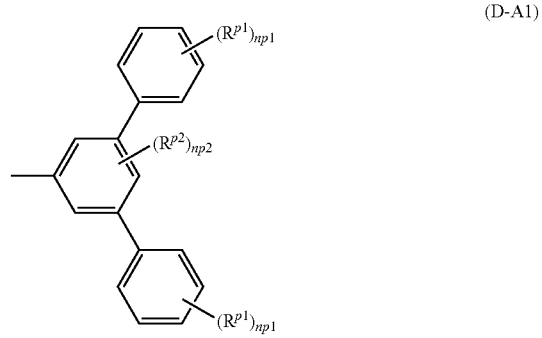

(D-A1)

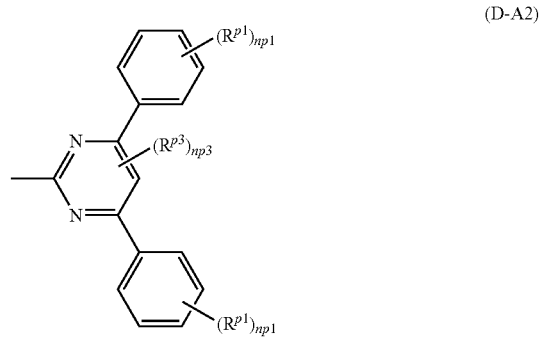

(D-A2)

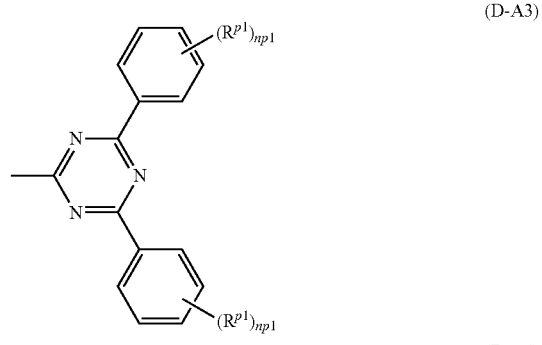

(D-A3)

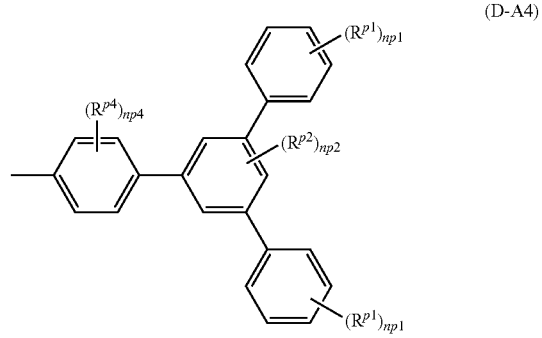

(D-A4)

[wherein, $R^{p1}$, $R^{p2}$, $R^{p3}$ and $R^{p4}$ each independently represent an alkyl group, a cycloalkyl group, an alkoxy group, a cycloalkoxy group or a halogen atom. When a plurality of $R^{p1}$, $R^{p2}$ and $R^{p4}$ are present, they may be the same or different at each occurrence.

np1 represents an integer of 0 to 5, np2 represents an integer of 0 to 3, and np3 represents 0 or 1 and np4 represents an integer of 0 to 4. The plurality of np1 may be the same or different.].

[11] The light emitting device according to [9], wherein the group represented by the formula (D-B) is a group represented by the formula (D-B1), a group represented by the formula (D-B2) or a group represented by the formula (D-B3):

(Chemical Formula 14)

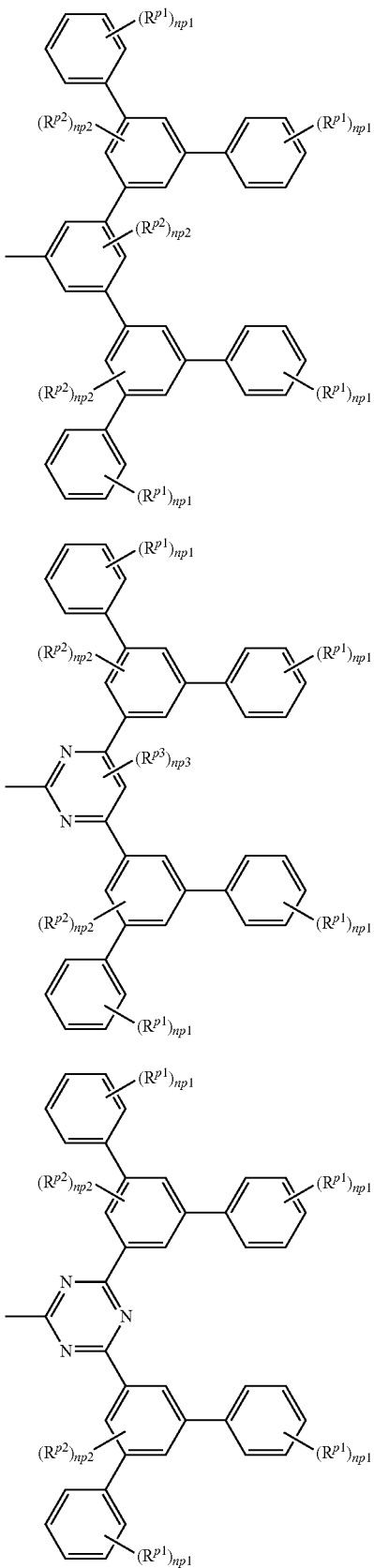

(D-B1)

(D-B2)

(D-B3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. When a plurality of np1 and np2 are present, they may be the same or different at each occurrence.].

[12] The light emitting device according to [9], wherein the group represented by the formula (D-C) is a group represented by the formula (D-C1), a group represented by the formula (D-C2), a group represented by the formula (D-C3) or a group represented by the formula (D-C4):

(Chemical Formula 15)

 (D-C1)

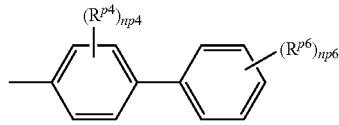 (D-C2)

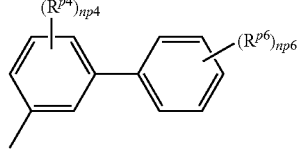 (D-C3)

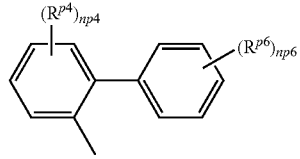 (D-C4)

[wherein, $R^{P4}$, $R^{P5}$ and $R^{P6}$ each independently represent an alkyl group, a cycloalkyl group, an alkoxy group, a cycloalkoxy group or a halogen atom. When a plurality of $R^{P4}$, $R^{P5}$ and $R^{P6}$ are present, they may be the same or different at each occurrence.

np4 represents an integer of 0 to 4, np5 represents an integer of 0 to 5, and np6 represents an integer of 0 to 5.].

[13] The light emitting device according to any one of [1] to [12], wherein the first organic layer is a layer further comprising a compound represented by the formula (H-1):

(Chemical Formula 16)

$$Ar^{H1}-\left[\left[L^{H2}\right]_{nH2}-\left[L^{H1}\right]_{nH1}-\left[L^{H2}\right]_{nH2}\right]_{nH3}-Ar^{H2} \qquad (H\text{-}1)$$

[wherein, $Ar^{H1}$ and $Ar^{H2}$ each independently represent an aryl group or a monovalent heterocyclic group, and these groups each optionally have a substituent.

$n^{H1}$ and $n^{H2}$ each independently represent 0 or 1. When a plurality of $n^{H1}$ are present, they may be the same or different. The plurality of $n^{H2}$ may be the same or different.

$n^{H3}$ represents an integer of 0 or more.

$L^{H1}$ represents an arylene group, a divalent heterocyclic group or a group represented by $-[C(RH^{11})_2]n^{H11}-$, and these groups each optionally have a substituent. When a plurality of $L^{H1}$ are present, they may be the same or different. $n^{H11}$ represents an integer of 1 to 10. $R^{H11}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{H11}$ may be the same or different and may be combined together to form a ring together with the carbon atoms to which they are attached.

$L^{H2}$ represents a group represented by $-N(-L^{H21}-R^{H21})-$. When a plurality of $L^{H2}$ are present, they may be the same or different. $L^{H21}$ represents a single bond, an arylene group or a divalent heterocyclic group, and these groups each optionally have a substituent. $R^{H21}$ represents a hydrogen atom, an alkyl group, a cycloalkyl group, an aryl group or a monovalent heterocyclic group, and these groups each optionally have a substituent.].

[14] The light emitting device according to any one of [1] to [12], wherein the first organic layer is a layer further comprising a polymer compound comprising a constitutional unit represented by the formula (Y):

(Chemical Formula 17)

(Y)

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.].

[15] The light emitting device according to any one of [1] to [14], wherein $m^{B2}$ in the compound represented by the formula (3) is 1 or 2.

Effect of the Invention

According to the present invention, a light emitting device excellent in luminance life can be provided.

MODES FOR CARRYING OUT THE INVENTION

Suitable embodiments of the present invention will be illustrated in detail below.

Explanation of Common Term

Terms commonly used in the present specification have the following meanings unless otherwise stated.

Me represents a methyl group, Et represents an ethyl group, Bu represents a butyl group, i-Pr represents an isopropyl group, and t-Bu represents a tert-butyl group.

A hydrogen atom may be a heavy hydrogen atom or a light hydrogen atom.

A solid line representing a bond to a central metal in a formula representing a metal complex denotes a covalent bond or a coordinate bond.

"Polymer compound" denotes a polymer having molecular weight distribution and having a polystyrene-equivalent number average molecular weight of $1 \times 10^3$ to $1 \times 10^8$.

A polymer compound may be any of a block copolymer, a random copolymer, an alternating copolymer and a graft copolymer, and may also be another embodiment.

An end group of a polymer compound is preferably a stable group because if a polymerization active group remains intact at the end, when the polymer compound is used for fabrication of a light emitting device, the light emitting property or luminance life possibly becomes lower. This end group is preferably a group having a conjugated bond to the main chain, and includes, for example, groups bonding to an aryl group or a monovalent heterocyclic group via a carbon-carbon bond.

"Low molecular weight compound" denotes a compound having no molecular weight distribution and having a molecular weight of $1 \times 10^4$ or less.

"Constitutional unit" denotes a unit structure found once or more in a polymer compound.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom or the like, and the alkyl group having a substituent includes, for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl) propyl group and a 6-ethyloxyhexyl group.

The number of carbon atoms of "Cycloalkyl group" is, not including the number of carbon atoms of a substituent, usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of "Cycloalkoxy group" is, not including the number of carbon atoms of a substituent, usually 3 to 40, preferably 4 to 10.

The cycloalkoxy group optionally has a substituent, and examples thereof include a cyclohexyloxy group.

The number of carbon atoms of "Aryloxy group" is, not including the number of carbon atoms of a substituent, usually 6 to 60, preferably 6 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridinyl group, a piperidinyl group, a quinolinyl group, an isoquinolinyl group, a pyrimidinyl group, a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of "Cycloalkenyl group", not including the number of carbon atoms of the substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and these groups having a substituent.

"Alkynyl group" may be any of linear or branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of "Cycloalkynyl group", not including the number of carbon atoms of the substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, preferably, groups represented by the formulae (A-1) to (A-20). The arylene group includes groups obtained by linking a plurality of these groups.

(Chemical Formula 18)

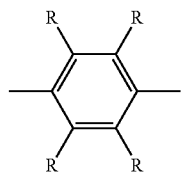

(A-1)

(A-2)
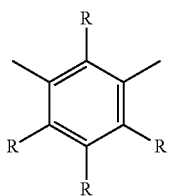
(A-3)
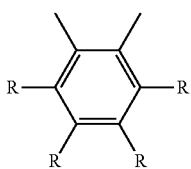
(A-4)
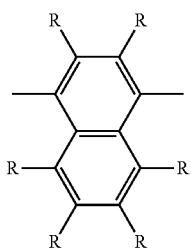
(A-5)
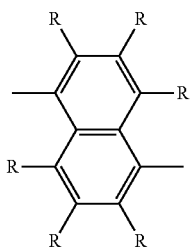
(A-6)
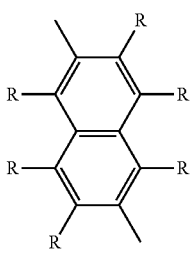
(Chemical Formula 19)
(A-7)
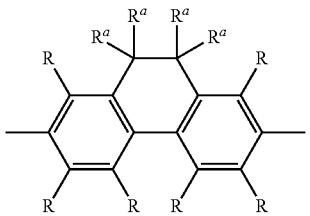
(A-8)
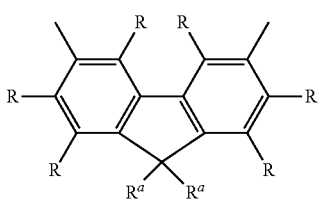
(A-9)
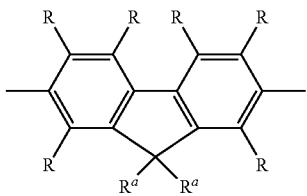
(A-10)
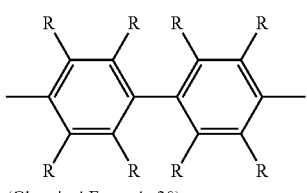
(Chemical Formula 20)
(A-11)
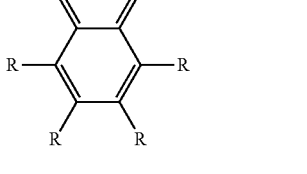
(A-12)
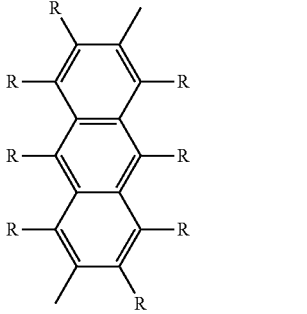
(A-13)
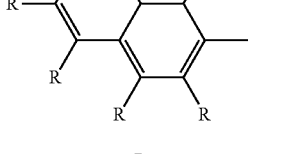
(A-14)
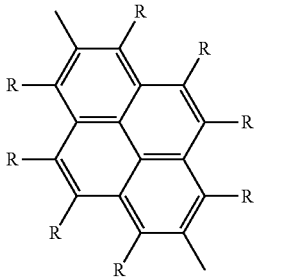

(A-15)

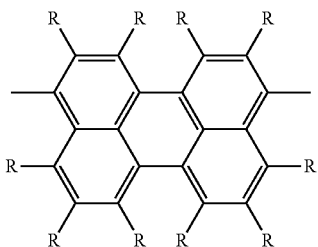

(Chemical Formula 21)

(A-16)

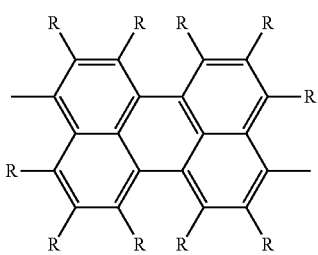

(A-17)

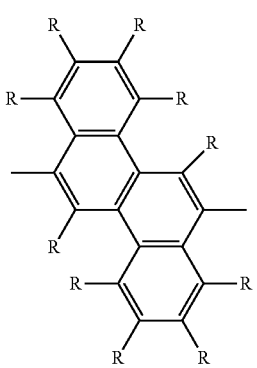

(A-18)

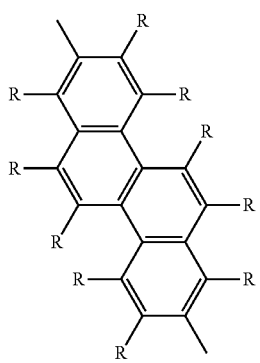

(A-19)

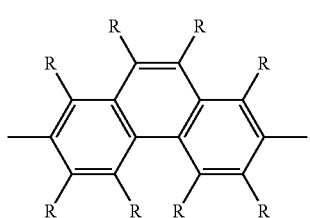

(A-20)

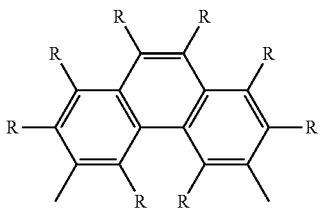

[wherein, R and R$^a$ each independently represent a hydrogen atom, analkyl group, a cycloalkyl group, anaryl group or a monovalent heterocyclic group. The plurality of R and R$^a$ each may be the same or different, and groups R$^a$ may be combined together to form a ring together with the atoms to which they are attached.]

The number of carbon atoms of the divalent heterocyclic group is, not including the number of carbon atoms of a substituent, usually 2 to 60, preferably 3 to 20, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (AA-1) to (AA-34). The divalent heterocyclic group includes groups obtained by linking a plurality of these groups.

(Chemical Formula 22)

(AA-1)

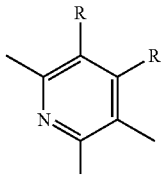

(AA-2)

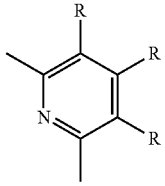

(AA-3)

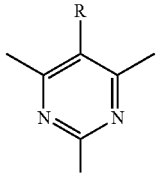

(AA-4)

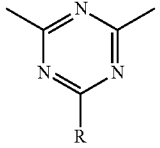

-continued
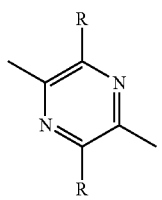 (AA-5)
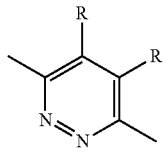 (AA-6)
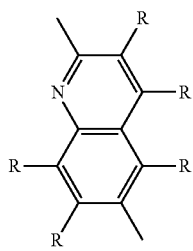 
(Chemical Formula 23)
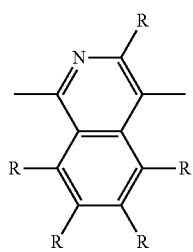 (AA-7)
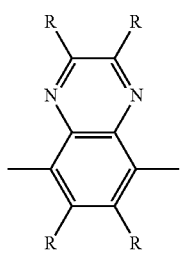 (AA-8)
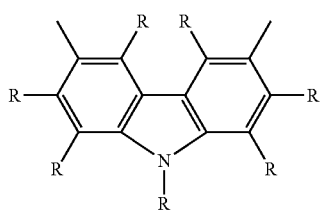 (AA-9)
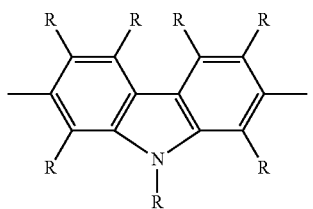 (AA-10)
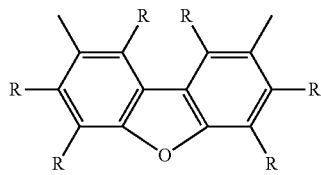 (AA-11)
(Chemical Formula 24)
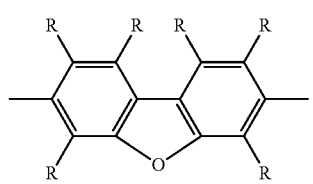 (AA-12)
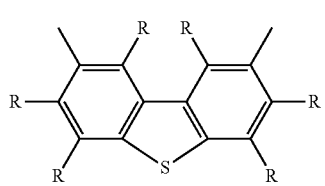 (AA-13)
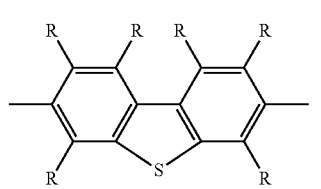 (AA-14)
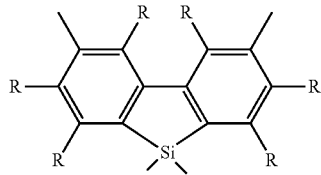 (AA-15)
(Chemical Formula 25)
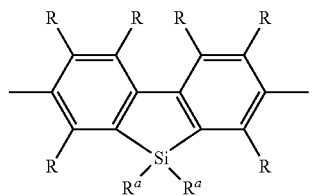 (AA-16)
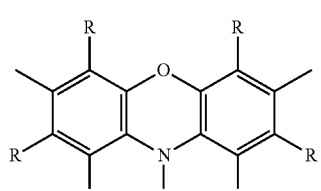 (AA-17)
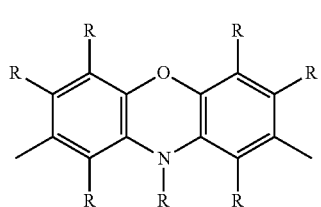 (AA-18)
(AA-19)

(Chemical Formula 26)

(AA-20) 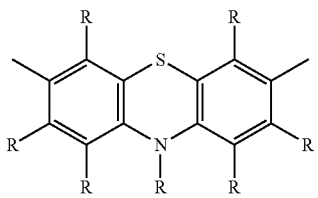

(AA-21) 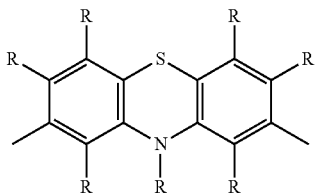

(AA-22) 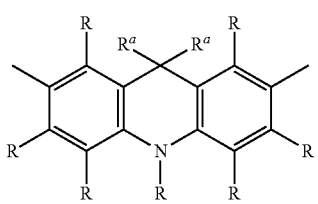

(AA-23) 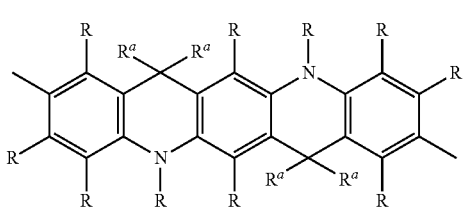

(AA-24) 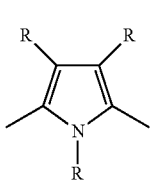

(AA-25) 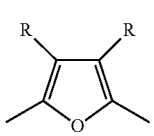

(Chemical Formula 27)

(AA-26) 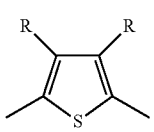

(AA-27) 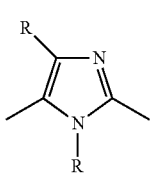

(AA-28) 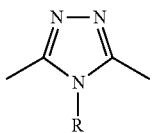

(AA-29) 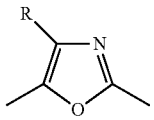

(AA-30) 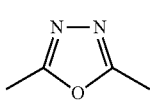

(AA-31) 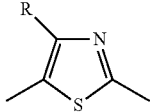

(AA-32) 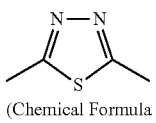

(Chemical Formula 28)

(AA-33) 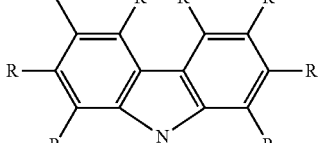

(AA-34) 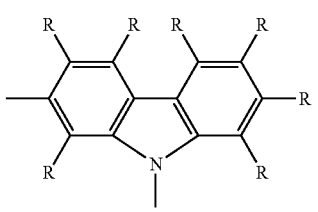

[wherein, R and $R^a$ represent the same meaning as described above.]

"Crosslinkable group" is a group capable of forming a new bond by being subjected to heating, ultraviolet irradiation, near-ultraviolet ray irradiation, visible light irradiation, near-infrared ray irradiation, a radical reaction and the like, and crosslinkable groups are preferably groups represented by the formulae (XL-1) to (XL-17) of the Group A of crosslinkable group.

"Substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

<Light Emitting Device>

Next, the light emitting device of the present invention will be illustrated.

The light emitting device of the present invention is a light emitting device comprising an anode, a cathode, a first organic layer disposed between the anode and the cathode and comprising a phosphorescent material, and a second organic layer disposed between the anode and the cathode and comprising a crosslinked body of a crosslinkable material and a phosphorescent material, wherein the phosphorescent material contained in the first organic layer and the phosphorescent material contained in the second organic layer comprise the same phosphorescent compound represented by the formula (1), and the crosslinkable material is a compound represented by the formula (3).

When the phosphorescent material contained in the first organic layer or the phosphorescent material contained in the second organic layer comprises a plurality of phosphorescent compounds, at least one from each of them may be the same phosphorescent compound represented by the formula (1).

The method of forming the first organic layer and the second organic layer includes, for example, a vacuum vapor deposition method, and application methods such as a spin coat method and an inkjet printing method, and application methods are preferable.

When the first organic layer is formed by an application method, it is preferable to use a first ink described later.

When the second organic layer is formed by an application method, it is preferable to use a second ink described later. After formation of the second organic layer, a crosslinkable material contained in the second organic layer can be crosslinked by heating or light irradiation, and it is preferable that a crosslinkable material contained in the second organic layer is crosslinked by heating. When the crosslinkable material is contained under crosslinked condition (in the form of a crosslinked body of the crosslinkable material) in the second organic layer, the second organic layer is substantially insolubilized in a solvent. That is, the second organic layer can be suitably used for lamination of a light emitting device.

The temperature of heating for crosslinking is usually 25° C. to 300° C., preferably 50° C. to 250° C., more preferably 150° C. to 200° C., further preferably 170° C. to 190° C.

The time of heating is usually 0.1 minute to 1000 minutes, preferably 1 minute to 500 minutes, more preferably 10 minutes to 100 minutes, further preferably 50 minutes to 70 minutes.

The light used in irradiation for crosslinking is, for example, ultraviolet light, near-ultraviolet light or visible light.

The method of analyzing a compound contained in the first organic layer or the second organic layer includes, for example, chemical separation and analysis methods such as extraction, instrumental analysis methods such as infrared spectroscopy (IR), nuclear magnetic resonance spectroscopy (NMR) and mass spectrometry (MS), and analysis methods combining a chemical separation analysis method and an instrumental analysis method.

By performing solid-liquid extraction using an organic solvent such as toluene, xylene, chloroform and tetrahydrofuran on the first organic layer or the second organic layer, components can be separated into components substantially insoluble in an organic solvent (insoluble components) and components soluble in an organic solvent (soluble components). The insoluble component can be analyzed by infrared spectroscopy or nuclear magnetic resonance spectroscopy, and the soluble component can be analyzed by nuclear magnetic resonance spectroscopy or mass spectrometry.

<First Organic Layer>
[Phosphorescent Compound]

"Phosphorescent compound" usually denotes a compound capable of showing a phosphorescent property at room temperature (25° C.), and preferably is a metal complex capable of showing light emission from triplet excited state at room temperature. This metal complex capable of showing light emission from triplet excited state has a central metal atom and a ligand.

The central metal atom includes, for example, metal atoms having an atomic number of 40 or more, capable of showing spin-orbital interaction with the complex and capable of causing intersystem crossing between singlet state and triplet state. The metal atom includes, for example, a ruthenium atom, a rhodium atom, a palladium atom, an iridium atom and a platinum atom, and is preferably an iridium atom or a platinum atom, because the light emitting device of the present invention is excellent in light emission efficiency.

The ligand includes, for example, neutral or anionic monodentate ligands or neutral or anionic polydentate ligands capable of forming at least one of a coordinate bond and a covalent bond between the central metal atom. The bond between the central metal atom and the ligand includes, for example, a metal-nitrogen bond, a metal-carbon bond, a metal-oxygen bond, a metal-phosphorus bond, a metal-sulfur bond and a metal-halogen bond. The polydentate ligand usually denotes a bidentate or more and hexadentate or less ligand.

The phosphorescent compound is available from Aldrich, Luminescence Technology Corp., American Dye Source and the like. The phosphorescent compound can be synthesized according to methods described, for example, in "Journal of the American Chemical Society, Vol. 107, 1431-1432 (1985)", "Journal of the American Chemical Society, Vol. 106, 6647-6653 (1984)", National Publication of Translated Version No. 2004-530254, JP-A No. 2008-179617, JP-A No. 2011-105701, National Publication of Translated Version No. 2007-504272, International Publication WO2006/121811 and JP-A No. 2013-147450, as other acquisition methods.

[Phosphorescent Compound Represented by Formula (1)]

The phosphorescent compound represented by the formula (1) is constituted of a central metal M, a ligand of which number is prescribed by a suffix $n^1$ and a ligand of which number is prescribed by a suffix $n^2$.

M is preferably an iridium atom or a platinum atom, more preferably an iridium atom, because the light emitting device of the present invention is excellent in luminance life.

$n^2$ is preferably 0.

$E^1$ and $E^2$ are each preferably a carbon atom.

The ring $L^1$ is preferably a 5-membered or 6-membered aromatic heterocyclic ring, more preferably a 5-membered aromatic heterocyclic ring having 2 to 4 nitrogen atoms as a constituent atom or a 6-membered aromatic heterocyclic ring having 1 to 4 nitrogen atoms as a constituent atom, further preferably a 5-membered aromatic heterocyclic ring having 2 or 3 nitrogen atoms as a constituent atom or a 6-membered aromatic heterocyclic ring having 1 or 2 nitrogen atoms as a constituent atom, and these rings each optionally have a substituent. When the ring $L^1$ is a 6-membered aromatic heterocyclic ring, it is preferable that $E^1$ is a carbon atom.

The ring $L^1$ includes, for example, a diazole ring, a triazole ring, a pyridine ring, a diazabenzene ring, a triazine ring, a quinoline ring or an isoquinoline ring, including embodiments in which several substituents which can exist are bonded together to form a ring, and is preferably a diazole ring, a triazole ring, a pyridine ring, a pyrimidine ring, a quinoline ring or an isoquinoline ring, more preferably a diazole ring, a triazole ring, a pyridine ring, a quinoline ring or an isoquinoline ring, and these rings each optionally have a substituent.

The ring $L^2$ is preferably a 5-membered or 6-membered aromatic hydrocarbon ring or a 5-membered or 6-membered aromatic heterocyclic ring, more preferably a 6-membered aromatic hydrocarbon ring or a 6-membered aromatic heterocyclic ring, further preferably a 6-membered aromatic hydrocarbon ring, and these rings each optionally have a substituent. When the ring $R^2$ is a 6-membered aromatic heterocyclic ring, it is preferable that $E^2$ is a carbon atom.

The ring $L^2$ includes a benzene ring, a naphthalene ring, a fluorene ring, a phenanthrene ring, an indene ring, a pyridine ring, a diazabenzene ring and a triazine ring, including embodiments in which several substituents which can exist are bonded together to form a ring, and is preferably a benzene ring, a naphthalene ring, a fluorene ring, a pyridine ring or a pyrimidine ring, more preferably a benzene ring, a pyridine ring or a pyrimidine ring, further preferably a benzene ring, and these rings each optionally have a substituent.

"At least one of the ring $L^1$ and the ring $L^2$ has a group represented by the formula (2)" means that a part or all of hydrogen atoms bonding directly to carbon atoms or nitrogen atoms constituting at least one of a plurality of rings are substituted with a group represented by the formula (2). When a plurality of rings $L^1$ and rings $L^2$ are present (namely, when $n^1$ is 2 or 3) in the phosphorescent compound represented by the formula (1), at least one of a plurality of rings $L^1$ and rings $L^2$ may have a group represented by the formula (2), and it is preferable that all the plurality of rings $L^1$, all the plurality of rings $L^2$ or all the plurality of rings $L^1$ and rings $L^2$ have a group represented by the formula (2), it is more preferable that all the plurality of rings $L^1$ or all the plurality of rings $L^2$ have a group represented by the formula (2).

The substituent which the ring $L^1$ and the ring $L^2$ optionally have (different from the group represented by the formula (2), the same shall apply hereinafter.) is preferably a halogen atom, an alkyl group, a cycloalkyl group, an alkoxy group, a cycloalkoxy group or an aryloxy group, more preferably an alkyl group, a cycloalkyl group or an alkoxy group, further preferably an alkyl group or a cycloalkyl group, and these groups each optionally further have a substituent.

When a plurality of substituents which the ring $L^1$ optionally has are present, they may be the same or different and may be combined together to form a ring together with the atoms to which they are attached.

When a plurality of substituents which the ring $L^2$ optionally has are present, they may be the same or different and may be combined together to form a ring together with the atoms to which they are attached.

The substituent which the ring $L^1$ optionally has and the substituent which the ring $L^2$ optionally has may be combined together to form a ring together with the atoms to which they are attached.

[Group Represented by Formula (2)]

The aryl group represented by $R^2$ is preferably a phenyl group, a naphthyl group, an anthracenyl group, a phenanthrenyl group, a dihydrophenanthrenyl group, a fluorenyl group or a pyrenyl group, more preferably a phenyl group, a naphthyl group or a fluorenyl group, further preferably a phenyl group, and these groups each optionally have a substituent.

The monovalent heterocyclic group represented by $R^2$ is preferably a pyridyl group, a pyrimidinyl group, a triazinyl group, a quinolinyl group, an isoquinolinyl group, a dibenzofuranyl group, a dibenzothienyl group, a carbazolyl group, an azacarbazolyl group, a diazacarbazolyl group, a phenoxazinyl group or a phenothiazinyl group, more preferably a pyridyl group, a pyrimidinyl group, a triazinyl group, a carbazolyl group, an azacarbazolyl group or a diazacarbazolyl group, further preferably a pyridyl group, a pyrimidinyl group or a triazinyl group, and these groups each optionally have a substituent.

In the substituted amino group represented by $R^2$, the substituent which the amino group has is preferably an aryl group or a monovalent heterocyclic group, and these groups each optionally further have a substituent.

The preferable range and examples of the aryl group as the substituent which the amino group has are the same as the preferable range and examples of the aryl group represented by $R^2$. The preferable range and examples of the monovalent heterocyclic group as the substituent which the amino group has are the same as the preferable range and examples of the monovalent heterocyclic group represented by $R^2$.

The substituent which the aryl group, the monovalent heterocyclic group and the substituted amino group represented by $R^2$ optionally have is preferably an alkyl group, a cycloalkyl group, an aryl group, a monovalent heterocyclic group, an alkoxy group, a cycloalkoxy group, an aryloxy group or an substituted amino group, more preferably an alkyl group, a cycloalkyl group, an aryl group, a monovalent heterocyclic group or an substituted amino group, further preferably an alkyl group, a cycloalkyl group or an aryl group, and these groups each optionally further have a substituent.

The group represented by the formula (2) is preferably a group represented by the formula (D-A), (D-B) or (D-C), more preferably a group represented by the formula (D-A) or (D-C), because the light emitting device of the present invention is excellent in luminance life.

$m^{DA1}$, $m^{DA2}$, $m^{DA3}$, $m^{DA4}$, $m^{DA5}$, $m^{DA6}$ and $m^{DA7}$ are each usually an integer of 10 or less, preferably an integer of 5 or less, more preferably an integer of 2 or less, further preferably 0 or 1. It is preferable that $m^{DA1}$, $m^{DA2}$, $m^{DA3}$, $m^{DA4}$, $m^{DA5}$, $m^{DA6}$ and $m^{DA7}$ are the same integer.

$G^{DA}$ is preferably a group represented by the formula (GDA-11) to the formula (GDA-15), more preferably a group represented by the formula (GDA-11) to the formula (GDA-14), further preferably a group represented by the formula (GDA-11) or the formula (GDA-14).

(Chemical Formula 29)

(GDA-11)

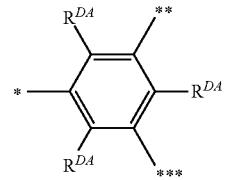

-continued

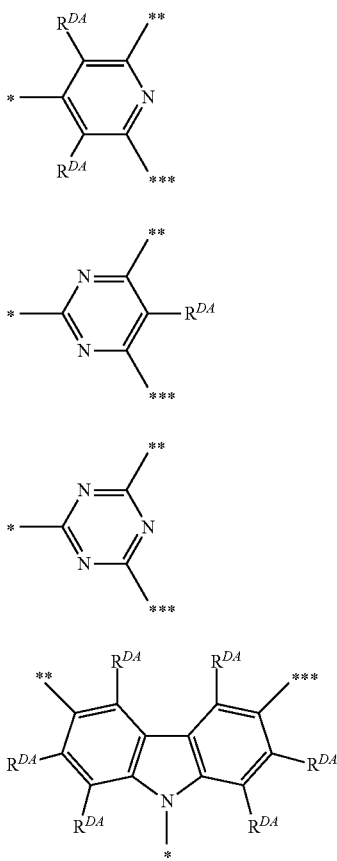

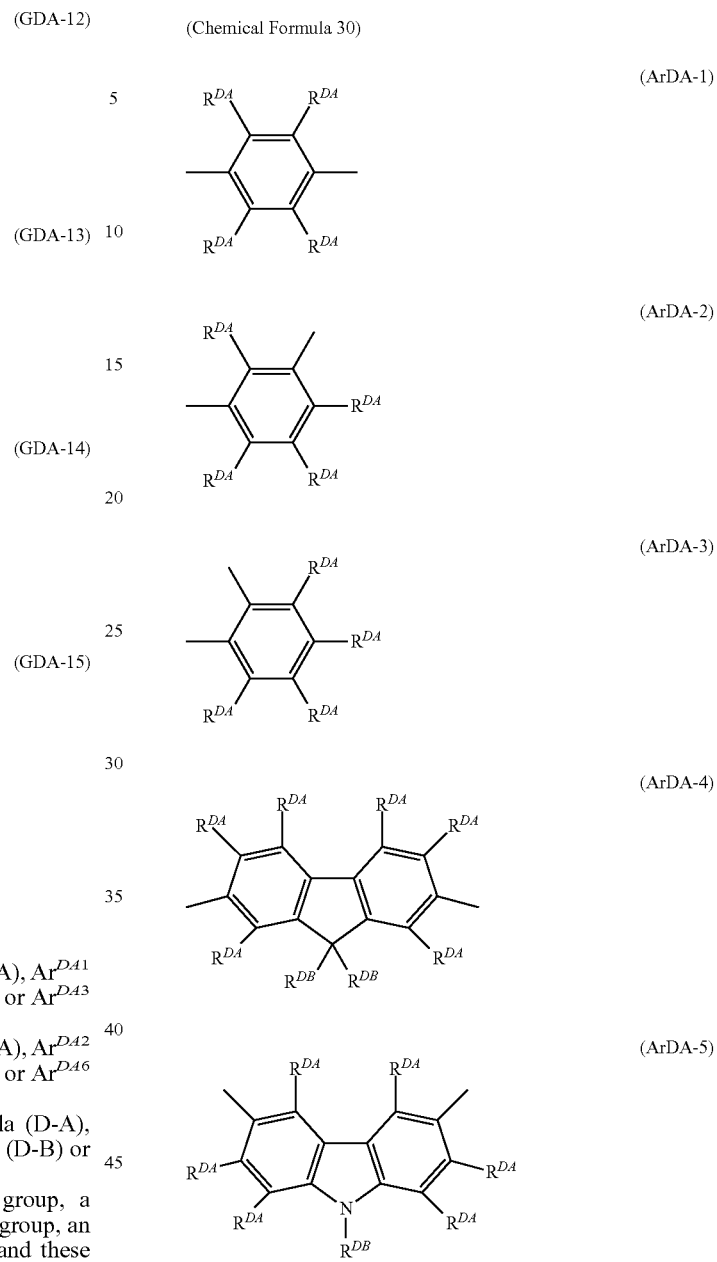

[wherein,
* represents a bond to Ar$^{DA1}$ in the formula (D-A), Ar$^{DA1}$ in the formula (D-B), Ar$^{DA2}$ in the formula (D-B) or Ar$^{DA3}$ in the formula (D-B).
** represents a bond to Ar$^{DA2}$ in the formula (D-A), Ar$^{DA2}$ in the formula (D-B), Ar$^{DA4}$ in the formula (D-B) or Ar$^{DA6}$ in the formula (D-B).
*** represents a bond to Ar$^{DA3}$ in the formula (D-A), Ar$^{DA3}$ in the formula (D-B), Ar$^{DA5}$ in the formula (D-B) or Ar$^{DA7}$ in the formula (D-B).
R$^{DA}$ represents a hydrogen atom, an alkyl group, a cycloalkyl group, an alkoxy group, a cycloalkoxy group, an aryl group or a monovalent heterocyclic group, and these groups each optionally further have a substituent. When a plurality of R$^{DA}$ are present, they may be the same or different.]

R$^{DA}$ is preferably a hydrogen atom, an alkyl group, a cycloalkyl group, an alkoxy group or a cycloalkoxy group, more preferably a hydrogen atom, an alkyl group or a cycloalkyl group, and these groups each optionally have a substituent.

Ar$^{DA1}$, Ar$^{DA2}$, Ar$^{DA3}$, Ar$^{DA4}$, Ar$^{DA5}$, Ar$^{DA6}$ and Ar$^{DA7}$ are each preferably a phenylene group, a fluorenediyl group or a carbazolediyl group, more preferably a group represented by the formula (A-1) to the formula (A-3), the formula (A-8), the formula (A-9), the formula (AA-10), the formula (AA-11), the formula (AA-33) or the formula (AA-34), further preferably a group represented by the formula (ArDA-1) to the formula (ArDA-5), particularly preferably a group represented by the formula (ArDA-1) to the formula (ArDA-3), especially preferably a group represented by the formula (ArDA-1).

[wherein,
R$^{DA}$ represents the same meaning as described above.
R$^{DB}$ represents a hydrogen atom, an alkyl group, a cycloalkyl group, an aryl group or a monovalent heterocyclic group, and these groups each optionally have a substituent. When a plurality of R$^{DB}$ are present, they may be the same or different.]

R$^{DB}$ is preferably an alkyl group, a cycloalkyl group, an aryl group or a monovalent heterocyclic group, more preferably an aryl group or a monovalent heterocyclic group, further preferably an aryl group, and these groups each optionally have a substituent.

T$^{DA}$ is preferably a group represented by the formula (TDA-1) to the formula (TDA-3), more preferably a group represented by the formula (TDA-1).

(Chemical Formula 31)

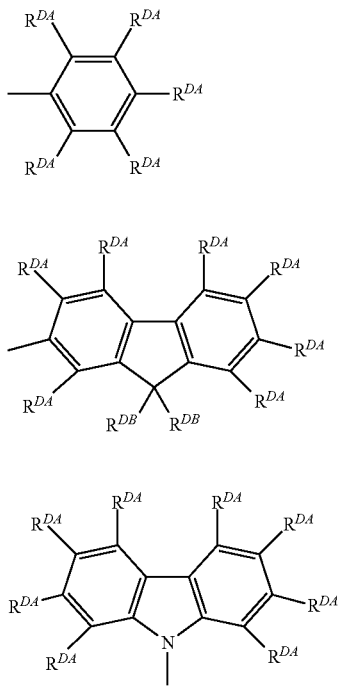

[wherein, $R^{DA}$ and $R^{DB}$ represent the same meaning as described above.]

The group represented by the formula (D-A) is preferably a group represented by the formula (D-A1) to the formula (D-A4), more preferably a group represented by the formula (D-A1), the formula (D-A3) or the formula (D-A4), further preferably a group represented by the formula (D-A1) or the formula (D-A3).

The group represented by the formula (D-B) is preferably a group represented by the formula (D-B1) to the formula (D-B3), more preferably a group represented by the formula (D-B1) or the formula (D-B3), further preferably a group represented by the formula (D-B1).

The group represented by the formula (D-C) is preferably a group represented by the formula (D-C1) to the formula (D-C4), more preferably a group represented by the formula (D-C1) to the formula (D-C3), further preferably a group represented by the formula (D-C1) or the formula (D-C2).

np1 is preferably 0 or 1, more preferably 1. np2 is preferably 0 or 1, more preferably 0. np3 is preferably 0. np4 is preferably an integer of 0 to 2. np5 is preferably an integer of 1 to 3. np6 is preferably an integer of 0 to 2.

$R^{P1}$, $R^{P2}$, $R^{P3}$, $R^{P4}$, $R^{P5}$ and $R^{P6}$ are each preferably an alkyl group or a cycloalkyl group, more preferably a methyl group, an ethyl group, an isopropyl group, a tert-butyl group, a hexyl group, a 2-ethylhexyl group, a cyclohexyl group, a methoxy group, a 2-ethylhexyloxy group, a tert-octyl group or a cyclohexyloxy group, further preferably a methyl group, an ethyl group, an isopropyl group, a tert-butyl group, a hexyl group, a 2-ethylhexyl group or a tert-octyl group.

The group represented by the formula (D-A) includes, for example, groups represented by the formula (D-A-1) to the formula (D-A-12).

(Chemical Formula 32)

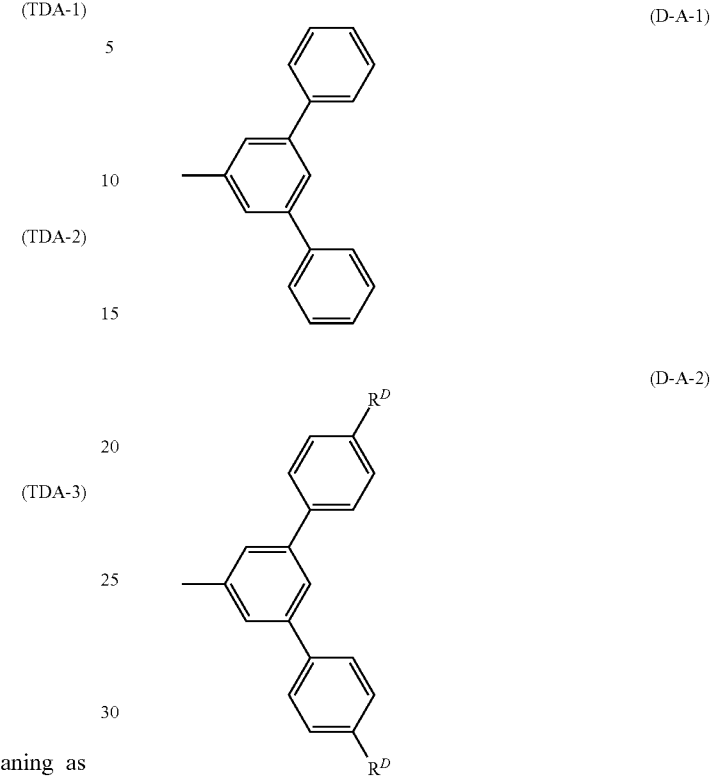

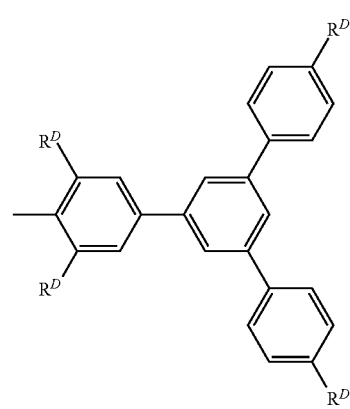

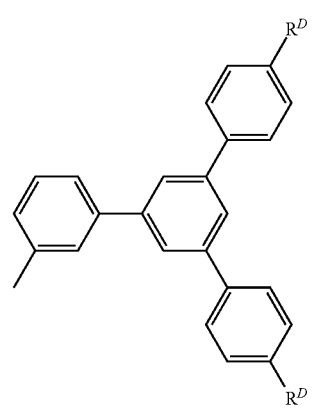

-continued
(D-A-5)
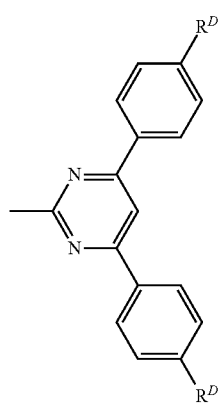
(D-A-6)
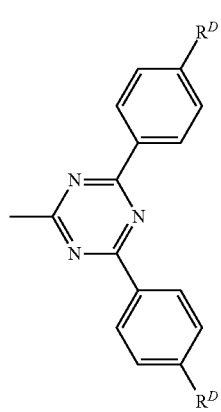
(D-A-7)
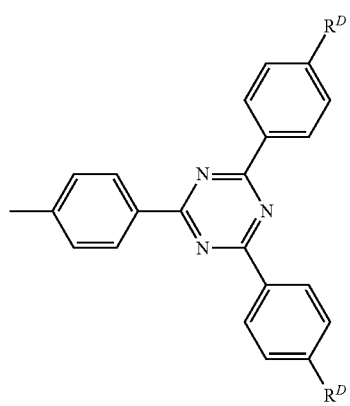
(Chemical Formula 33)
(D-A-8)
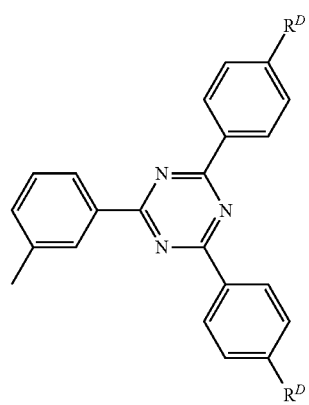
(D-A-9)
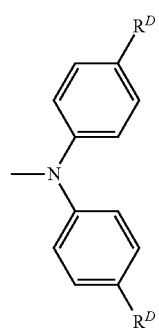
(D-A-10)
(D-A-11)
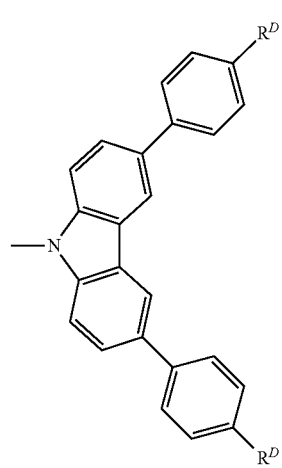

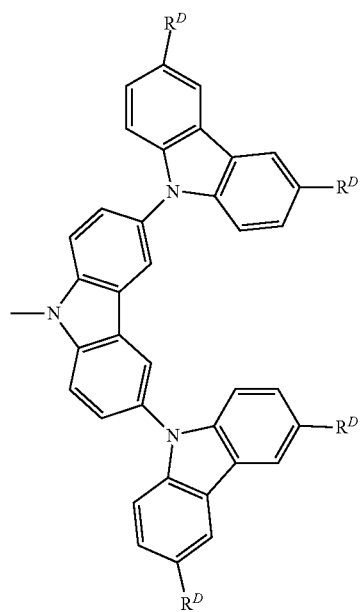

(D-A-12)

[wherein, $R^D$ represents a methyl group, an ethyl group, an isopropyl group, a tert-butyl group, a hexyl group, a 2-ethylhexyl group, a tert-octyl group, a cyclohexyl group, a methoxy group, a 2-ethylhexyloxy group or a cyclohexyloxy group. When a plurality of $R^D$ are present, they may be the same or different.]

The group represented by the formula (D-B) includes, for example, groups represented by the formula (D-B-1) to the formula (D-B-4).

(Chemical Formula 34)

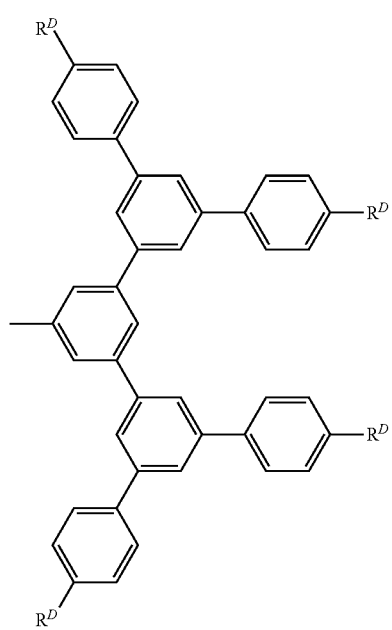

(D-B-1)

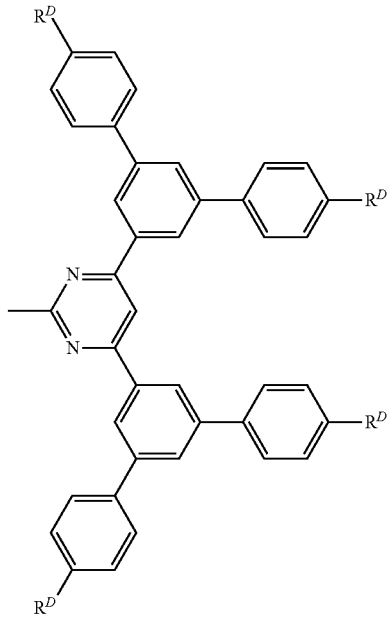

(D-B-2)

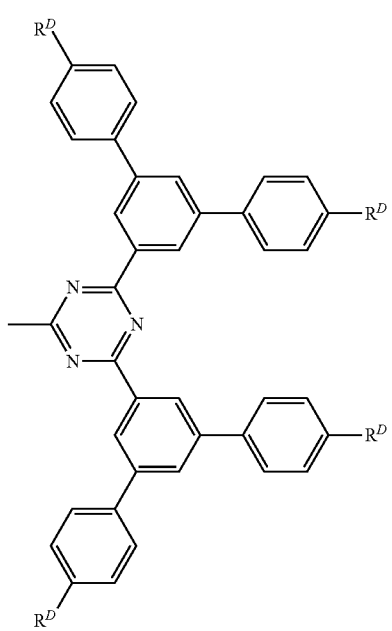

(D-B-3)

(D-B-4)
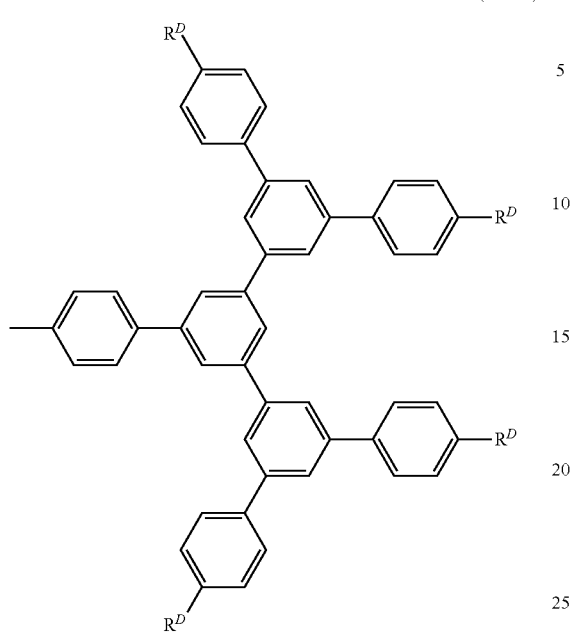
[wherein, $R^D$ represents the same meaning as described above.]
The group represented by the formula (D-C) includes, for example, groups represented by the formula (D-C-1) to the formula (D-C-13).
(Chemical Formula 35)
(D-C-1)
(D-C-2)
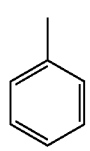
(D-C-3)
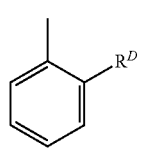
(D-C-4)
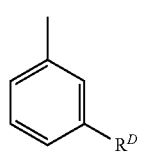
(D-C-5)
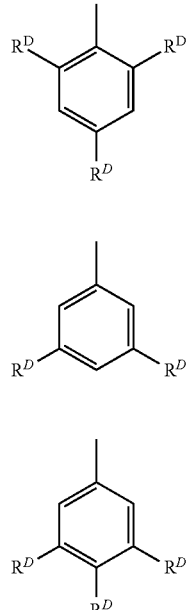
(D-C-6)
(D-C-7)
(D-C-8)
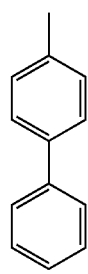
(D-C-9)
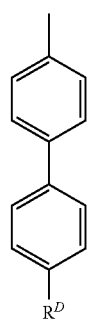
(D-C-10)
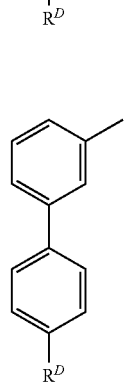

-continued

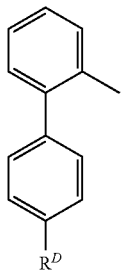
(D-C-11)

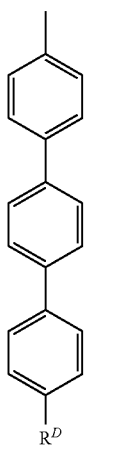
(D-C-12)

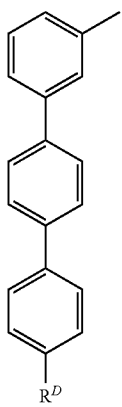
(D-C-13)

[wherein, $R^D$ represents the same meaning as described above.]

$R^D$ is preferably a methyl group, an ethyl group, an isopropyl group, a tert-butyl group, a hexyl group, a 2-ethylhexyl group or a tert-octyl group.

The group represented by the formula (2) is preferably an aryl group optionally having a substituent or a monovalent heterocyclic group optionally having a substituent, more preferably a group represented by the formula (D-A1), the formula (D-A3), the formula (D-A4), the formula (D-B1), the formula (D-B3) or the formula (D-C1) to the formula (D-C4), further preferably a group represented by the formula (D-A1), the formula (D-A3), the formula (D-B1) or the formula (D-C1) to the formula (D-C3), particularly preferably a group represented by the formula (D-A1), the formula (D-A3), the formula (D-C1) or the formula (D-C2), because the light emitting device of the present invention is more excellent in luminance life.

[Anionic Bidentate Ligand]

The anionic bidentate ligand represented by $A^1\text{-}G^1\text{-}A^2$ includes, for example, ligands represented by the following formulae.

(Chemical Formula 36)

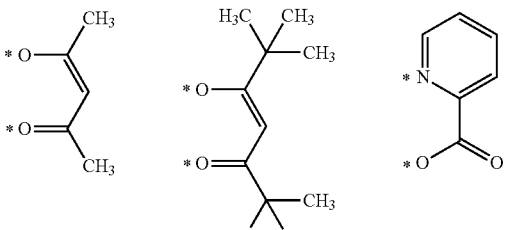

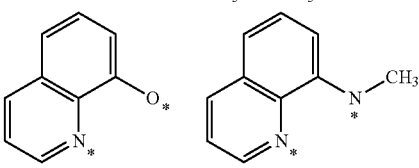

(Chemical Formula 37)

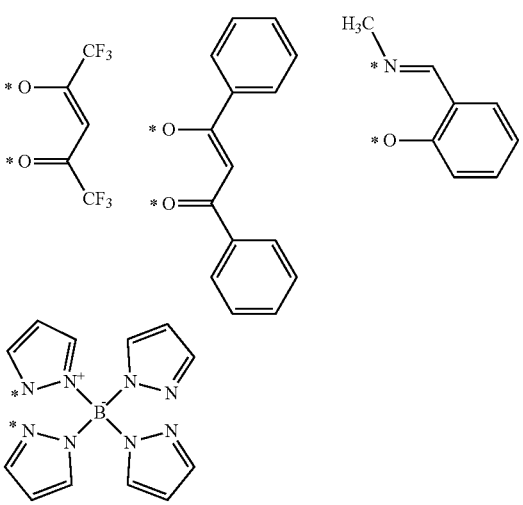

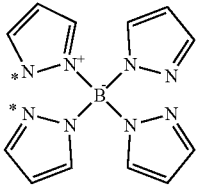

[wherein, * represents a site binding to M.]

The anionic bidentate ligand represented by $A^1\text{-}G^1\text{-}A^2$ may be a ligand represented by any one of the following formula. The anionic bidentate ligand represented by $A^1\text{-}G^1\text{-}A^2$ is different from the ligand of which number is defined by a suffix $n^1$.

(Chemical Formula 38)

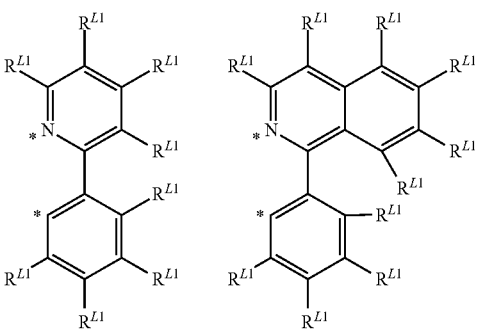

-continued

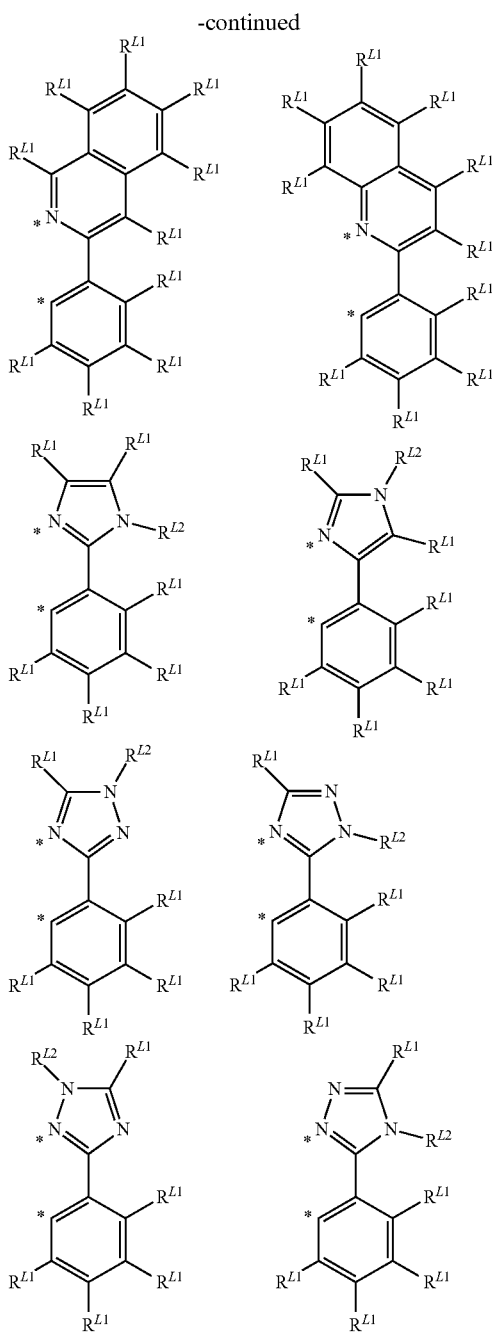

[wherein,
* represents a site binding to M.

$R^{L1}$ represents a hydrogen atom, an alkyl group, a cycloalkyl group or a halogen atom, and these groups each optionally have a substituent. The plurality of $R^{L1}$ may be the same or different.

$R^{L2}$ represents an alkyl group, a cycloalkyl group or a halogen atom, and these groups each optionally have a substituent.]

The phosphorescent compound represented by the formula (1) is preferably a phosphorescent compound represented by the formula (1-A) or a phosphorescent compound represented by the formula (1-B), because the light emitting device of the present invention is excellent in luminance life.

[Phosphorescent Compound Represented by Formula (1-A)]

When the ring $L^{1A}$ is a diazole ring, preferable is an imidazole ring in which $E^{11A}$ is a nitrogen atom or an imidazole ring in which $E^{12A}$ is a nitrogen atom, more preferable is an imidazole ring in which $E^{11A}$ is a nitrogen atom.

When the ring $L^{1A}$ is a triazole ring, preferable is a triazole ring in which $E^{11A}$ and $E^{12A}$ are each a nitrogen atom or a triazole ring in which $E^{11A}$ and $E^{13A}$ are each a nitrogen atom, more preferable is a triazole ring in which $E^{11A}$ and $E^{12A}$ are each a nitrogen atom.

When $E^{11A}$ is a nitrogen atom and $R^{11A}$ is present, it is preferable that $R^{11A}$ is an alkyl group, a cycloalkyl group or a group represented by the formula (2), and these groups each optionally have a substituent.

When $E^{11A}$ is a carbon atom, $R^{11A}$ is preferably a hydrogen atom, an alkyl group, a cycloalkyl group or a group represented by the formula (2), more preferably a hydrogen atom, an alkyl group, a cycloalkyl group or an aryl group, further preferably a hydrogen atom, an alkyl group or a cycloalkyl group, particularly preferably a hydrogen atom, and these groups each optionally have a substituent.

When $E^{12A}$ is a nitrogen atom and $R^{12A}$ is present, it is preferable that $R^{12A}$ is an alkyl group, a cycloalkyl group or a group represented by the formula (2), and these groups each optionally have a substituent.

When $E^{12A}$ is a carbon atom, $R^{12A}$ is preferably a hydrogen atom, an alkyl group, a cycloalkyl group or a group represented by the formula (2), more preferably a hydrogen atom, an alkyl group, a cycloalkyl group or an aryl group, further preferably a hydrogen atom, an alkyl group or a cycloalkyl group, particularly preferably a hydrogen atom, and these groups each optionally have a substituent.

When $E^{13A}$ is a nitrogen atom and $R^{13A}$ is present, it is preferable that $R^{13A}$ is an alkyl group, a cycloalkyl group or a group represented by the formula (2), and these groups each optionally have a substituent.

When $E^{13A}$ is a carbon atom, $R^{13A}$ is preferably a hydrogen atom, an alkyl group, a cycloalkyl group or a group represented by the formula (2), more preferably a hydrogen atom, an alkyl group, a cycloalkyl group or an aryl group, further preferably a hydrogen atom, an alkyl group or a cycloalkyl group, particularly preferably a hydrogen atom or an alkyl group, and these groups each optionally have a substituent.

When the ring $L^{1A}$ has a group represented by the formula (2), it is preferable that $R^{11A}$ or $R^{12A}$ is a group represented by the formula (2), it is more preferable that $R^{11A}$ is a group represented by the formula (2).

When the ring $L^{2A}$ is a pyridine ring, preferable is a pyridine ring in which $E^{21A}$ is a nitrogen atom, a pyridine ring in which $E^{22A}$ is a nitrogen atom or a pyridine ring in which $E^{23A}$ is a nitrogen atom, more preferable is a pyridine ring in which $E^{22A}$ is a nitrogen atom.

When the ring $L^{2A}$ is a pyrimidine ring, preferable is a pyrimidine ring in which $E^{22A}$ and $E^{24A}$ are each a nitrogen atom.

It is preferable that the ring $L^{2A}$ is a benzene ring.

$R^{21A}$, $R^{22A}$, $R^{23A}$ and $R^{24A}$ are each preferably a hydrogen atom, an alkyl group, a cycloalkyl group, an alkoxy group, a cycloalkoxy group, a halogen atom or a group represented by the formula (2), more preferably a hydrogen atom, an alkyl group, a cycloalkyl group or a group represented by the formula (2), more preferably a hydrogen atom or a group represented by the formula (2), and these groups each optionally have a substituent.

When the ring $L^{2A}$ has a group represented by the formula (2), it is preferable that $R^{22A}$ or $R^{23A}$ is a group represented by the formula (2), it is more preferable that $R^{22A}$ is a group represented by the formula (2).

The phosphorescent compound represented by the formula (1-A) is preferably a phosphorescent compound represented by the formula (1-A1), a phosphorescent compound represented by the formula (1-A2), a phosphorescent compound represented by the formula (1-A3) or a phosphorescent compound represented by the formula (1-A4), more preferably a phosphorescent compound represented by the formula (1-A1) or a phosphorescent compound represented by the formula (1-A3), because the light emitting device of the present invention is further excellent in luminance life.

[Phosphorescent Compound Represented by Formula (1-B)]

When the ring $L^{1B}$ is a pyrimidine ring, preferable is a pyrimidine ring in which $E^{11B}$ is a nitrogen atom.

$R^{11B}$, $R^{12B}$, $R^{13B}$ and $R^{14B}$ are each preferably a hydrogen atom, an alkyl group, a cycloalkyl group, an alkoxy group, a cycloalkoxy group, a halogen atom or a group represented by the formula (2), more preferably a hydrogen atom, an alkyl group, a cycloalkyl group or a group represented by the formula (2), further preferably a hydrogen atom or a group represented by the formula (2), and these groups each optionally have a substituent.

When the ring $L^{1B}$ has a group represented by the formula (2), it is preferable that $R^{11B}$, $R^{12B}$ or $R^{13B}$ is a group represented by the formula (2), it is more preferable that $R^{12B}$ or $R^{13B}$ is a group represented by the formula (2), it is further preferable that $R^{13B}$ is a group represented by the formula (2).

When the ring $L^{2B}$ is a pyridine ring, preferable is a pyridine ring in which $E^{21B}$ is a nitrogen atom, a pyridine ring in which $E^{22B}$ is a nitrogen atom or a pyridine ring in which $E^{23B}$ is a nitrogen atom, more preferable is a pyridine ring in which $E^{22B}$ is a nitrogen atom.

When the ring $L^{2B}$ is a pyrimidine ring, preferable is a pyrimidine ring in which $E^{22B}$ and $E^{24B}$ are each a nitrogen atom.

It is preferable that the ring $L^{2B}$ is a benzene ring.

$R^{21B}$, $R^{22B}$, $R^{23B}$ and $R^{24B}$ are each preferably a hydrogen atom, an alkyl group, a cycloalkyl group, an alkoxy group, a cycloalkoxy group, a halogen atom or a group represented by the formula (2), more preferably a hydrogen atom, an alkyl group, a cycloalkyl group or a group represented by the formula (2), further preferably a hydrogen atom or a group represented by the formula (2), and these groups each optionally have a substituent.

When the ring $L^{2B}$ has a group represented by the formula (2), it is preferable that $R^{22B}$ or $R^{23B}$ is a group represented by the formula (2), it is more preferable that $R^{22B}$ is a group represented by the formula (2).

The phosphorescent compound represented by the formula (1-B) is preferably a phosphorescent compound represented by the formula (1-B1), a phosphorescent compound represented by the formula (1-B2), a phosphorescent compound represented by the formula (1-B3), a phosphorescent compound represented by the formula (1-B4) or a phosphorescent compound represented by the formula (1-B5), more preferably a phosphorescent compound represented by the formula (1-B1), a phosphorescent compound represented by the formula (1-B2) or a phosphorescent compound represented by the formula (1-B3), because the light emitting device of the present invention is further excellent in luminance life.

The phosphorescent compound represented by the formula (1) includes, for example, phosphorescent compounds represented by the following formulae.

(Chemical Formula 39)

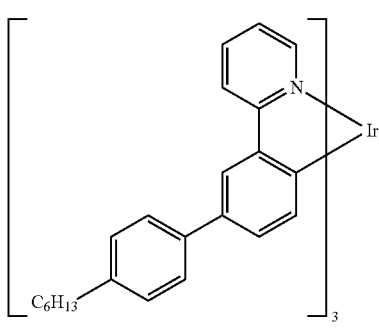

COM-1

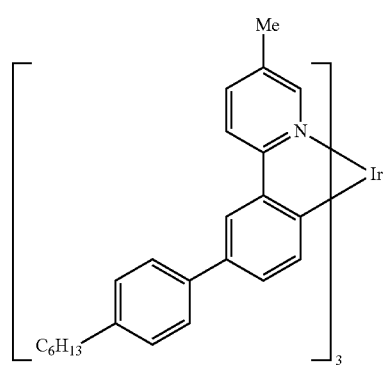

COM-2

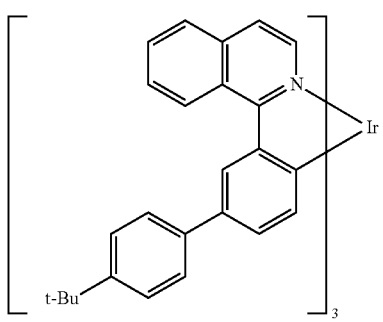

COM-3

-continued
(Chemical Formula 40)
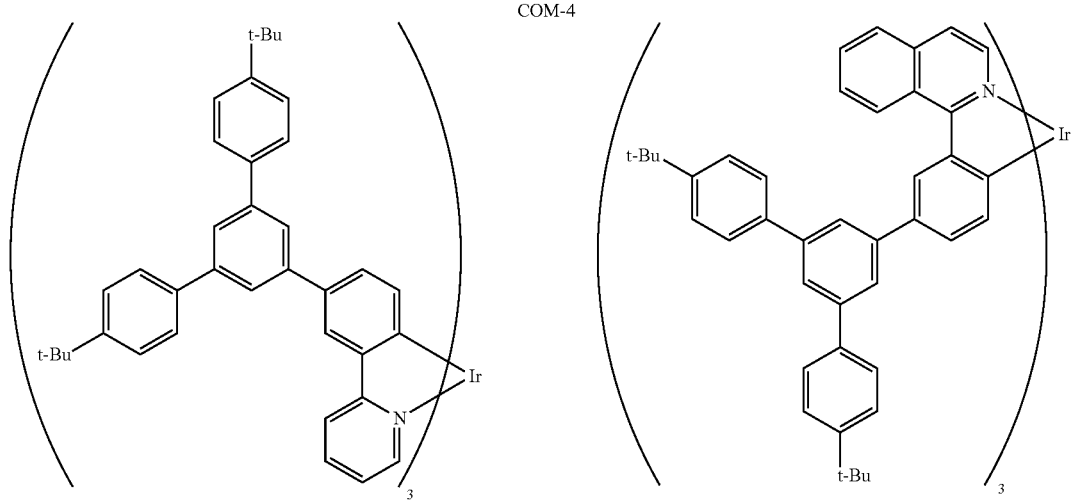
COM-4
COM-5
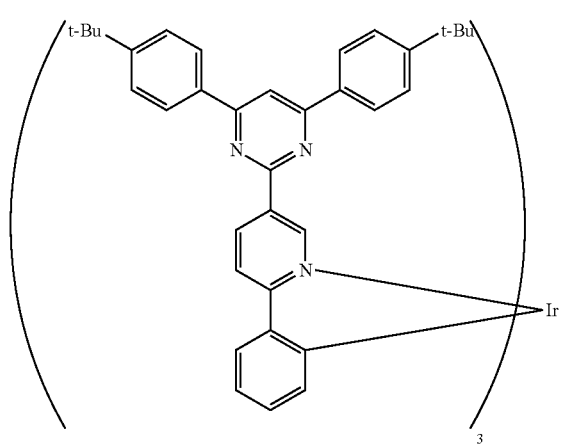
COM-6
(Chemical Formula 41)
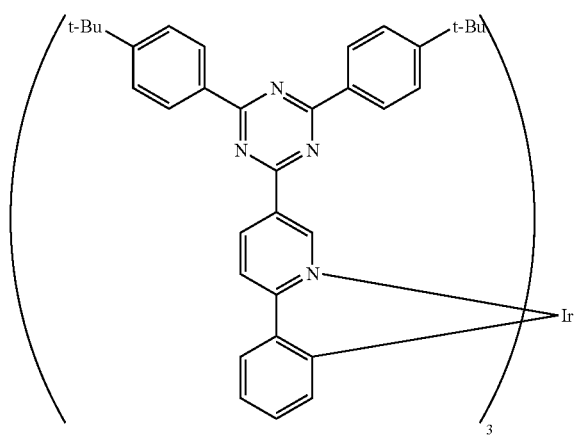
COM-7

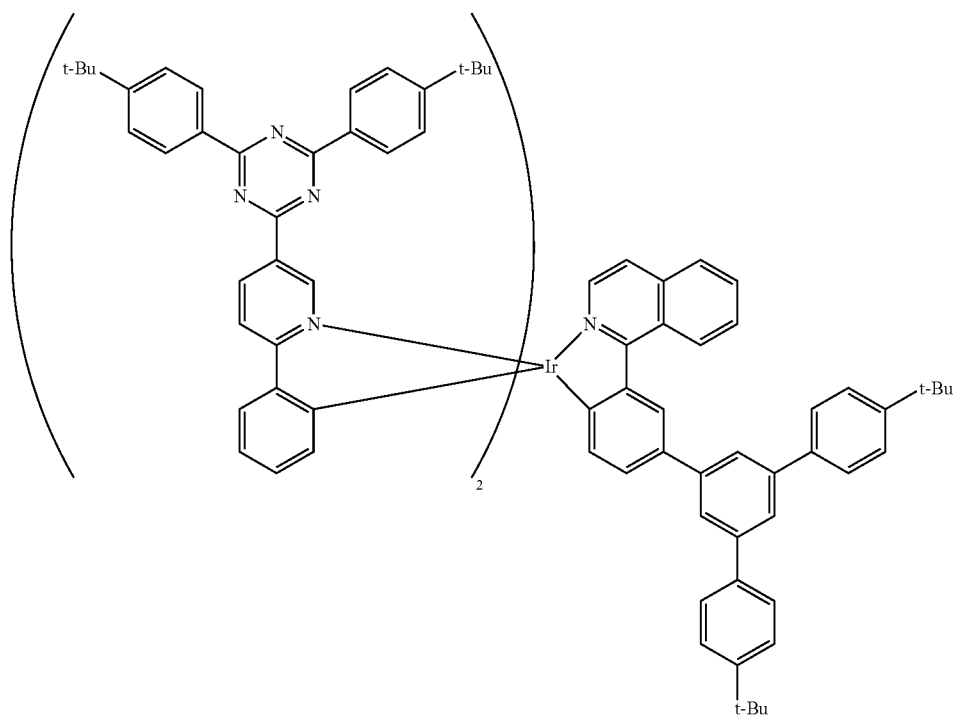
(Chemical Formula 42)
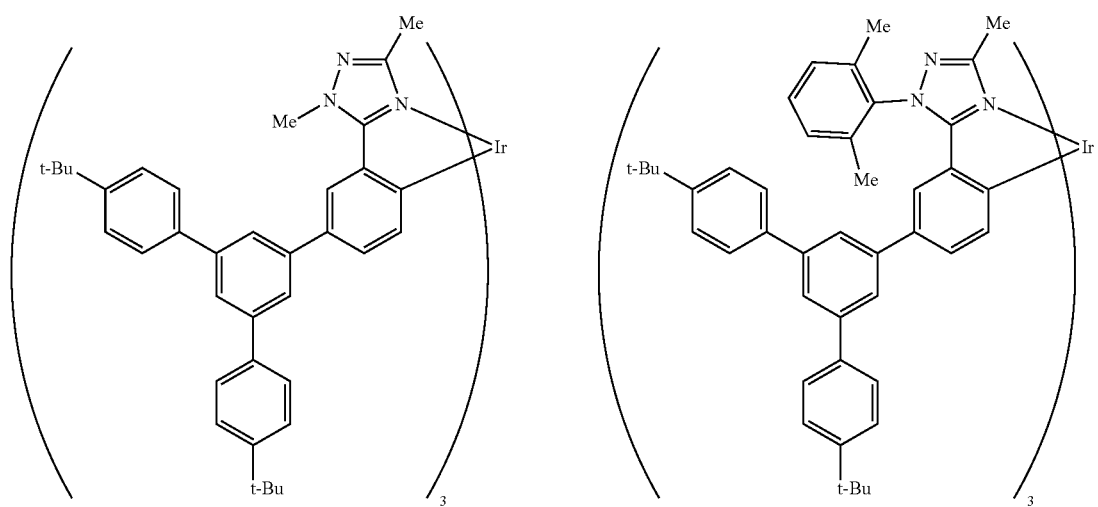

-continued
COM-11
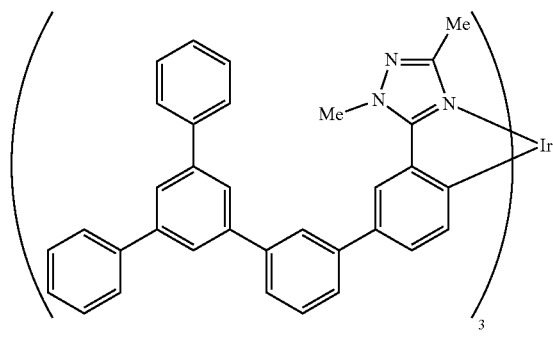
COM-12
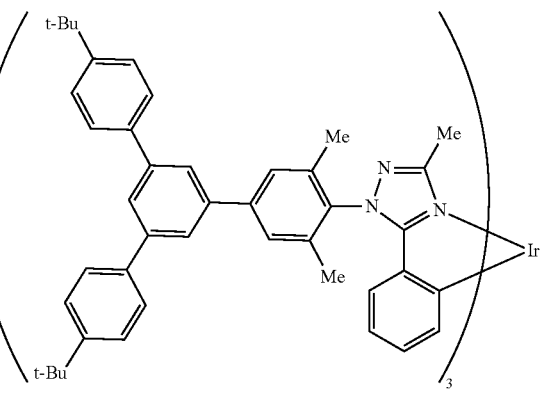
COM-13
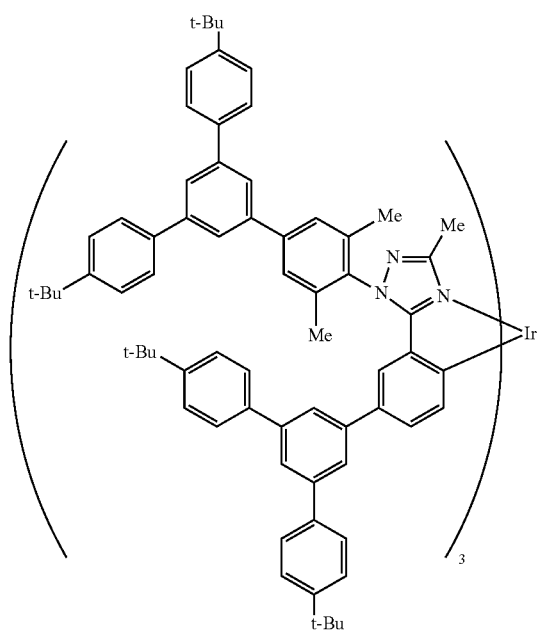
(Chemical Formula 43)
COM-14
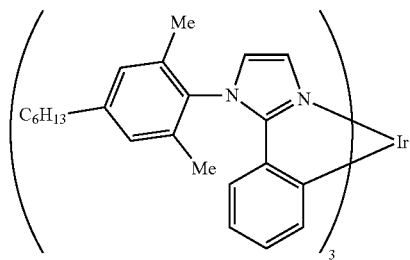
COM-15
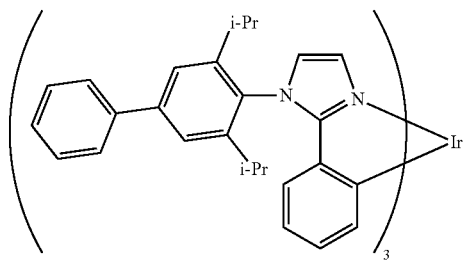

-continued
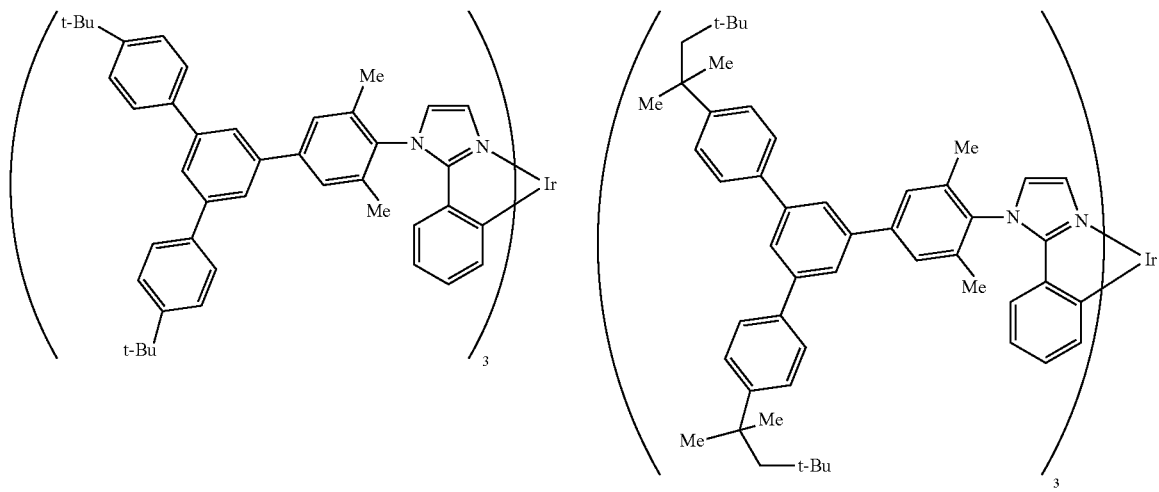
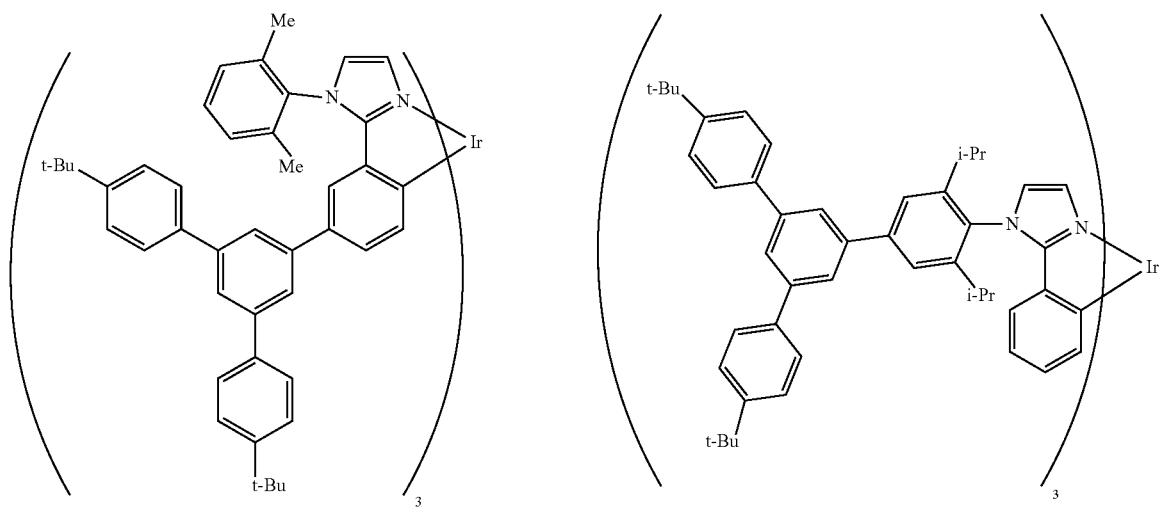
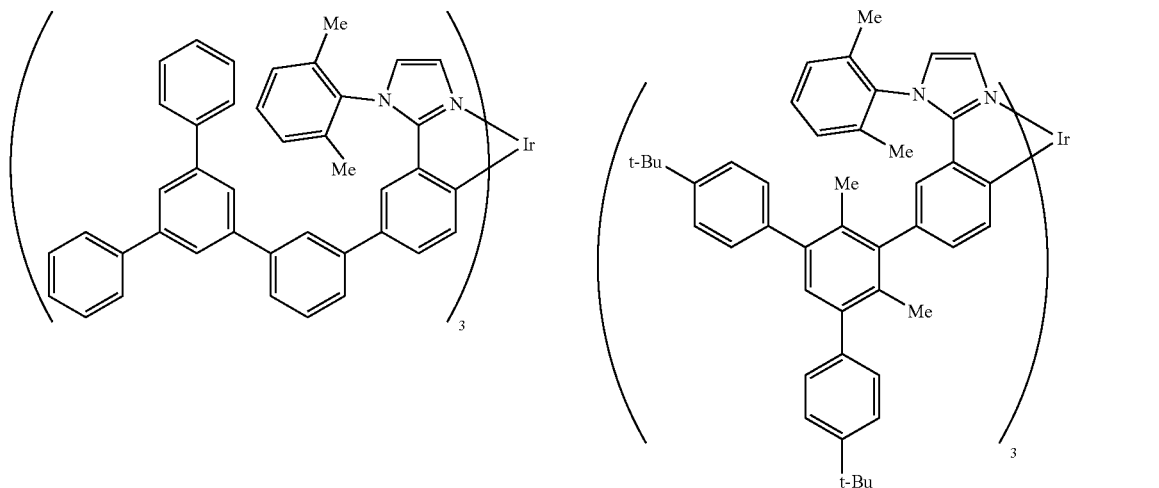

The first organic layer may also be a layer comprising a phosphorescent compound represented by the formula (1) and another phosphorescent compound, because the emission color of the light emitting device of the present invention can be adjusted. The other phosphorescent compound includes, for example, phosphorescent compounds represented by the following formulae.

(Chemical Formula 44)

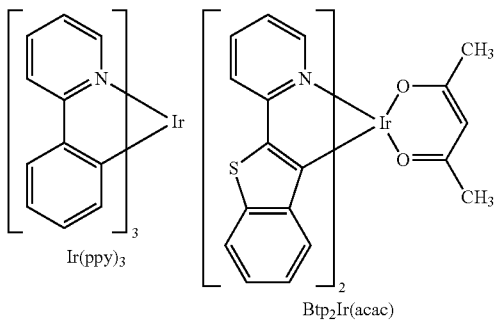

Ir(ppy)₃

Btp₂Ir(acac)

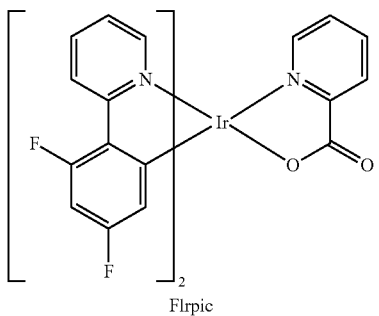

FIrpic

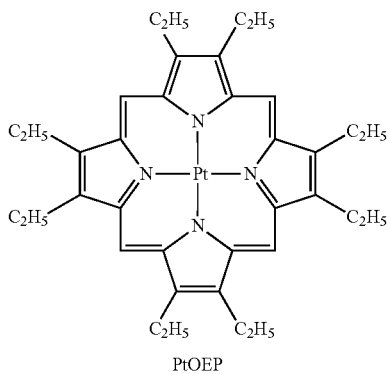

PtOEP (Chemical Formula 45)

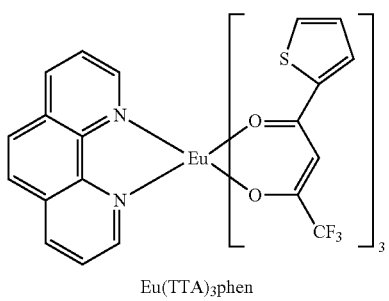

Eu(TTA)₃phen

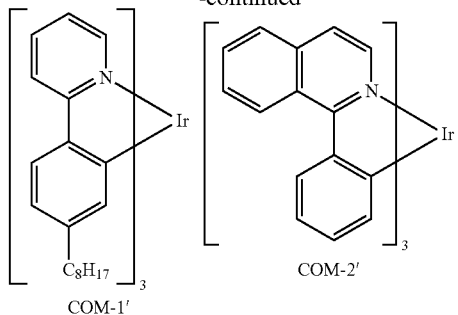

COM-1'

COM-2'

[Host Material]

The first organic layer is preferably a layer comprising at least one phosphorescent compound and a host material having at least one function of hole injectability, hole transportability, electron injectability and electron transportability, because the light emitting device of the present invention is excellent in luminance life. When the first organic layer is a layer comprising a phosphorescent material and a host material, the host material may be contained singly or two or more of the host materials may be contained.

When the first organic layer is a layer comprising a phosphorescent material and a host material, the content of the phosphorescent material is usually 0.1 to 50 parts by weight, preferably 1 to 45 parts by weight, more preferably 5 to 40 parts by weight, further preferably 10 to 35 parts by weight, when the sum of the phosphorescent material and the host material is 100 parts by weight.

When the first organic layer is a layer comprising a phosphorescent material and a host material, it is preferable that the lowest excited triplet state ($T_1$) of the host material is at energy level equivalent to or higher than $T_1$ of the phosphorescent material contained in the first organic layer, because the light emitting device of the present invention is excellent in luminance life.

The host material is preferably one which shows solubility in solvents capable of dissolving the phosphorescent material contained in the first organic layer, because the light emitting device of the present invention can be fabricated by a solution application process.

The host material is classified into low molecular weight compounds and polymer compounds.

[Low Molecular Weight Host]

The low molecular weight compound which is preferable as a host compound (hereinafter, referred to as "low molecular weight host") will be explained.

The low molecular weight host is preferably a compound represented by the formula (H-1).

$Ar^{H1}$ and $Ar^{H2}$ are preferably a phenyl group, a fluorenyl group, a spirobifluorenyl group, a pyridyl group, a pyrimidinyl group, a triazinyl group, a quinolinyl group, an isoquinolinyl group, a thienyl group, a benzothienyl group, a dibenzothienyl group, a furyl group, a benzofuryl group, a dibenzofuryl group, a pyrrolyl group, an indolyl group, an azaindolyl group, a carbazolyl group, an azacarbazolyl group, a diazacarbazolyl group, a phenoxazinyl group or a phenothiazinyl group, more preferably a phenyl group, a spirobifluorenyl group, a pyridyl group, a pyrimidinyl group, a triazinyl group, a dibenzothienyl group, a dibenzofuryl group, a carbazolyl group or an azacarbazolyl group, further preferably a phenyl group, a pyridyl group, a carbazolyl group or an azacarbazolyl group, particularly preferably a group represented by the formula (TDA-1) or the formula (TDA-3), especially preferably a group represented by the formula (TDA-3), and these groups each optionally have a substituent.

The substituent which $Ar^{H1}$ and $Ar^{H2}$ optionally have is preferably a halogen atom, an alkyl group, a cycloalkyl group, an alkoxy group, a cycloalkoxy group, an aryl group or a monovalent heterocyclic group, more preferably an alkyl group, a cycloalkoxy group, an alkoxy group or cycloalkoxy group, further preferably an alkyl group or cycloalkoxy group, and these groups each optionally further have a substituent.

$n^{H1}$ is preferably 1. $n^{H2}$ is preferably 0.

$n^{H3}$ is usually an integer of 0 to 10, preferably an integer of 0 to 5, further preferably an integer of 1 to 3, particularly preferably 1.

$n^{H11}$ is preferably an integer of 1 to 5, more preferably an integer of 1 to 3, further preferably 1.

$R^{H11}$ is preferably a hydrogen atom, an alkyl group, a cycloalkyl group, an aryl group or a monovalent heterocyclic group, more preferably a hydrogen atom, an alkyl group or a cycloalkyl group, further preferably a hydrogen atom or an alkyl group, and these groups each optionally have a substituent.

$L^{H1}$ is preferably an arylene group or a divalent heterocyclic group.

$L^{H1}$ is preferably a group represented by the formula (A-1) to (A-3), the formula (A-8) to (A-10), the formula (AA-1) to (AA-6), the formula (AA-10) to (AA-21) or the formula (AA-24) to (AA-34), more preferably a group represented by the formula (A-1), the formula (A-2), the formula (A-8), the formula (A-9), the formula (AA-1) to (AA-4), the formula (AA-10) to (AA-15) or the formula (AA-29) to (AA-34), further preferably a group represented by the formula (A-1), the formula (A-2), the formula (A-8), the formula (A-9), the formula (AA-2), the formula (AA-4) or the formula (AA-10) to (AA-15), particularly preferably a group represented by the formula (A-1), the formula (A-2), the formula (A-8), the formula (AA-2), the formula (AA-4), the formula (AA-10), the formula (AA-12) or the formula (AA-14), especially preferably a group represented by the formula (A-1), the formula (A-2), the formula (AA-2), the formula (AA-4) or the formula (AA-14).

The substituent which $L^{H1}$ optionally has is preferably a halogen atom, an alkyl group, a cycloalkyl group, an alkoxy group, a cycloalkoxy group, an aryl group or a monovalent heterocyclic group, more preferably an alkyl group, an alkoxy group, an aryl group or a monovalent heterocyclic group, further preferably an alkyl group, an aryl group or a monovalent heterocyclic group, and these groups each optionally further have a substituent.

$L^{H21}$ is preferably a single bond or an arylene group, more preferably a single bond, and this arylene group optionally has a substituent.

The definition and examples of the arylene group or the divalent heterocyclic group represented by $L^{H21}$ are the same as the definition and examples of the arylene group or the divalent heterocyclic group represented by $L^{H1}$.

$R^{H21}$ is preferably an aryl group or a monovalent heterocyclic group, and these groups each optionally have a substituent.

The definition and examples of the aryl group and the monovalent heterocyclic group represented by $R^{H21}$ are the same as the definition and examples of the aryl group and the monovalent heterocyclic group represented by $Ar^{H1}$ and $Ar^{H2}$.

The definition and examples of the substituent which $R^{H21}$ may optionally has are the same as the definition and examples of the substituent which $Ar^{H1}$ and $Ar^{H2}$ optionally have.

The compound represented by the formula (H-1) is preferably a compound represented by the formula (H-2).

(Chemical Formula 46)

(H-2)

[wherein, $Ar^{H1}$, $Ar^{H2}$, $n^{H3}$ and $L^{H1}$ represent the same meaning as described above.]

As the compound represented by the formula (H-1), compounds represented by the following formula (H-101) to the formula (H-118) are exemplified.

(Chemical Formula 47)

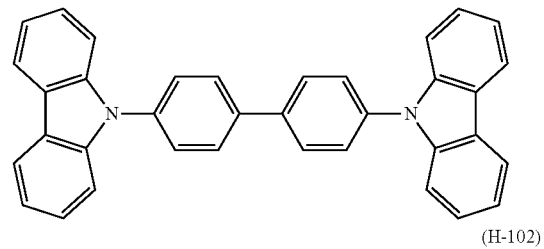

(H-101)

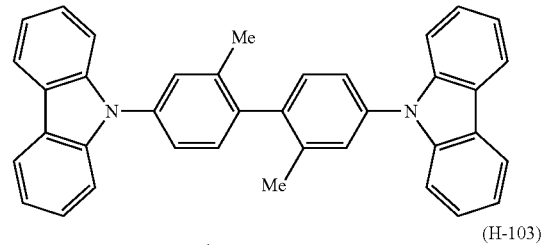

(H-102)

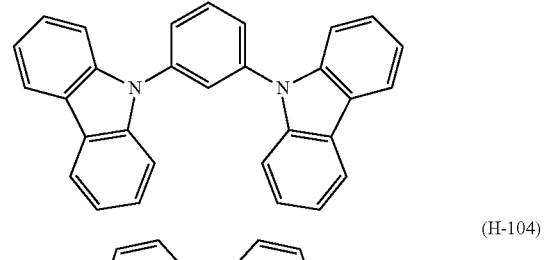

(H-103)

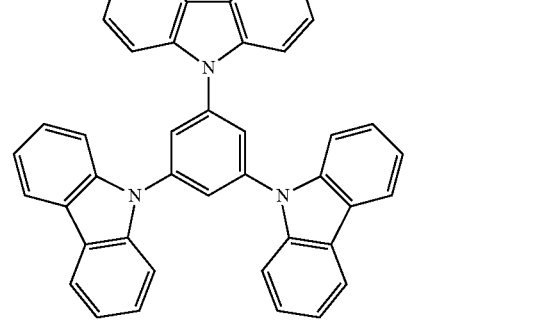

(H-104)

(H-105)
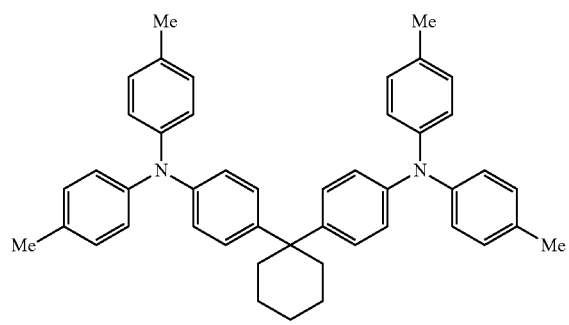
(H-109)
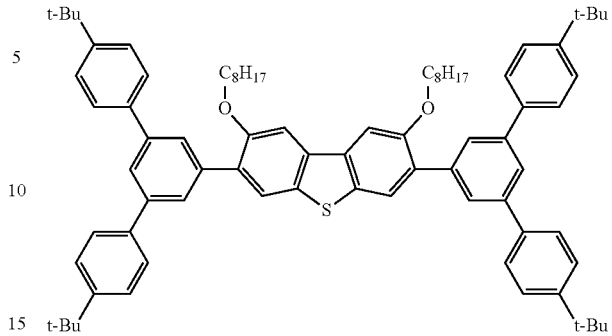
(Chemical Formula 48)
(H-106)
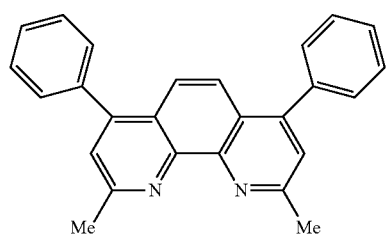
(H-110)
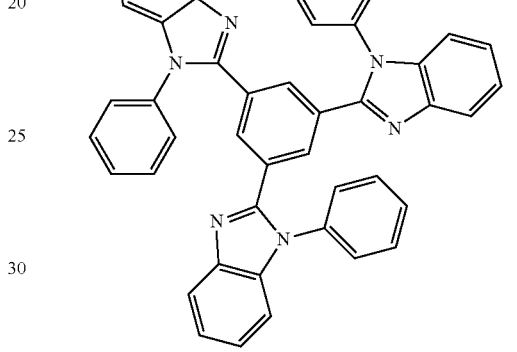
(H-107)
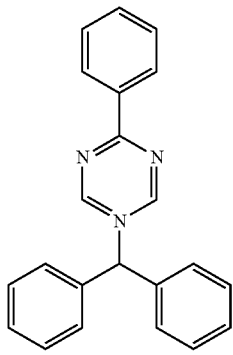
(H-111)
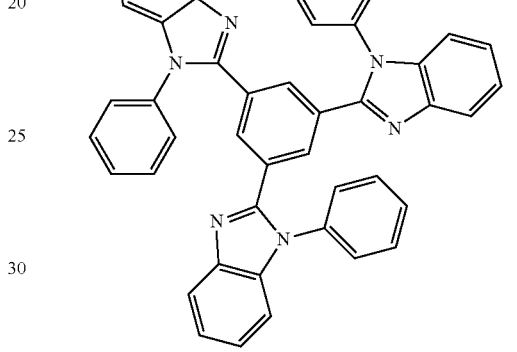
(Chemical Formula 49)
(H-108)
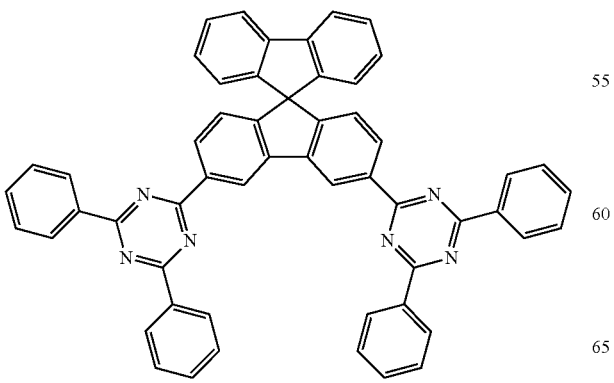
(H-112)
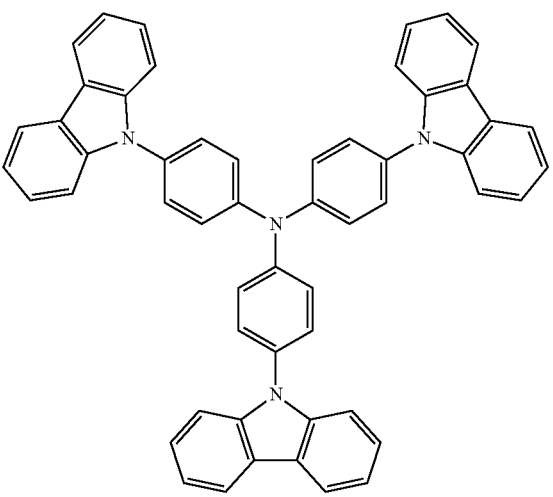

(H-113)
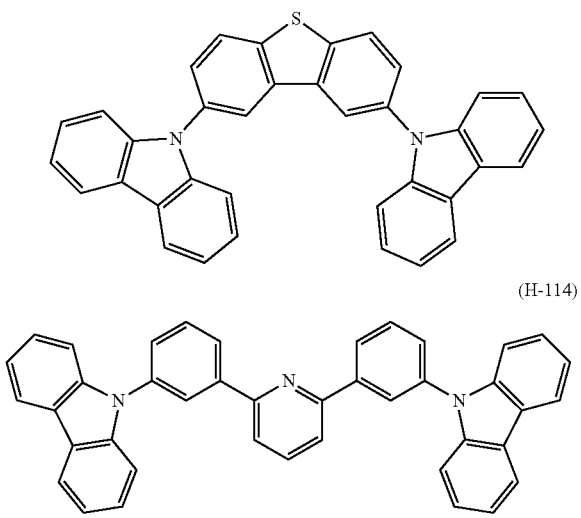

(H-114)

(Chemical Formula 50)

(H-115)

(H-116)

(H-117)
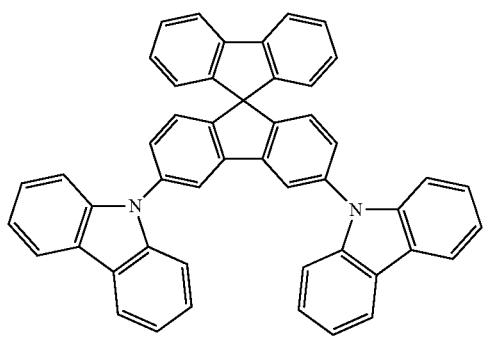
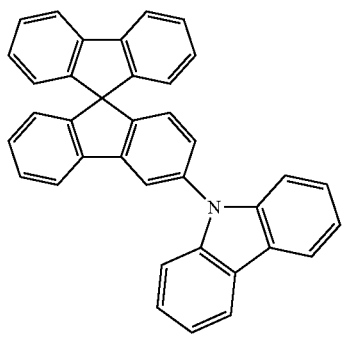
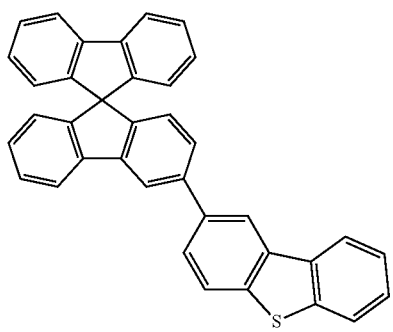

(H-118)
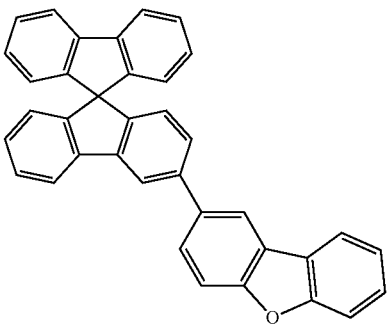

The polymer compound used as a host material includes, for example, polymer compounds as a hole transporting material described later and polymer compounds as an electron transporting material described later.

[Polymer Host]

The polymer compound which is preferable as a host compound (hereinafter, referred to as "polymer host") will be explained.

The polymer host is preferably a polymer compound comprising a constitutional unit represented by the formula (Y).

The arylene group represented by $Ar^{Y1}$ is more preferably a group represented by the formula (A-1), the formula (A-2), the formula (A-6) to (A-10), the formula (A-19) or the formula (A-20), further preferably a group represented by the formula (A-1), the formula (A-2), the formula (A-7), the formula (A-9) or the formula (A-19), and these groups each optionally have a substituent.

The divalent heterocyclic group represented by $Ar^{Y1}$ is more preferably a group represented by the formula (AA-1) to (AA-4), the formula (AA-10) to (AA-15), the formula (AA-18) to (AA-21), the formula (AA-33) or the formula (AA-34), further preferably a group represented by the formula (AA-4), the formula (AA-10), the formula (AA-12), the formula (AA-14) or the formula (AA-33), and these groups each optionally have a substituent.

The more preferable range and the further preferable range of the arylene group and the divalent heterocyclic group in the divalent group in which at least one arylene group and at least one divalent heterocyclic group are bonded directly to each other represented by $Ar^{Y1}$ are the same as the more preferable range and the further preferable range of the arylene group and the divalent heterocyclic group represented by $Ar^{Y1}$ described above, respectively.

"The divalent group in which at least one arylene group and at least one divalent heterocyclic group are bonded directly to each other" includes, for example, groups represented by the following formulae, and each of them optionally has a substituent.

(Chemical Formula 51)
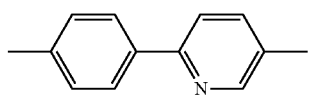

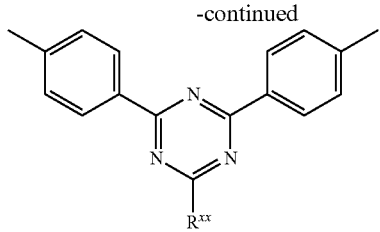

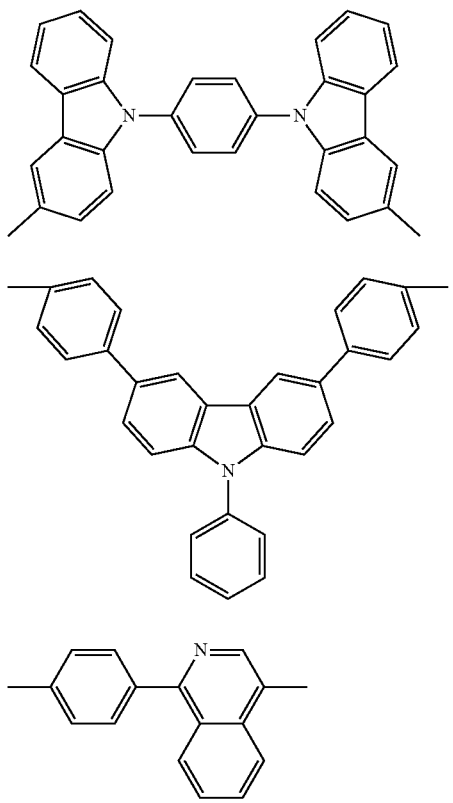

[wherein, $R^{XX}$ represents a hydrogen atom, an alkyl group, a cycloalkyl group, an aryl group or a monovalent heterocyclic group and these groups each optionally have a substituent.]

$R^{XX}$ is preferably an alkyl group, a cycloalkyl group or an aryl group, and these groups each optionally have a substituent.

The substituent which the group represented by $Ar^{Y1}$ optionally has is preferably an alkyl group, a cycloalkyl group or an aryl group, and these groups each optionally further have a substituent.

The constitutional unit represented by the formula (Y) includes, for example, constitutional units represented by the formulae (Y-1) to (Y-10), and from the standpoint of the luminance life of the light emitting device of the present invention preferable are constitutional units represented by the formulae (Y-1) to (Y-3), from the standpoint of electron transportability of the light emitting device of the present invention preferable are constitutional units represented by the formulae (Y-4) to (Y-7), and from the standpoint of hole transportability of the light emitting device of the present invention preferable are constitutional units represented by the formulae (Y-8) to (Y-10).

(Chemical Formula 52)

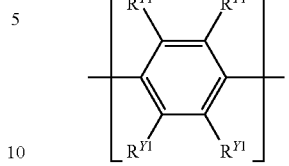

(Y-1)

[wherein, $R^{Y1}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y1}$ may be the same or different, and adjacent $R^{Y1}$s may be combined together to form a ring together with the carbon atoms to which they are attached.]

$R^{Y1}$ is preferably a hydrogen atom, an alkyl group, a cycloalkyl group or an aryl group, and these groups each optionally have a substituent.

It is preferable that the constitutional unit represented by the formula (Y-1) is a constitutional unit represented by the formula (Y-1').

(Chemical Formula 53)

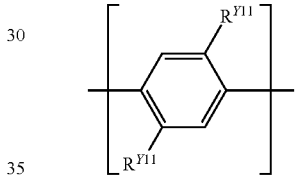

(Y-1')

[wherein, $R^{Y11}$ represents an alkyl group, a cycloalkyl group, an alkoxy group, a cycloalkoxy group, an aryl group or a monovalent heterocyclic group, and these groups each optionally have a substituent. The plurality of $R^{Y11}$ may be the same or different.]

$R^{Y11}$ is preferably an alkyl group, a cycloalkyl group or an aryl group, more preferably an alkyl group or a cycloalkyl group, and these groups each optionally have a substituent.

(Chemical Formula 54)

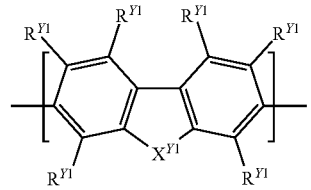

(Y-2)

[wherein, $R^{Y1}$ represents the same meaning as described above. $X^{Y1}$ represents a group represented by $-C(R^{Y2})_2-$, $-C(R^{Y2})=C(R^{Y2})-$ or $-C(R^{Y2})_2-C(R^{Y2})_2-$. $R^{Y2}$ represents a hydrogen atom, an alkyl group, a cycloalkyl group, an alkoxy group, a cycloalkoxy group, an aryl group or a monovalent heterocyclic group and these groups each optionally have a substituent. The plurality of $R^{Y2}$ may be the same or different, and these $R^{Y2}$s may be combined together to form a ring together with the carbon atoms to which they are attached.]

$R^{Y2}$ is preferably an alkyl group, a cycloalkyl group, an aryl group or a monovalent heterocyclic group, more preferably an alkyl group a cycloalkyl group or an aryl group, and these groups each optionally have a substituent.

Regarding the combination of two $R^{Y2}$s in the group represented by —C($R^{Y2}$)$_2$— in $X^{Y1}$, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, and these groups each optionally have a substituent. The two groups $R^{Y2}$ may be combined together to form a ring together with the atoms to which they are attached, and when the groups $R^{Y2}$ form a ring, the group represented by —C($R^{Y2}$)$_2$— is preferably a group represented by the formula (Y-A1) to (Y-A5), more preferably a group represented by the formula (Y-A4), and these groups each optionally have a substituent.

(Chemical Formula 55)

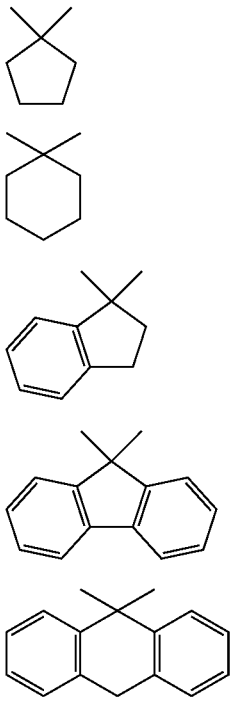

(Y-A1)

(Y-A2)

(Y-A3)

(Y-A4)

(Y-A5)

Regarding the combination of two $R^{Y2}$s in the group represented by —C($R^{Y2}$)=C($R^{Y2}$)— in $X^{Y1}$, it is preferable that the both are an alkyl group or cycloalkyl group, or one is an alkyl group or a cycloalkyl group and the other is an aryl group, and these groups each optionally have a substituent.

Four $R^{Y2}$s in the group represented by —C($R^{Y2}$)$_2$—C($R^{Y2}$)$_2$— in $X^{Y1}$ are preferably an alkyl group or a cycloalkyl group each optionally having a substituent. The plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to (Y-B5), more preferably a group represented by the formula (Y-B3), and these groups each optionally have a substituent.

(Chemical Formula 56)

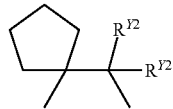

(Y-B1)

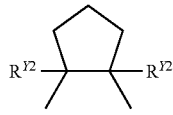

(Y-B2)

(Y-B3)

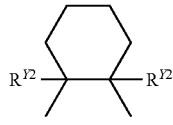

(Y-B4)

(Y-B5)

[wherein, $R^{Y2}$ represents the same meaning as described above.]

It is preferable that the constitutional unit represented by the formula (Y-2) is a constitutional unit represented by the formula (Y-2').

(Chemical Formula 57)

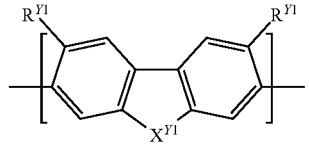

(Y-2')

[wherein, $R^{Y1}$ and $X^{Y1}$ represent the same meaning as described above.]

(Chemical Formula 58)

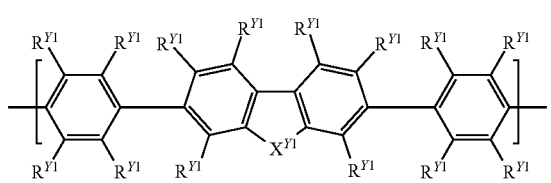

(Y-3)

[wherein, $R^{Y1}$ and $X^{Y1}$ represent the same meaning as described above.]

It is preferable that the constitutional unit represented by the formula (Y-3) is a constitutional unit represented by the formula (Y-3').

(Chemical Formula 59)

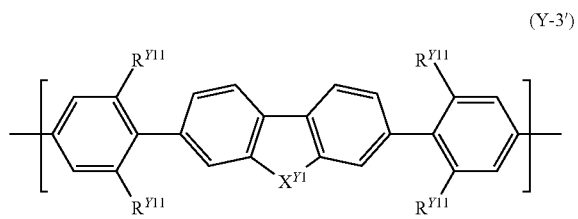
(Y-3')

[wherein, $R^{Y11}$ and $X^{Y1}$ represent the same meaning as described above.]

(Chemical Formula 60)

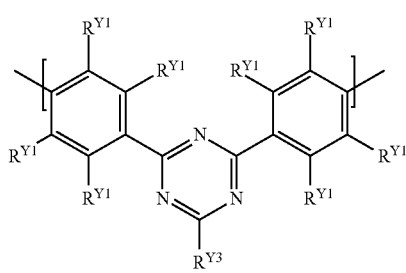
(Y-4)

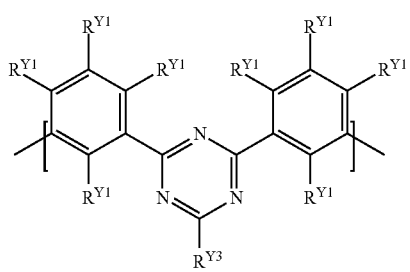
(Y-5)

(Chemical Formula 61)

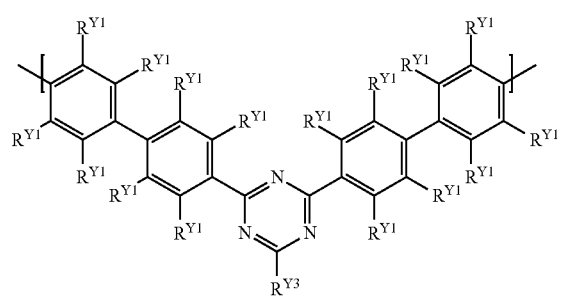
(Y-6)

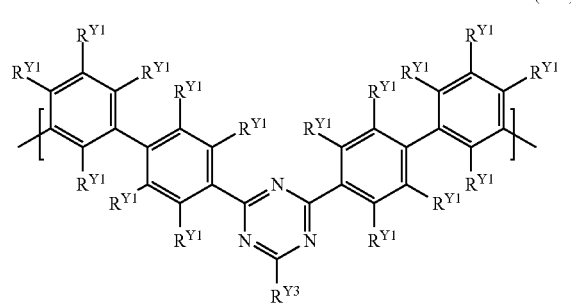
(Y-7)

[wherein, $R^{Y1}$ represents the same meaning as described above. $R^{Y3}$ represents a hydrogen atom, an alkyl group, a cycloalkyl group, an alkoxy group, a cycloalkoxy group, an aryl group or a monovalent heterocyclic group and these groups each optionally have a substituent.]

$R^{Y3}$ is preferably an alkyl group, a cycloalkyl group, an alkoxy group, a cycloalkoxy group, an aryl group or a monovalent heterocyclic group, more preferably an aryl group, and these groups each optionally have a substituent.

It is preferable that the constitutional unit represented by the formula (Y-4) is a constitutional unit represented by the formula (Y-4'), and it is preferable that the constitutional unit represented by the formula (Y-6) is a constitutional unit represented by the formula (Y-6').

(Chemical Formula 62)

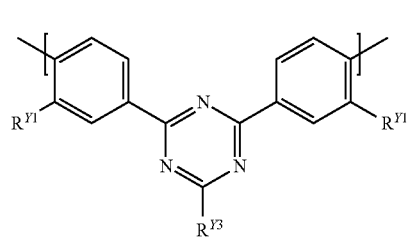
(Y-4')

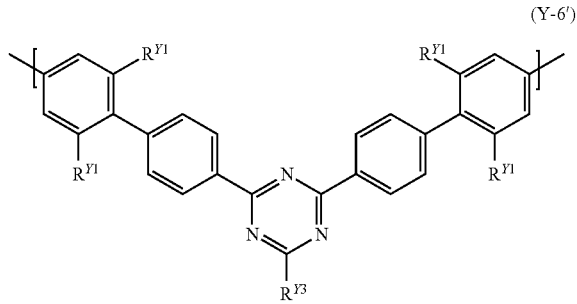
(Y-6')

[wherein, $R^{Y1}$ and $R^{Y3}$ represent the same meaning as described above.]

(Chemical Formula 63)

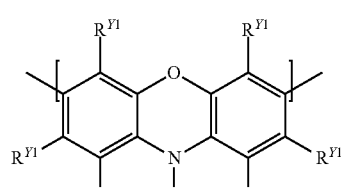
(Y-8)

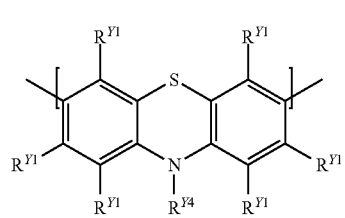
(Y-9)

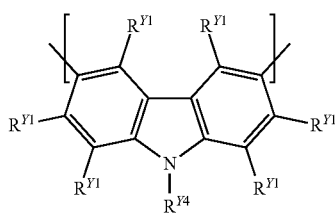

(Y-10)

[wherein, $R^{Y1}$ represents the same meaning as described above. $R^{Y4}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and these groups each optionally have a substituent.

The constitutional unit represented by the formula (Y) includes, for example, a constitutional unit composed of an arylene group represented by the formula (Y-101) to the formula (Y-121), a constitutional unit composed of a divalent heterocyclic group represented by the formula (Y-201) to the formula (Y-207), and a constitutional unit composed of a divalent group in which at least one arylene group and at least one divalent heterocyclic group are bonded directly to each other represented by the formula (Y-301) to the formula (Y-304), and is preferably a constitutional unit composed of an arylene group represented by the formula (Y-101) to the formula (Y-121), a constitutional unit composed of a divalent heterocyclic group represented by the formula (Y-201) to the formula (Y-206), or a constitutional unit composed of a divalent group in which at least one arylene group and at least one divalent heterocyclic group are bonded directly to each other represented by the formula (Y-301) to the formula (Y-304).

(Chemical Formula 64)

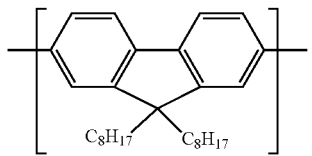

(Y-101)

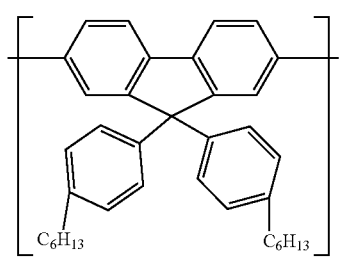

(Y-102)

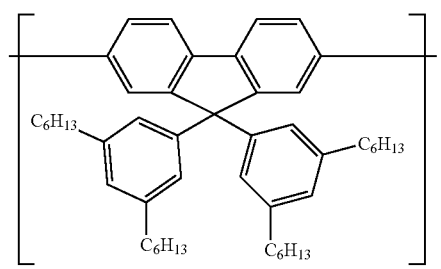

(Y-103)

(Chemical Formula 65)

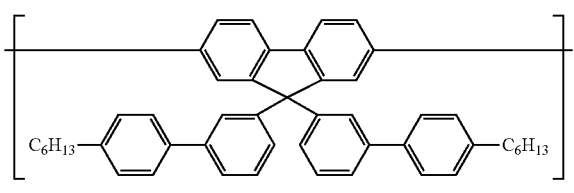

(Y-104)

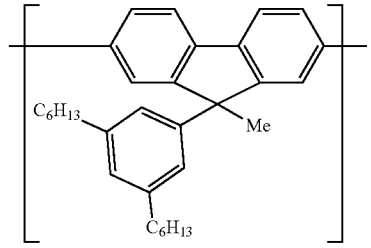

(Y-105)

(Chemical Formula 66)

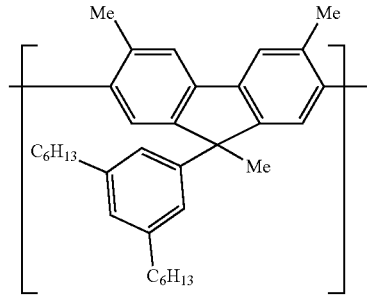

(Y-106)

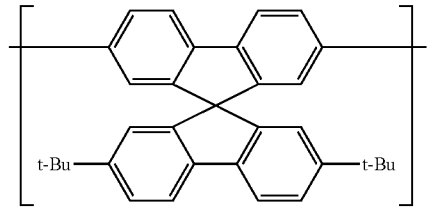

(Y-107)

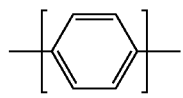

(Y-108)

(Y-109)

(Chemical Formula 67)
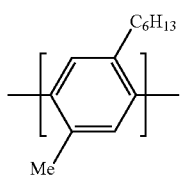
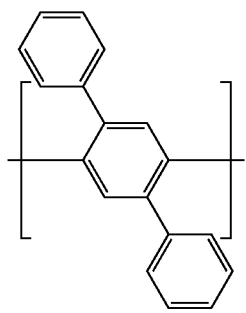
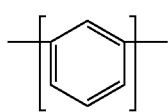
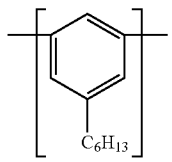
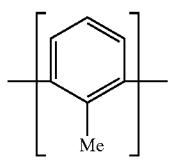
(Chemical Formula 68)
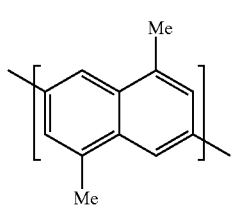
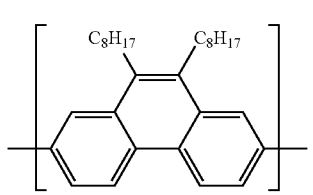
(Y-110)
(Y-111)
(Y-112)
(Y-113)
(Y-114)
(Y-115)
(Y-116)
(Y-117)
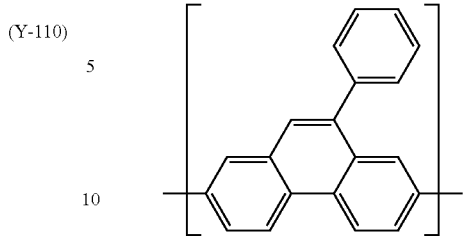
(Y-118)
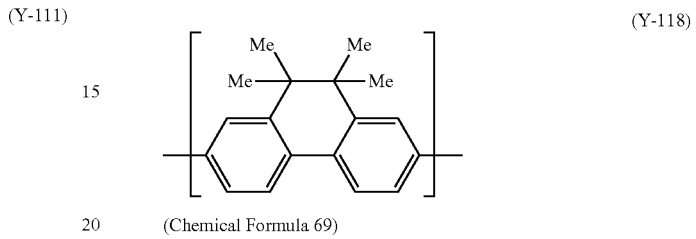
(Chemical Formula 69)
(Y-119)
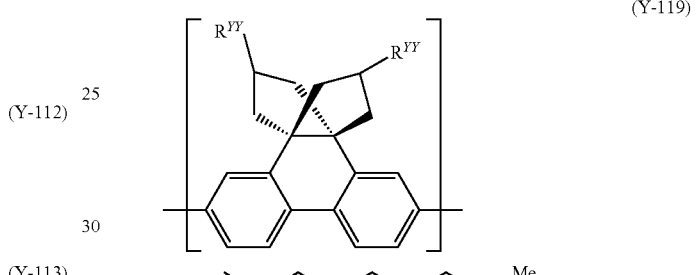
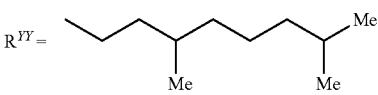
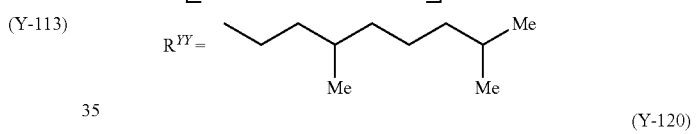
(Y-120)
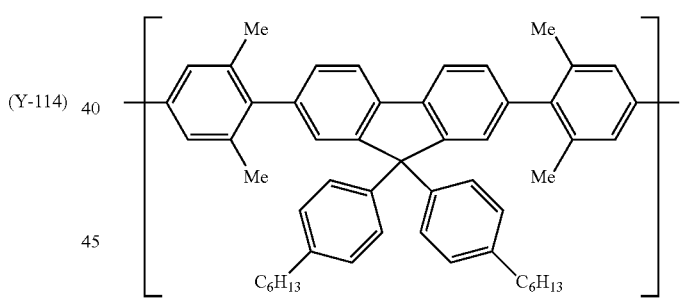
(Y-121)
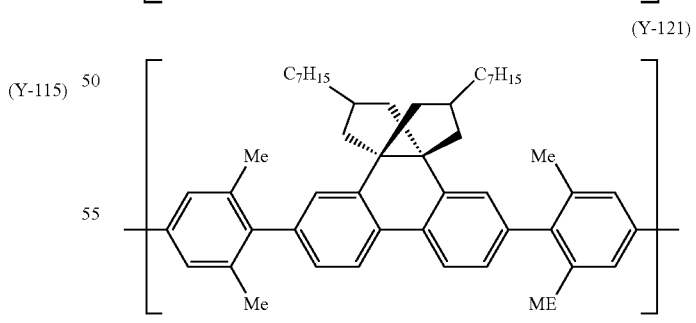
(Chemical Formula 70)
(Y-201)
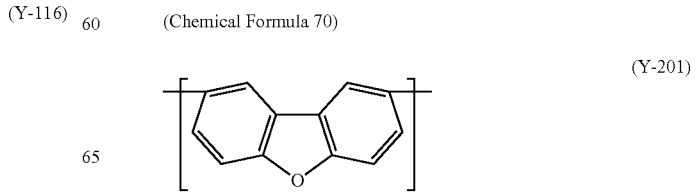

-continued
(Y-202)
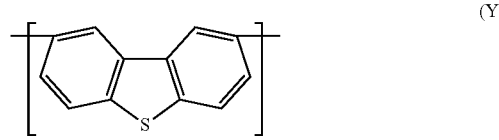
(Y-203)
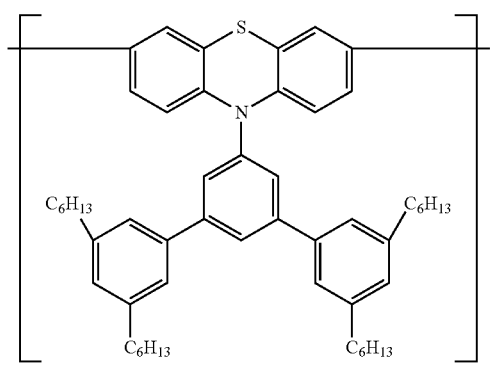
(Y-204)
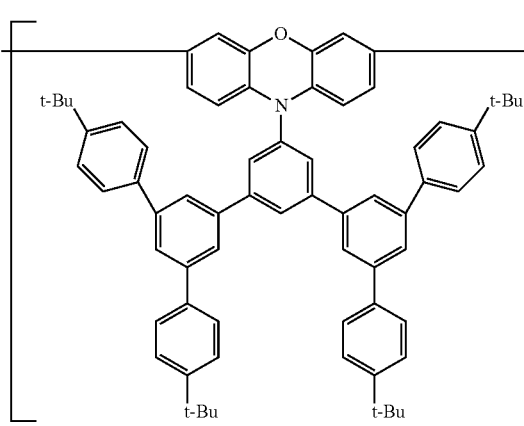
(Chemical Formula 71)
(Y-205)
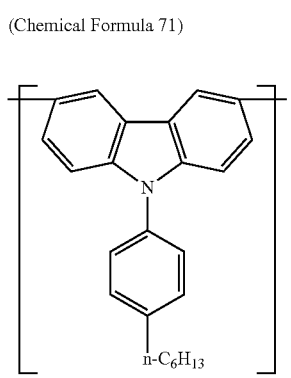
-continued
(Y-206)
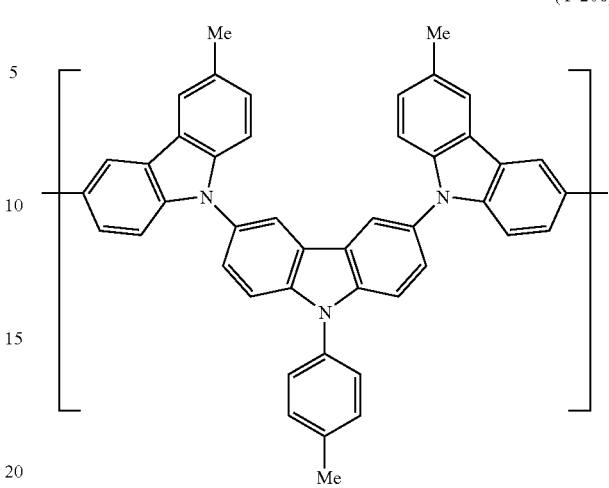
(Y-207)
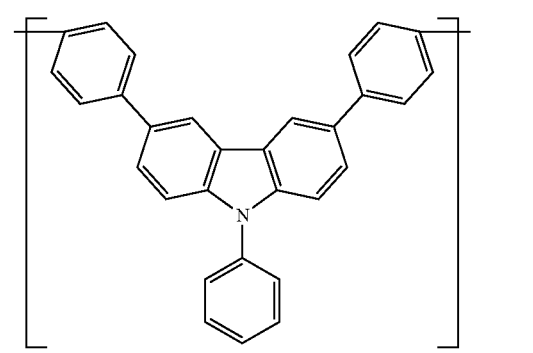
(Chemical Formula 72)
(Y-301)
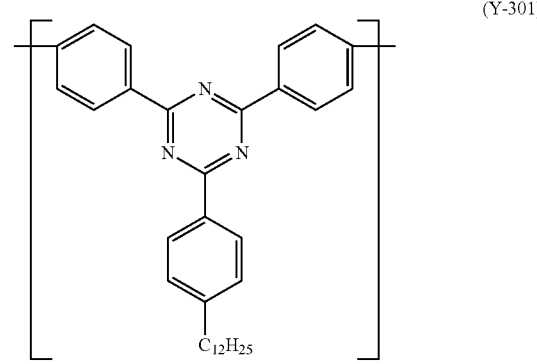
(Y-302)
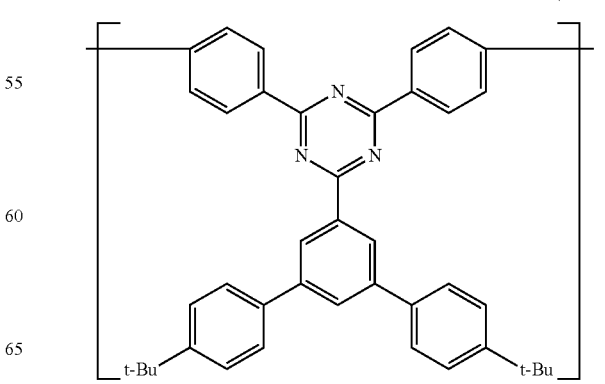

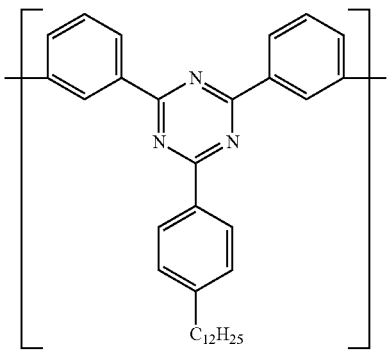
(Y-303)

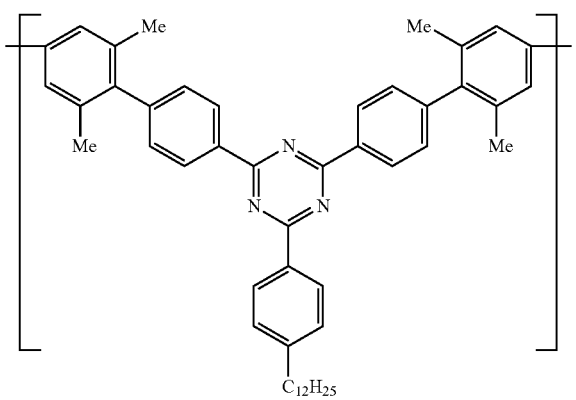
(Y-304)

The amount of the constitutional unit represented by the formula (Y) in which Ar$^{Y1}$ is an arylene group is preferably 0.5 to 90 mol %, more preferably 30 to 80 mol % with respect to the total amount of constitutional units contained in the polymer host, because the luminance life of the light emitting device of the present invention is excellent.

The amount of the constitutional unit represented by the formula (Y) in which Ar$^{Y1}$ is a divalent heterocyclic group or a divalent group in which at least one arylene group and at least one divalent heterocyclic group are bonded directly to each other is preferably 0.5 to 40 mol %, more preferably 3 to 30 mol % with respect to the total amount of constitutional units contained in a polymer compound, because the charge transportability of the light emitting device of the present invention is excellent.

The constitutional unit represented by the formula (Y) may be contained only singly or two or more units thereof may be contained in the polymer host.

It is preferable that the polymer host further comprises a constitutional unit represented by the following formula (X), because hole transportability is excellent.

(Chemical Formula 73)

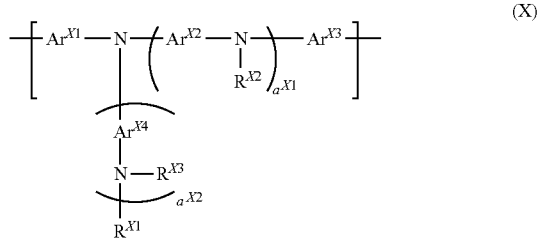
(X)

[wherein,
a$^{X1}$ and a$^{X2}$ each independently represent an integer of 0 or more.

Ar$^{X1}$ and Ar$^{X3}$ each independently represent an arylene group or a divalent heterocyclic group, and these groups each optionally have a substituent.

Ar$^{X2}$ and Ar$^{X4}$ each independently represent an arylene group, a divalent heterocyclic group or a divalent group in which at least one arylene group and at least one divalent heterocyclic group are bonded directly to each other, and these groups each optionally have a substituent. When a plurality of Ar$^{X2}$ and Ar$^{X4}$ are present, they may be the same or different at each occurrence.

R$^{X1}$, R$^{X2}$ and R$^{X3}$ each independently represent a hydrogen atom, an alkyl group, a cycloalkyl group, an aryl group or a monovalent heterocyclic group, and these groups each optionally have a substituent. When a plurality of R$^{X2}$ and R$^{X3}$ are present, they may be the same or different at each occurrence.]

a$^{X1}$ is preferably 2 or less, more preferably 1, because the luminance life of the light emitting device of the present invention is excellent.

a$^{X2}$ is preferably 2 or less, more preferably 0, because the luminance life of the light emitting device of the present invention is excellent.

R$^{X1}$, R$^{X2}$ and R$^{X3}$ are preferably an alkyl group, a cycloalkyl group, an aryl group or a monovalent heterocyclic group, more preferably an aryl group, and these groups each optionally have a substituent.

The arylene group represented by Ar$^{X1}$ and Ar$^{X3}$ is more preferably a group represented by the formula (A-1) or the formula (A-9), further preferably a group represented by the formula (A-1), and these groups each optionally have a substituent.

The divalent heterocyclic group represented by Ar$^{X1}$ and Ar$^{X3}$ is more preferably a group represented by the formula (AA-1), the formula (AA-2) or the formula (AA-7) to (AA-26), and these groups each optionally have a substituent.

Ar$^{X1}$ and Ar$^{X3}$ are preferably an arylene group optionally having a substituent.

The arylene group represented by Ar$^{X2}$ and Ar$^{X4}$ is more preferably a group represented by the formula (A-1), the formula (A-6), the formula (A-7), the formula (A-9) to (A-11) or the formula (A-19), and these groups each optionally have a substituent.

The more preferable range of the divalent heterocyclic group represented by Ar$^{X2}$ and Ar$^{X4}$ is the same as the more preferable range of the divalent heterocyclic group represented by Ar$^{X1}$ and Ar$^{X3}$.

The more preferable range and the further preferable range of the arylene group and the divalent heterocyclic group in the divalent group in which at least one arylene group and at least one divalent heterocyclic group are bonded directly to each other represented by Ar$^{X2}$ and Ar$^{X4}$ are the same as the more preferable range and the further preferable range of the arylene group and the divalent heterocyclic group represented by Ar$^{X1}$ and Ar$^{X3}$, respectively.

The divalent group in which at least one arylene group and at least one divalent heterocyclic group are bonded directly to each other represented by Ar$^{X2}$ and Ar$^{X4}$ includes the same groups as the divalent group in which at least one arylene group and at least one divalent heterocyclic group are bonded directly to each other represented by Ar$^{Y1}$ in the formula (Y).

$Ar^{X2}$ and $Ar^{X4}$ are preferably an arylene group optionally having a substituent.

The substituent which the group represented by $Ar^{X1}$ to $Ar^{X4}$ and $R^{X1}$ to $R^{X3}$ optionally has is preferably an alkyl group, a cycloalkyl group or an aryl group, and these groups each optionally further have a substituent.

The constitutional unit represented by the formula (X) is preferably a constitutional unit represented by the formula (X-1) to (X-7), more preferably a constitutional unit represented by the formula (X-1) to (X-6), further preferably a constitutional unit represented by the formula (X-3) to (X-6).

(Chemical Formula 74)

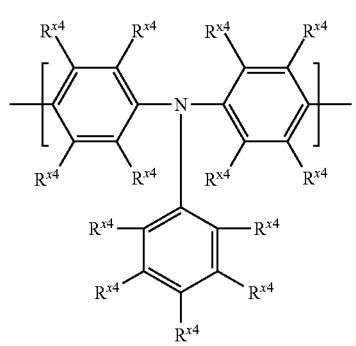

(X-1)

(Chemical Formula 75)

(X-2)

(X-3)

(Chemical Formula 76)

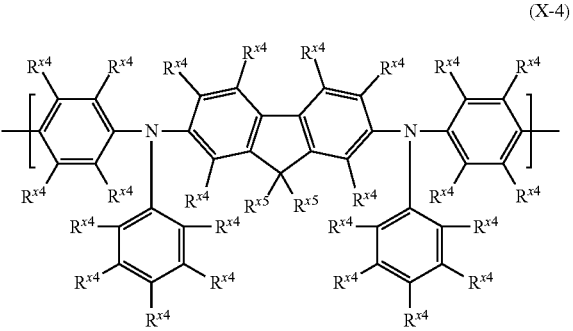

(X-4)

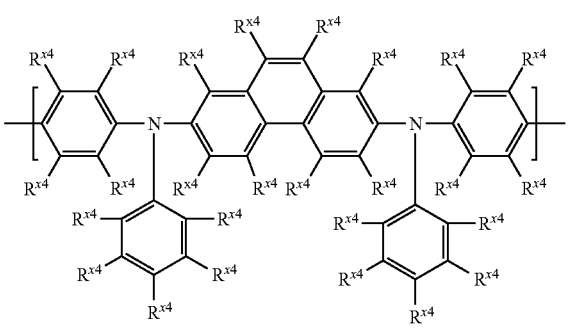

(X-5)

(Chemical Formula 77)

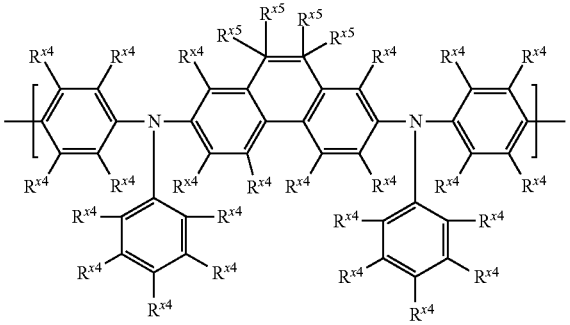

(X-6)

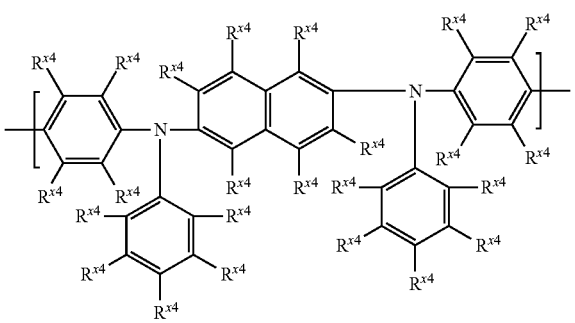

(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and these groups each optionally have a substituent. The plurality of $R^{X4}$ may be the same or different. The plurality of $R^{X5}$ may be the same or different, and adjacent groups $R^{x5}$ may be combined together to form a ring together with the carbon atoms to which they are attached.]

The amount of the constitutional unit represented by the formula (X) is preferably 0.1 to 50 mol %, more preferably 1 to 40 mol %, further preferably 5 to 30 mol % with respect to the total amount of constitutional units contained in a polymer host, because hole transportability is excellent.

The constitutional unit represented by the formula (X) includes, for example, constitutional units represented by the formulae (X1-1) to (X1-11), preferably constitutional units represented by the formulae (X1-3) to (X1-10).

(Chemical Formula 78)

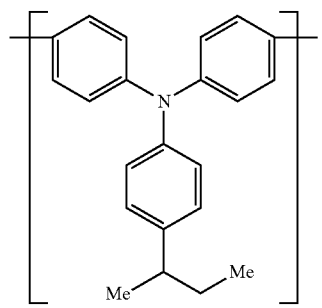
(X1-1)

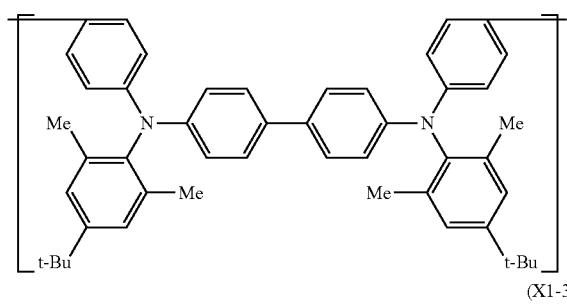
(X1-2)

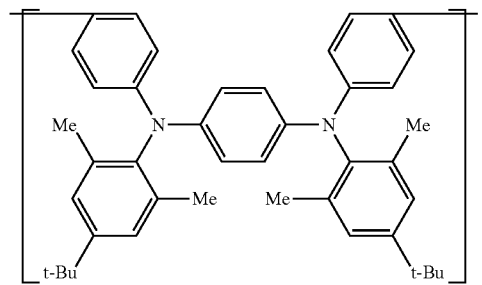
(X1-3)

(Chemical Formula 79)

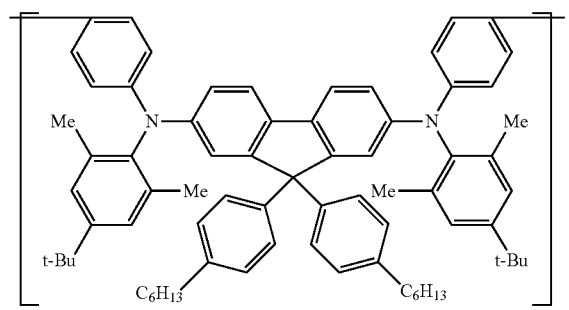
(X1-4)

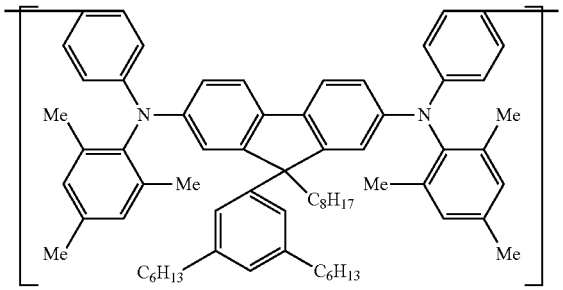
(X1-5)

(Chemical Formula 80)

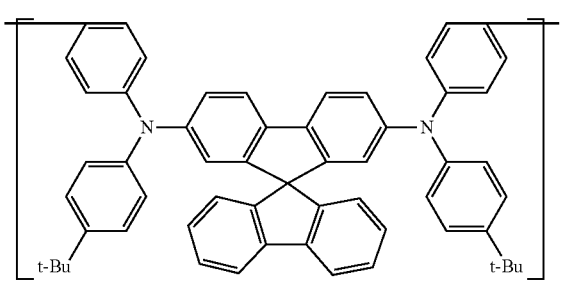
(X1-6)

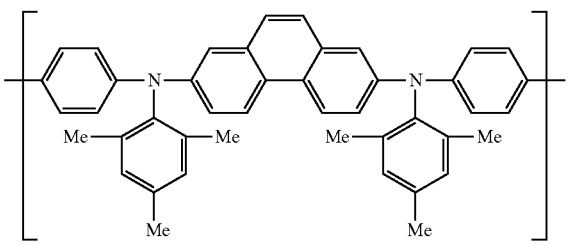
(X1-7)

(Chemical Formula 81)

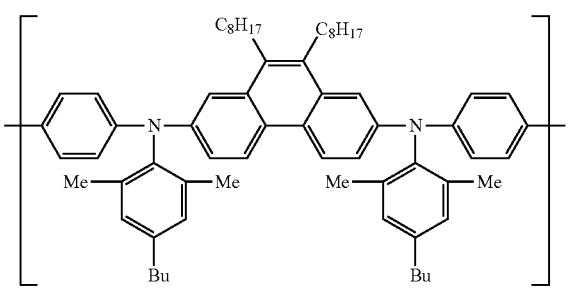
(X1-8)

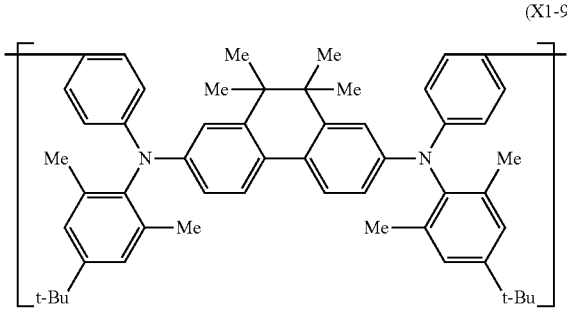
(X1-9)

-continued (Chemical Formula 82)

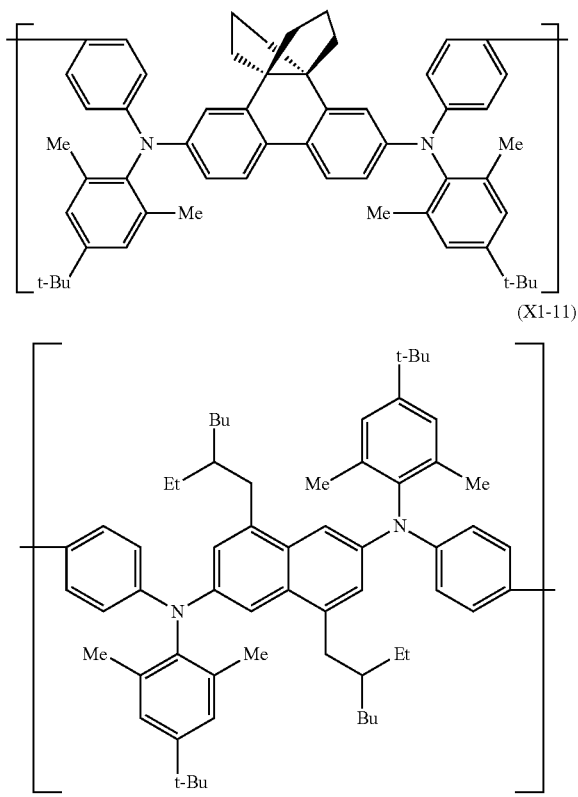

The constitutional unit represented by the formula (X) may be contained only singly or two or more units thereof may be contained in the polymer host.

Examples of the polymer host include polymer compounds (P-1) to (P-6) in the Table 1.

TABLE 1

| | constitutional unit and mole fraction thereof | | | | |
|---|---|---|---|---|---|
| | formula (Y) | | | formula (X) | |
| polymer compound | formulae (Y-1) to (Y-3) p | formulae (Y-4) to (Y-7) q | formulae (Y-8) to (Y-10) r | formulae (X-1) to (X-7) s | other t |
| (P-1) | 0.1 to 99.9 | 0.1 to 99.9 | 0 | 0 | 0 to 30 |
| (P-2) | 0.1 to 99.9 | 0 | 0.1 to 99.9 | 0 | 0 to 30 |
| (P-3) | 0.1 to 99.8 | 0.1 to 99.8 | 0 | 0.1 to 99.8 | 0 to 30 |
| (P-4) | 0.1 to 99.8 | 0.1 to 99.8 | 0.1 to 99.8 | 0 | 0 to 30 |
| (P-5) | 0.1 to 99.8 | 0 | 0.1 to 99.8 | 0.1 to 99.8 | 0 to 30 |
| (P-6) | 0.1 to 99.7 | 0.1 to 99.7 | 0.1 to 99.7 | 0.1 to 99.7 | 0 to 30 |

[In the table, p, q, r, s and t represent the mole fraction of each constitutional unit. p+q+r+s+t=100, and 100≥p+q+r+s≥70. Other constitutional unit denotes a constitutional unit other than the constitutional unit represented by the formula (Y) and the constitutional unit represented by the formula (X).]

The polymer host may be any of a block copolymer, a random copolymer, an alternating copolymer or a graft copolymer, and may also be another embodiment, and is preferably a copolymer produced by copolymerizing a plurality of raw material monomers.

[Production Method of Polymer Host]

The polymer host can be produced by using a known polymerization method described in Chem. Rev., vol. 109, pp. 897-1091 (2009) and the like, exemplified are methods of causing polymerization by a coupling reaction using a transition metal catalyst such as the Suzuki reaction, the Yamamoto reaction, the Buchwald reaction, the Stille reaction, the Negishi reaction and the Kumada reaction.

In the above-described polymerization method, the method of charging monomers includes, for example, a method in which the total amount of monomers is charged in a lump into the reaction system, a method in which monomers are partially charged and reacted, then, the remaining monomers are charged in a lump, continuously or in divided doses, and a method in which monomers are charged continuously or in divided doses.

The transition metal catalyst includes a palladium catalyst, a nicked catalyst and the like.

For the post treatment of the polymerization reaction, known methods, for example, a method of removing water-soluble impurities by liquid-separation, a method in which the reaction solution after the polymerization reaction is added to a lower alcohol such as methanol to cause deposition of a precipitate which is then filtrated before drying, and other methods, are used each singly or combined. When the purity of the polymer host is low, the polymer host can be purified by usual methods such as, for example, recrystallization, reprecipitation, continuous extraction with a Soxhlet extractor and column chromatography.

[First Composition]

The first organic layer may be a layer comprising a composition comprising one or more phosphorescent compounds and at least one material selected from the group consisting of the host material described above, a hole transporting material, a hole injection material, an electron transporting material, an electron injection material, a fluorescent material and an antioxidant (hereinafter, referred to also as "first composition").

[Hole Transporting Material]

The hole transporting material is classified into low molecular weight compounds and polymer compounds, and polymer compounds are preferable. The hole transporting material optionally has a crosslinkable group.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene, trinitrofluorenone and the like, preferably fullerene.

In the first composition, the compounding amount of the hole transporting material is usually 1 to 400 parts by weight, preferably 5 to 150 parts by weight when the content of the phosphorescent material is 100 parts by weight.

The hole transporting material may be used singly, or two or more hole transporting materials may be used in combination.

[Electron Transporting Material]

The electron transporting material is classified into low molecular weight compounds and polymer compounds. The electron transporting material optionally has a crosslinkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the first composition, the compounding amount of the electron transporting material is usually 1 to 400 parts by weight, preferably 5 to 150 parts by weight when the content of the phosphorescent material is 100 parts by weight.

The electron transporting material may be used singly, or two or more electron transporting materials may be used in combination.

[Hole Injection Material and Electron Injection Material]

The hole injection material and the electron injection material are each classified into low molecular weight compounds and polymer compounds. The hole injection material and the electron injection material each optionally have a crosslinkable group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising an aromatic amine structure in the main chain or side chain.

In the first composition, the compounding amounts of the hole injection material and the electron injection material are each usually 1 to 400 parts by weight, preferably 5 to 150 parts by weight when the content of the phosphorescent material is 100 parts by weight.

The hole injection material and the electron injection material may each be used singly, or two or more of them may be used in combination.

[Ion Dope]

When the hole injection material or the electron injection material comprises an electrically conductive polymer, the electric conductivity of the electrically conductive polymer is preferably $1 \times 10^{-5}$ S/cm to $1 \times 10^3$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly, or two or more ions to be doped may be used.

[Fluorescent Material]

The fluorescent material is classified into low molecular weight compounds and polymer compounds. The fluorescent material optionally has a crosslinkable group.

The low molecular weight compound includes, for example, naphthalene and derivatives thereof, anthracene and derivatives thereof, and perylene and derivatives thereof.

The polymer compound includes, for example, polymer compounds comprising a phenylene group, a naphthalenediyl group, an anthracenediyl group, a fluorenediyl group, a phenanthrenediyl group, dihydrophenanthrenediyl group, a group represented by the formula (X), a carbazolediyl group, a phenoxazinediyl group, a phenothiazinediyl group, a pyrenediyl group and the like.

In the first composition, the compounding amount of the fluorescent material is usually 1 to 400 parts by weight, preferably 5 to 150 parts by weight when the content of the phosphorescent material is 100 parts by weight.

The fluorescent material may be used singly, or two or more light emitting materials may be used in combination.

[Antioxidant]

The antioxidant may advantageously be one which is soluble in the same solvent as for a phosphorescent compound and does not disturb light emission and charge transportation, and the examples thereof include phenol-based antioxidants and phosphorus-based antioxidants.

In the first composition, the compounding amount of the antioxidant is usually 0.001 to 10 parts by weight when the content of the phosphorescent material is 100 parts by weight.

The antioxidant may be used singly, or two or more antioxidants may be used in combination.

[First Ink]

The first composition comprising at least one phosphorescent compound and a solvent (hereinafter, referred to also as "first ink") can be suitably used for application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method and a nozzle coat method.

The viscosity of the first ink may be adjusted depending on the kind of the application method, and is preferably 1 to 20 mPa·s at 25° C. when applied to a printing method in which a solution passes through a discharge apparatus such as an inkjet printing method, because clogging and curved flying hardly occur in discharging.

The solvent contained in the first ink is preferably a solvent which is capable of dissolving or uniformly dispersing solid components in the ink. The solvent includes, for example, chlorine-based solvents such as 1,2-dichloroethane, 1,1,2-trichloroethane, chlorobenzene and o-dichlorobenzene; ether solvents such as tetrahydrofuran, dioxane, anisole and 4-methylanisole; aromatic hydrocarbon solvents such as toluene, xylene, mesitylene, ethylbenzene, n-hexylbenzene and cyclohexylbenzene; aliphatic hydrocarbon solvents such as cyclohexane, methylcyclohexane, n-pentane, n-hexane, n-heptane, n-octane, n-nonane, n-decane, n-dodecane and bicyclohexyl; ketone solvents such as acetone, methyl ethyl ketone, cyclohexanone and acetophenone; ester solvents such as ethyl acetate, butyl acetate, ethylcellosolve acetate, methyl benzoate and phenyl acetate; polyhydric alcohol solvents such as ethylene glycol, glycerin and 1,2-hexanediol; alcohol solvents such as isopropyl alcohol and cyclohexanol; sulfoxide solvents such as dimethyl sulfoxide; and amide solvents such as N-methyl-2-pyrrolidone and N,N-dimethylformamide. The solvent may be used singly or two or more of the solvents may be used in combination.

In the first ink, the blending amount of the solvent is usually 1000 to 100000 parts by weight, preferably 2000 to 20000 parts by weight, when the amount of the phosphorescent material is 100 parts by weight.

<Second Organic Layer>

The second organic layer is a layer comprising a phosphorescent material and a crosslinked body of a crosslinkable material.

[Phosphorescent Compound]

The second organic layer comprises a phosphorescent material. The first organic layer described above comprises a phosphorescent material. At least one phosphorescent compound contained in the second organic layer and at least one phosphorescent compound contained in the first organic layer are the same phosphorescent compound represented by the formula (1).

The definition and examples of the phosphorescent compound represented by the formula (1) contained in the second organic layer are the same as the definition and examples of the phosphorescent compound represented by the formula (1) contained in the first organic layer.

The at least one phosphorescent compound contained in the second organic layer is a phosphorescent compound represented by the formula (1) (a phosphorescent compound which is the same as the at least one phosphorescent compound contained in the first organic layer), and the second organic layer may also be a layer comprising a phosphorescent compound represented by the formula (1) and another phosphorescent compound. The examples of the other phosphorescent compound contained in the second organic layer are the same as the examples of the other phosphorescent compound contained in the first organic layer.

[Crosslinked Body of Crosslinkable Material]

The crosslinkable material is a compound represented by the formula (3).

$m^{B1}$ is usually an integer of 0 to 10, and it is preferably an integer of 0 to 5, more preferably an integer of 0 to 2, further preferably 0 or 1, particularly preferably 0, because synthesis of the crosslinkable material is easy.

$m^{B2}$ is usually an integer of 0 to 10, and it is preferably an integer of 0 to 5, more preferably an integer of 0 to 3, further preferably 1 or 2, particularly preferably 1, because synthesis of the crosslinkable material is easy and the light emitting device of the present invention is more excellent in luminance life.

$m^{B3}$ is usually an integer of 0 to 5, and it is preferably an integer of 0 to 4, more preferably an integer of 0 to 2, further preferably 0, because synthesis of the crosslinkable material is easy.

The definition and examples of the arylene group portion excluding $m^{B3}$ substituents of the aromatic hydrocarbon group represented by $Ar^7$ are the same as the definition and examples of the arylene group represented by $Ar^{X2}$ in the formula (X).

The definition and examples of the divalent heterocyclic group portion excluding $m^{B3}$ substituents of the heterocyclic group represented by $Ar^7$ are the same as the definition and examples of the divalent heterocyclic group portion represented by $Ar^{X2}$ in the formula (X).

The definition and examples of the divalent group excluding $m^{B3}$ substituents of the group in which at least one aromatic hydrocarbon ring and at least one heterocyclic ring are bonded directly to each other represented by $Ar^7$ are the same as the definition and examples of the divalent group in which at least one arylene group and at least one divalent heterocyclic group are bonded directly to each other represented by $Ar^{X2}$ in the formula (X).

The definition and examples of the substituent which the group represented by $Ar^7$ optionally has are the same as the definition and examples of the substituent which the group represented by $Ar^{X2}$ optionally has in the formula (X).

$Ar^7$ is preferably an aromatic hydrocarbon group, because the light emitting device of the present invention is excellent in luminance life, and this aromatic hydrocarbon group optionally has a substituent.

The alkylene group represented by $L^{B1}$ is usually 1 to 20, preferably 1 to 15, more preferably 1 to 10, not including the number of carbon atoms of a substituent. The number of carbon atoms of the cycloalkylene group represented by $L^{B1}$ is usually 3 to 20, not including the number of carbon atoms of a substituent.

The alkylene group and the cycloalkylene group optionally have a substituent, and examples thereof include a methylene group, an ethylene group, a propylene group, a butylene group, a hexylene group, a cyclohexylene group and an octylene group.

The alkylene group and the cycloalkylene group represented by $L^{B1}$ optionally have a substituent. The substituent which the alkylene group and the cycloalkylene group optionally have includes, for example, an alkyl group, a cycloalkyl group, an alkoxy group, a cycloalkoxy group, a halogen atom and a cyano group.

The arylene group represented by $L^{B1}$ optionally has a substituent. The arylene group is preferably a phenylene group or a fluorenediyl group, more preferably a m-phenylene group, a p-phenylene group, a fluorene-2,7-diyl group or a fluorene-9,9-diyl group.

The substituent which the arylene group optionally has includes, for example, an alkyl group, a cycloalkyl group, an alkoxy group, a cycloalkoxy group, an aryl group, an aryloxy group, a monovalent heterocyclic group, a halogen atom, a cyano group and a crosslinkable group selected from Group A of crosslinkable group.

The definition and examples of the divalent heterocyclic group represented by $L^{B1}$ are the same as the definition and examples of the divalent heterocyclic group represented by $Ar^{X2}$ in the formula (X) described above.

$L^{B1}$ is preferably an alkylene group, an arylene group or an oxygen atom, more preferably an alkylene group or an arylene group, further preferably a phenylene group, a fluorenediyl group or an alkylene group, particularly preferably a phenylene group or an alkylene group, because synthesis of the crosslinkable material is easy, and these groups each optionally have a substituent.

X" is preferably a crosslinkable group represented by any of the formula (XL-1) to the formula (XL-17), an aryl group or a monovalent heterocyclic group, more preferably a crosslinkable group represented by the formula (XL-1), the formula (XL-3), the formula (XL-7) to the formula (XL-10), the formula (XL-16) or the formula (XL-17), or an aryl group, further preferably a crosslinkable group represented by the formula (XL-1), the formula (XL-16) or the formula (XL-17), a phenyl group, a naphthyl group or a fluorenyl group, particularly preferably a crosslinkable group represented by the formula (XL-16) or the formula (XL-17), a phenyl group or a naphthyl group, especially preferably a crosslinkable group represented by the formula (XL-16) or a naphthyl group, and the these groups each optionally have a substituent, from the standpoint of the luminance life of the light emitting device of the present invention.

X" is preferably a crosslinkable group represented by the formula (XL-1) to the formula (XL-9) or the formula (XL-11) to the formula (XL-16), an aryl group or a monovalent heterocyclic group, more preferably a crosslinkable group represented by the formula (XL-1), the formula (XL-3), the formula (XL-7) to the formula (XL-9) or the formula (XL-16) or an aryl group, further preferably a crosslinkable group represented by the formula (XL-1) or the formula (XL-16), a phenyl group, a naphthyl group or a fluorenyl group, particularly preferably a crosslinkable group represented by the formula (XL-16) or a naphthyl group, and these groups each optionally have a substituent, from the standpoint of balance between the luminance life of the light emitting device of the present invention and the crosslinkability of a compound represented by the formula (3).

The crosslinkable material includes, for example, low molecular weight compounds represented by the formula (3-1) to the formula (3-16), preferably low molecular weight compounds represented by the formula (3-1) to the formula (3-10), more preferably low molecular weight compounds represented by the formula (3-5) to the formula (3-9).

(Chemical Formula 83)

(3-1)
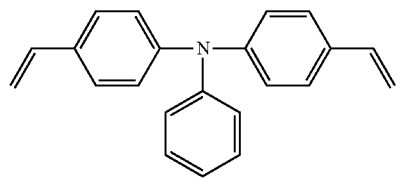

(3-2)
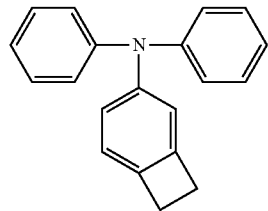

(3-3)
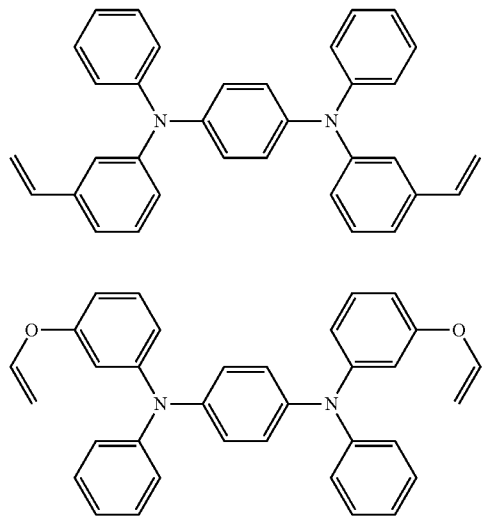

(3-4)
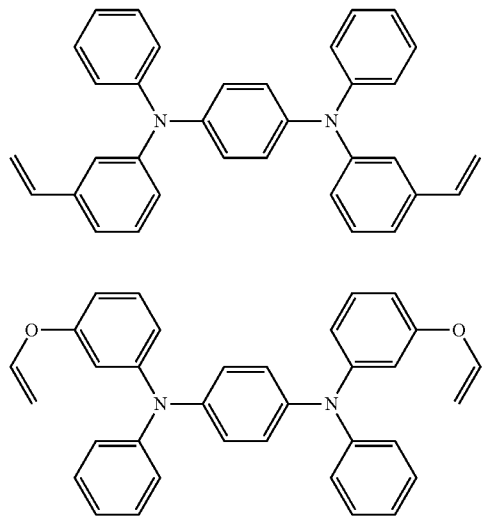

(Chemical Formula 84)

(3-5)
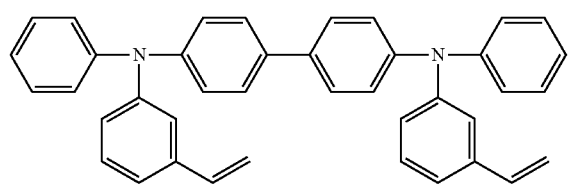

(3-6)
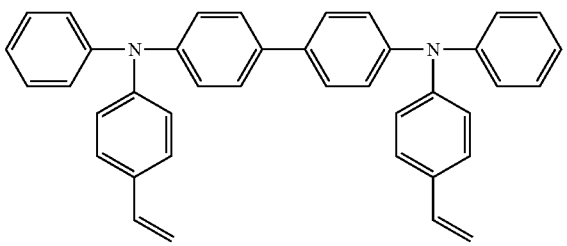

(3-7)
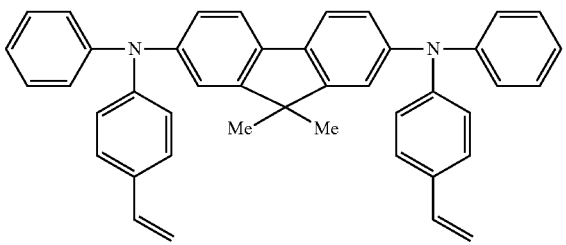

(Chemical Formula 85)

(3-8)
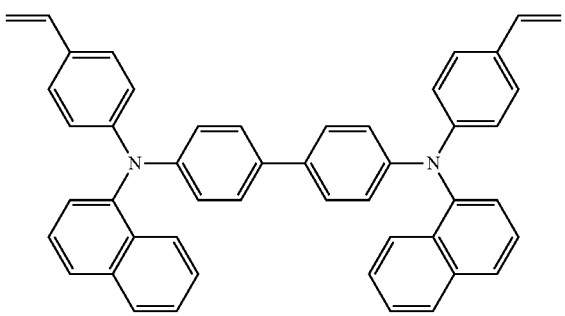

(3-9)
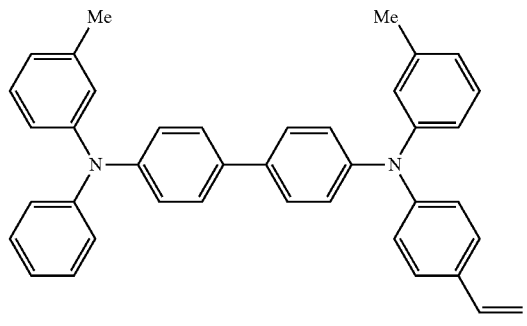

(3-10)
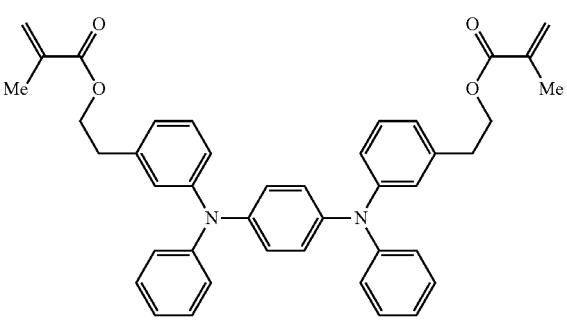

(Chemical Formula 86)

(3-11)

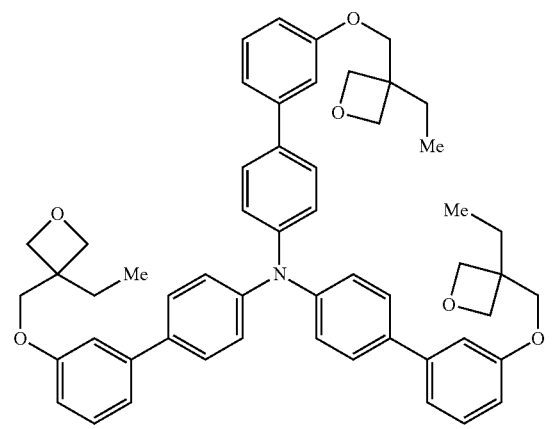

(3-12)

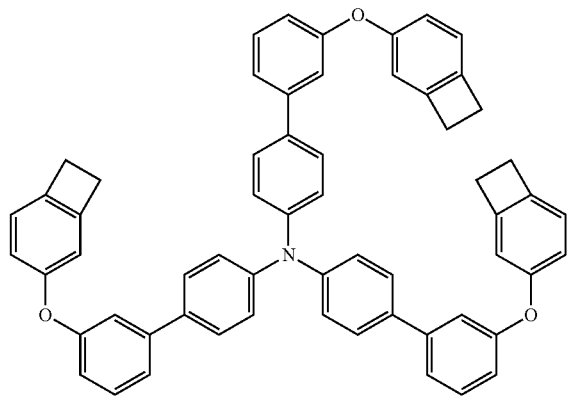

(3-13)

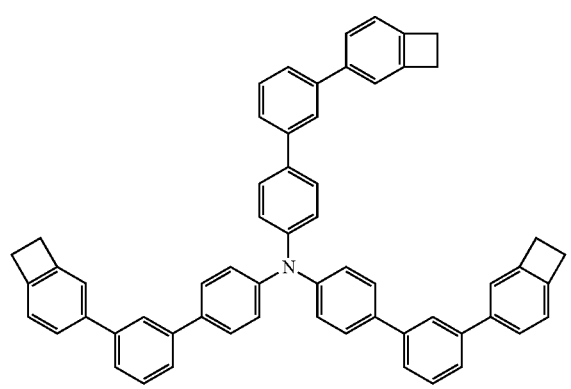

(Chemical Formula 87)

(3-14)

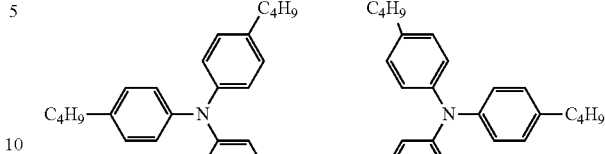

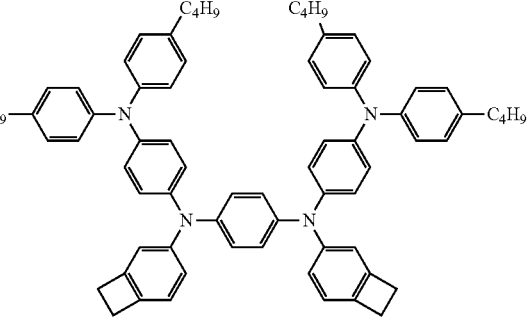

(3-15)

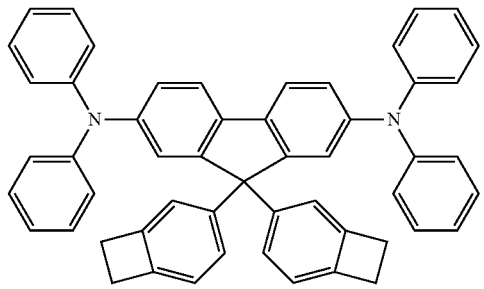

(3-16)

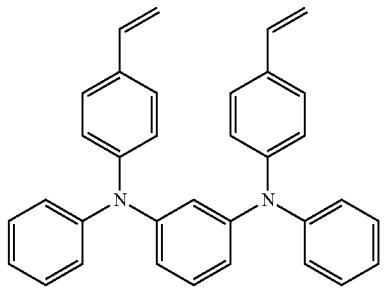

The crosslinkable material is available from Aldrich, Luminescence Technology Corp., American Dye Source and the like. Additionally, the crosslinkable material can be synthesized, for example, according to methods described in International Publication WO1997/033193, International Publication WO2005/035221 and International Publication WO2005/049548.

The crosslinked body of a crosslinkable material is obtained by converting these crosslinkable materials into crosslinked state according to the above-described crosslinking methods, conditions and the like.

[Composition Ratio and the Like]

The content of the phosphorescent material contained in the second organic layer is usually 0.1 to 80 parts by weight, preferably 0.5 to 60 parts by weight, more preferably 1 to 40 parts by weight, further preferably 5 to 30 parts by weight, when the sum of the phosphorescent material and the crosslinkable material is 100 parts by weight.

[Second Composition]

The second organic layer may also be a layer comprising a composition (hereinafter, referred to also as "second composition") comprising at least one phosphorescent compound, a crosslinked body of a crosslinkable material, and at least one material selected from the group consisting of a hole transporting material, a hole injection material, an electron transporting material, an electron injection material, a fluorescent material and an antioxidant.

The preferable range and examples of the hole transporting material, the electron transporting material, the hole injection material, the electron injection material and the fluorescent material contained in the second composition are the same as the preferable range and examples of the hole transporting material, the electron transporting material, the hole injection material, the electron injection material and the fluorescent material contained in the first composition. In the second composition, the blending amount of each of the hole transporting material, the electron transporting material, the hole injection material, the electron injection material and the fluorescent material is usually 1 to 400 parts by weight, preferably 5 to 150 parts by weight, when the sum of the phosphorescent material and the crosslinked body of the crosslinkable material is 100 parts by weight.

The preferable range and examples of the antioxidant contained in the second composition are the same as the preferable range and examples of the antioxidant contained in the first composition. In the second composition, the blending amount of the antioxidant is usually 0.001 to 10 parts by weight, when the sum of the phosphorescent material and the crosslinked body of the crosslinkable material is 100 parts by weight.

[Second Ink]

The second composition comprising at least one phosphorescent compound, a crosslinkable material, and a solvent (hereinafter, referred to also as "second ink") can be suitably used for application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method and a nozzle coat method, like the first ink.

The preferable range of the viscosity of the second ink is the same as the preferable range of the viscosity of the first ink.

The preferable range and examples of the solvent contained in the second ink are the same as the preferable range and examples of the solvent contained in the first ink.

In the second ink, the blending amount of the solvent is usually 1000 to 100000 parts by weight, preferably 2000 to 20000 parts by weight, when the sum of the phosphorescent material and the crosslinkable material is 100 parts by weight.

<Layer Constitution of Light Emitting Device>

The light emitting device of the present invention may comprise a layer other than an anode, a cathode, a first organic layer and a second organic layer.

In the light emitting device of the present invention, the first organic layer is usually a light emitting layer (hereinafter, referred to as "first light emitting layer").

In the light emitting device of the present invention, the second organic layer is usually a hole transporting layer, a second light emitting layer or an electron transporting layer, preferably a hole transporting layer or a second light emitting layer.

In the light emitting device of the present invention, it is preferable that the first organic layer and the second organic layer are adjacent to each other, because the light emitting device of the present invention is more excellent in luminance life.

In the light emitting device of the present invention, the second organic layer is preferably a layer disposed between the anode and the first organic layer, more preferably a hole transporting layer or a second light emitting layer disposed between the anode and the first organic layer, because the light emitting device of the present invention is more excellent in luminance life.

In the second organic layer of the light emitting device of the present invention, the crosslinked body of the crosslinkable material may be contained singly or two or more of the crosslinked bodies may be contained.

In the light emitting device of the present invention, when the second organic layer is a hole transporting layer disposed between the anode and the first organic layer, it is preferable that the device further comprises a hole injection layer between the anode and the second organic layer, because the light emitting device of the present invention is more excellent in luminance life. When the second organic layer is a hole transporting layer disposed between the anode and the first organic layer, it is preferable that the device further comprises at least one of an electron injection layer and an electron transporting layer between the cathode and the first organic layer, because the light emitting device of the present invention is more excellent in luminance life.

In the light emitting device of the present invention, when the second organic layer is a second light emitting layer disposed between the anode and the first organic layer, it is preferable that the device further comprises at least one of a hole injection layer and a hole transporting layer between the anode and the second organic layer, because the light emitting device of the present invention is more excellent in luminance life. When the second organic layer is a second light emitting layer disposed between the anode and the first organic layer, it is preferable that the device further comprises at least one of an electron injection layer and an electron transporting layer between the cathode and the first organic layer, because the light emitting device of the present invention is more excellent in luminance life.

In the light emitting device of the present invention, when the second organic layer is a second light emitting layer disposed between the cathode and the first organic layer, it is preferable that the device further comprises at least one of a hole injection layer and a hole transporting layer between the anode and the first organic layer, because the light emitting device of the present invention is more excellent in luminance life. When the second organic layer is a second light emitting layer disposed between the cathode and the first organic layer, it is preferable that the device further comprises at least one of an electron injection layer and an electron transporting layer between the cathode and the second organic layer, because the light emitting device of the present invention is more excellent in luminance life.

In the light emitting device of the present invention, when the second organic layer is an electron transporting layer disposed between the cathode and the first organic layer, it is preferable that the device further comprises at least one of a hole injection layer and a hole transporting layer between the anode and the first organic layer, because the light emitting device of the present invention is more excellent in luminance life. When the second organic layer is an electron transporting layer disposed between the cathode and the first organic layer, it is preferable that the device further comprises an electron injection layer between the cathode and the second organic layer, because the light emitting device of the present invention is more excellent in luminance life.

The specific layer constitution of the light emitting device of the present invention includes, for example, layer constitutions represented by the following (D1) to (D15). The light emitting device of the present invention usually comprises a substrate, and an anode may be first laminated or a cathode may be first laminated on the substrate.

(D1) anode/second light emitting layer (second organic layer)/first light emitting layer (first organic layer)/cathode (D2) anode/hole transporting layer (second organic layer)/first light emitting layer (first organic layer)/cathode (D3) anode/hole injection layer/second light emitting layer (second organic layer)/first light emitting layer (first organic layer)/cathode (D4) anode/hole injection layer/second light emitting layer (second organic layer)/first light emitting layer (first organic layer)/electron transporting layer/cathode (D5) anode/hole injection layer/second light emitting layer (second organic layer)/first light emitting layer (first organic layer)/electron injection layer/cathode (D6) anode/hole injection layer/second light emitting layer (second organic layer)/first light emitting layer (first organic layer)/electron transporting layer/electron injection layer/cathode (D7) anode/hole injection layer/hole transporting layer (second organic layer)/first light emitting layer (first organic layer)/cathode (D8) anode/hole injection layer/hole transporting layer (second organic layer)/first light emitting layer (first organic layer)/electron transporting layer/cathode (D9) anode/hole injection layer/hole transporting layer (second organic layer)/first light emitting layer (first organic layer)/electron injection layer/cathode (D10) anode/hole injection layer/hole transporting layer (second organic layer)/first light emitting layer (first organic layer)/electron transporting layer/electron injection layer/cathode (D11) anode/hole injection layer/hole transporting layer/second light emitting layer (second organic layer)/first light emitting layer (first organic layer)/electron transporting layer/electron injection layer/cathode (D12) anode/hole injection layer/hole transporting layer (second organic layer)/first light emitting layer (first organic layer)/second light emitting layer/electron transporting layer/electron injection layer/cathode (D13) anode/hole injection layer/hole transporting layer/first light emitting layer (first organic layer)/second light emitting layer (second organic layer)/electron transporting layer/electron injection layer/cathode (D14) anode/hole injection layer/hole transporting layer/first light emitting layer (first organic layer)/electron transporting layer (second organic layer)/electron injection layer/cathode (D15) anode/hole injection layer/hole transporting layer (second organic layer)/second light emitting layer/first light emitting layer (first organic layer)/electron transporting layer/electron injection layer/cathode In the above-described (D1) to (D15), "/" denotes adjacent lamination of layers before and after that. Specifically, "second light emitting layer (second organic layer)/first light emitting layer (first organic layer)" denotes adjacent lamination of a second light emitting layer (second organic layer) and a first light emitting layer (first organic layer).

Layer constitutions represented by (D3) to (D12) are preferable, layer constitutions represented by (D3) to (D10) are more preferable, because the light emitting device of the present invention is more excellent in luminance life.

In the light emitting device of the present invention, two or more layers of each of an anode, a hole injection layer, a hole transporting layer, a second light emitting layer, an electron transporting layer, an electron injection layer and a cathode may be provided, when necessary.

When a plurality of anodes, hole injection layers, hole transporting layers, second light emitting layers, electron transporting layers, electron injection layers and cathodes are present, they may be the same or different at each occurrence.

The thickness of each of the anode, the hole injection layer, the hole transporting layer, the first light emitting layer, the second light emitting layer, the electron transporting layer, the electron injection layer and the cathode is usually 1 nm to 1 μm, preferably 2 nm to 500 nm, further preferably 5 nm to 150 nm.

In the light emitting device of the present invention, the order, the number and the thickness of layers to be laminated may be adjusted in view of the light emission efficiency and the device life of the light emitting device.

[Second Light Emitting Layer]

The second light emitting layer is usually a second organic layer or a layer comprising a fluorescent material. When the second light emitting layer is a layer comprising a fluorescent material, the fluorescent material contained in the second light emitting layer includes, for example, fluorescent materials which the first composition may comprise. The fluorescent material contained in the second light emitting layer may be contained singly or two or more of the fluorescent materials may be contained.

When the light emitting device of the present invention comprises a second light emitting layer and when a hole transporting layer described later and an electron transporting layer described later are not a second organic layer, it is preferable that the second light emitting layer is a second organic layer.

[Hole Transporting Layer]

The hole transporting layer is usually a second organic layer or a layer comprising a hole transporting material. When the hole transporting layer is a layer comprising a hole transporting material, the hole transporting material includes, for example, hole transporting materials which the first composition may comprise. The hole transporting material contained in the hole transporting layer may be contained singly or two or more of the hole transporting materials may be contained.

When the light emitting device of the present invention comprises a hole transporting layer and when a second light emitting layer described above and an electron transporting layer described later are not a second organic layer, it is preferable that the hole transporting layer is a second organic layer.

[Electron Transporting Layer]

The electron transporting layer is usually a second organic layer or a layer comprising an electron transporting material, preferably a layer comprising an electron transporting material. When the electron transporting layer is a layer comprising an electron transporting material, the electron transporting material contained in the electron transporting layer includes, for example, electron transporting materials which the first composition may comprise.

When the light emitting device of the present invention comprises an electron transporting layer and when the electron transporting layer is not a second organic layer, it is preferable that the electron transporting material contained in the electron transporting layer is a polymer compound (hereinafter, referred to also as "polymer compound of electron transporting layer") comprising at least one constitutional unit selected from the group consisting of a constitutional unit represented by the formula (ET-1) and a constitutional unit represented by the formula (ET-2).

(Chemical Formula 88)

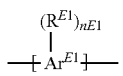
(ET-1)

[wherein, nE1 represents an integer of 1 or more.

$Ar^{E1}$ represents an aromatic hydrocarbon group or a heterocyclic group, and these groups each optionally have a substituent other than $R^{E1}$.

$R^{E1}$ represents a group represented by the formula (ES-1). When a plurality of $R^{E1}$ are present, they may be the same or different.]

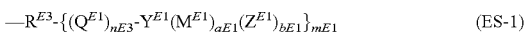
(ES-1)

[wherein, nE3 represents an integer of 0 or more, aE1 represents an integer of 1 or more, bE1 represents an integer of 0 or more, and mE1 represents an integer of 1 or more. When a plurality of nE3, aE1 and bE1 are present, they may be the same or different at each occurrence. mE1 is 1 when $R^{E3}$ is a single bond. aE1 and bE1 are selected so that the electric charge of a group represented by the formula (ES-1) is 0.

$R^{E3}$ represents a single bond, a hydrocarbon group, a heterocyclic group or $-O-R^{E3'}$ ($R^{E3'}$ represents a hydrocarbon group or a heterocyclic group), and these groups each optionally have a substituent.

$Q^{E1}$ represents an alkylene group, a cycloalkylene group, an arylene group, an oxygen atom or a sulfur atom, and these groups each optionally have a substituent. When a plurality of $Q^{E1}$ are present, they may be the same or different.

$Y^{E1}$ represents $CO_2^-$, $SO_3^-$, $SO_2^-$ or $PO_3^{2-}$. When a plurality of $Y^{E1}$ are present, they may be the same or different.

$M^{E1}$ represents an alkali metal cation, an alkaline earth metal cation or an ammonium cation, and this ammonium cation optionally has a substituent. When a plurality of $M^{E1}$ are present, they may be the same or different.

$Z^{E1}$ represents $F^-$, $Cl^-$, $Br^-$, $I^-$, $OH^-$, $B(R^{E4})_4^-$, $R^{E4}SO_3^-$, $R^{E4}COO^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$. $R^{E4}$ represents an alkyl group, a cycloalkyl group or an aryl group, and these groups each optionally have a substituent. When a plurality of $Z^{E1}$ are present, they may be the same or different.]

nE1 is usually an integer of 1 to 4, preferably 1 or 2.

The aromatic hydrocarbon group or the heterocyclic group represented by $Ar^{E1}$ is preferably a group obtained by removing from a 1,4-a phenylene group, 1,3-a phenylene group, 1,2-a phenylene group, 2,6-naphthalenediyl group, 1,4-naphthalenediyl group, 2,7-a fluorenediyl group, 3,6-a fluorenediyl group, 2,7-phenanthrenediyl group or 2,7-a carbazolediyl group nE1 hydrogen atoms bonding directly to atoms constituting the ring, and it optionally has a substituent other than $R^{E1}$.

The substituent other than $R^{E1}$ which $Ar^{E1}$ optionally has includes a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group, a cycloalkynyl group, a carboxyl group and a group represented by the formula (ES-3).

$-O-(C_nH_{2n}O)_{nx}-C_mH_{2m'+1}$  (ES-3)

[wherein, n', m' and nx each independently represent an integer of 1 or more.]

nE3 is usually an integer of 0 to 10, preferably an integer of 0 to 8, more preferably an integer of 0 to 2.

aE1 is usually an integer of 1 to 10, preferably an integer of 1 to 5, more preferably 1 or 2.

bE1 is usually an integer of 0 to 10, preferably an integer of 0 to 4, more preferably 0 or 1.

mE1 is usually an integer of 1 to 5, preferably 1 or 2, more preferably 0 or 1.

When $R^{E3}$ is $-O-R^{E3'}$, the group represented by the formula (ES-1) is a group represented by the following formula.

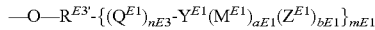

$R^{E3}$ is preferably a hydrocarbon group or a heterocyclic group, more preferably an aromatic hydrocarbon group or an aromatic heterocyclic ring group, further preferably an aromatic hydrocarbon group.

The substituent which $R^{E3}$ optionally has includes an alkyl group, a cycloalkyl group, an aryl group, a monovalent heterocyclic group and a group represented by the formula (ES-3), and is preferably a group represented by the formula (ES-3).

$Q^{E1}$ is preferably an alkylene group, an arylene group or an oxygen atom, more preferably an alkylene group or an oxygen atom.

$Y^{E1}$ is preferably $CO_2^-$, $SO_2^-$ or $PO_3^{2-}$, more preferably $CO_2^-$.

The alkali metal cation represented by $M^{E1}$ includes, for example, $Li^+$, $Na^+$, $K^+$, $Rb^+$ and $Cs^+$, and is preferably $K^+$, $Rb^+$ or $Cs^+$, more preferably $Cs^+$.

The alkaline earth metal cation represented by $M^{E1}$ includes, for example, $Be^{2+}$, $Mg^{2+}$, $Ca^{2+}$, $Sr^{2+}$ and $Ba^{2+}$, and is preferably $Mg^{2+}$, $Ca^{2+}$, $Sr^{2+}$ or $Ba^{2+}$, more preferably $Ba^{2+}$.

$M^{E1}$ is preferably an alkali metal cation or an alkaline earth metal cation, more preferably an alkali metal cation.

$Z^{E1}$ is preferably $F^-$, $Cl^-$, $Br^-$, $I^-$, $OH^-$, $B(R^{E4})_4^-$, $R^{E4}SO_3^-$, $R^{E4}COO^-$ or $NO_3^-$, more preferably $F^-$, $Cl^-$, $Br^-$, $I^-$, $OH^-$, $R^{E4}SO_3^-$ or $R^{E4}COO^-$. $R^{E4}$ is preferably an alkyl group.

The group represented by the formula (ES-1) includes, for example, groups represented by the following formulae.

(Chemical Formula 89)

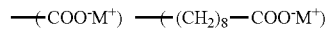

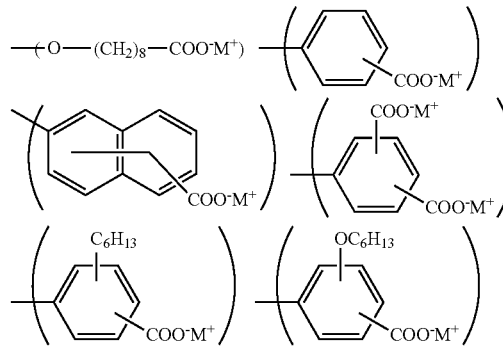

(Chemical Formula 90)

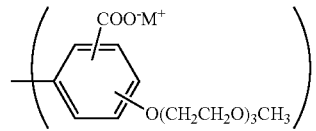

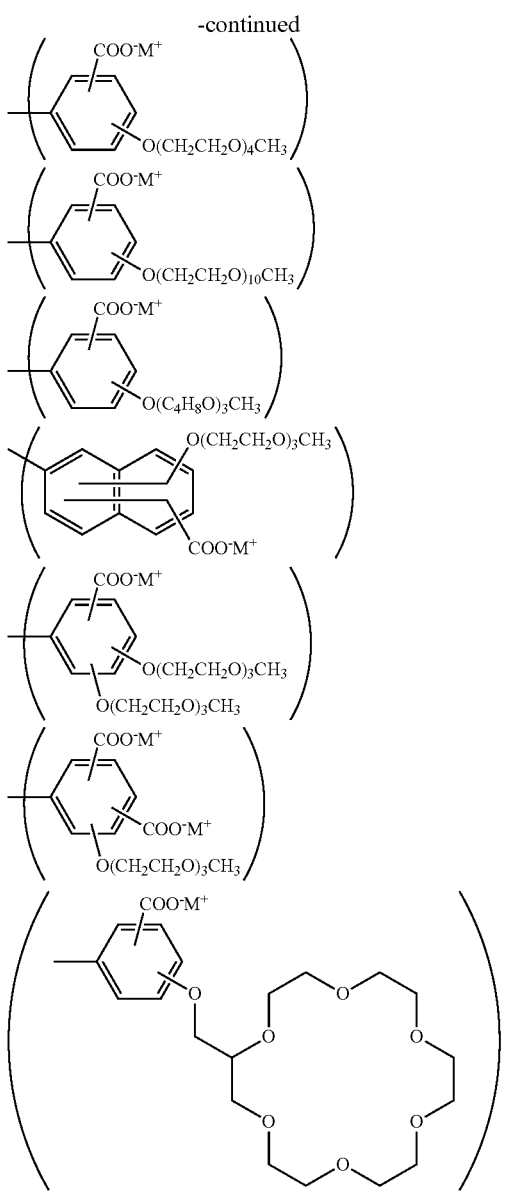

[wherein M⁺ represents Li⁺, Na⁺, K⁺, Cs⁺ or N(CH₃)₄⁺. When a plurality of M⁺ are present, they may be the same or different.]

(Chemical Formula 91)

  (ET-2)

[wherein, nE2 represents an integer of 1 or more.

$Ar^{E2}$ represents an aromatic hydrocarbon group or a heterocyclic group, and these groups each optionally have a substituent other than $R^{E2}$.

$R^{E2}$ represents a group represented by the formula (ES-2). When a plurality of $R^{E2}$ are present, they may be the same or different.]

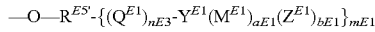  (ES-2)

[wherein, nE4 represents an integer of 0 or more, aE2 represents an integer of 1 or more, bE2 represents an integer of 0 or more and mE2 represents an integer of 1 or more. When a plurality of nE4, aE2 and bE2 are present, they may be the same or different at each occurrence. mE2 is 1 when $R^{E5}$ is a single bond. aE2 and bE2 are selected so that the electric charge of a group represented by the formula (ES-2) is 0.

$R^{E5}$ represents a single bond, a hydrocarbon group, a heterocyclic group or —O—$R^{E5'}$ ($R^{E5'}$ represents a hydrocarbon group or a heterocyclic group.), and these groups each optionally have a substituent.

$Q^{E2}$ represents an alkylene group, a cycloalkylene group, an arylene group, an oxygen atom or a sulfur atom, and these groups each optionally have a substituent. When a plurality of $Q^{E2}$ are present, they may be the same or different.

$Y^{E2}$ represents —C⁺$R^{E6}_2$, —N⁺$R^{E6}_3$, —P⁺$R^{E6}_3$, —S⁺$R^{E6}_2$ or I⁺$R^{E6}_2$. $R^{E6}$ represents a hydrogen atom, an alkyl group, a cycloalkyl group or an aryl group, and these groups each optionally have a substituent. The plurality of $R^{E6}$ may be the same or different. When a plurality of $Y^{E2}$ are present, they may be the same or different.

$M^{E2}$ represents F⁻, Cl⁻, Br⁻, I⁻, OH⁻, B($R^{E7}$)₄⁻, $R^{E7}$SO₃⁻, $R^{E7}$COO⁻, BF₄⁻, SbCl₆⁻ or SbF₆⁻. $R^{E7}$ represents an alkyl group, a cycloalkyl group or an aryl group, and these groups each optionally have a substituent. When a plurality of $M^{E2}$ are present, they may be the same or different.

$Z^{E2}$ represents an alkali metal cation or an alkaline earth metal cation. When a plurality of $Z^{E2}$ are present, they may be the same or different.]

nE2 is usually an integer of 1 to 4, preferably 1 or 2

The aromatic hydrocarbon group or the heterocyclic group represented by $Ar^{E2}$ is preferably a group obtained by removing from a 1,4-phenylene group, a 1,3-phenylene group, a 1,2-phenylene group, a 2,6-naphthalenediyl group, a 1,4-naphthalenediyl group, a 2,7-fluorenediyl group, a 3,6-fluorenediyl group, a 2,7-phenanthrenediyl group or a 2,7-carbazolediyl group nE2 hydrogen atoms bonding directly to atoms constituting the ring, and it optionally has a substituent other than $R^{E2}$.

The substituent other than $R^{E2}$ which $Ar^{E2}$ optionally has is the same as the substituent other than $R^{E1}$ which $Ar^{E1}$ optionally has.

nE4 is usually an integer of 0 to 10, preferably an integer of 0 to 8, more preferably an integer of 0 to 2.

aE2 is usually an integer of 1 to 10, preferably an integer of 1 to 5, more preferably 1 or 2.

bE2 is usually an integer of 0 to 10, preferably an integer of 0 to 4, more preferably 0 or 1.

mE2 is usually an integer of 1 to 5, preferably 1 or 2, more preferably 0 or 1.

When $R^{E5}$ is —O—$R^{E5'}$, the group represented by the formula (ES-2) is a group represented by the following formula.

—O—$R^{E5'}$-{($Q^{E1}$)$_{nE3}$-$Y^{E1}$($M^{E1}$)$_{aE1}$($Z^{E1}$)$_{bE1}$}$_{mE1}$ $R^{E5}$ is preferably a hydrocarbon group or a heterocyclic group, more preferably an aromatic hydrocarbon group or an aromatic heterocyclic ring group, further preferably an aromatic hydrocarbon group.

The substituent which $R^{E5}$ optionally has includes an alkyl group, a cycloalkyl group, an aryl group, a monovalent heterocyclic group and a group represented by the formula (ES-3), and is preferably a group represented by the formula (ES-3).

$Q^{E2}$ is preferably an alkylene group, an arylene group or an oxygen atom, more preferably an alkylene group or an oxygen atom.

$Y^{E2}$ is preferably $-C^+R^{E6}{}_2$, $-N^=R^{E6}{}_3$, $-P^+R^{E6}{}_3$ or $S^+R^{E6}{}_2$, more preferably $-N^+R^{E6}{}_3$. $R^{E6}$ is preferably a hydrogen atom, an alkyl group or an aryl group, more preferably a hydrogen atom or an alkyl group.

$M^{E2}$ is preferably $F^-$, $Cl^-$, $Br^-$, $I^-$, $B(R^{E7})_4{}^-$, $R^{E7}SO_3{}^-$, $R^{E7}COO^-$, $BF_4{}^-$ or $SbF_6{}^-$, more preferably $Br^-$, $I^-$, $B(R^{E7})_4{}^-$, $R^{E7}COO^-$ or $SbF_6{}^-$. $R^{E7}$ is preferably an alkyl group.

The alkali metal cation represented by $Z^{E2}$ includes, for example, $Li^+$, $Na^+$, $K^+$, $Rb^+$ and $Cs^+$, and is preferably $Li^+$, $Na^+$ or $K^+$.

The alkaline earth metal cation represented by $Z^{E2}$ includes, for example, $Be^{2+}$, $Mg^{2+}$, $Ca^{2+}$, $Sr^{2+}$ and $Ba^{2+}$, and is preferably $Mg^{2+}$ or $Ca^{2+}$.

$Z^{E2}$ is preferably an alkali metal cation.

The group represented by the formula (ES-2) includes, for example, groups represented by the following formulae.

(Chemical Formula 92)

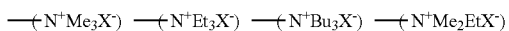
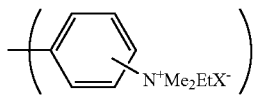
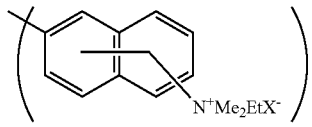

(Chemical Formula 93)

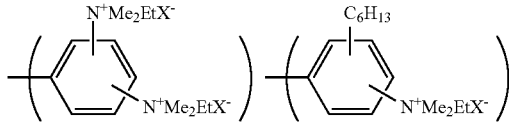
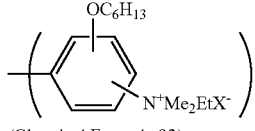
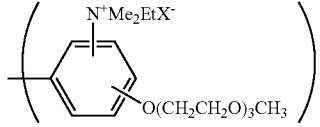
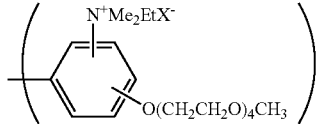
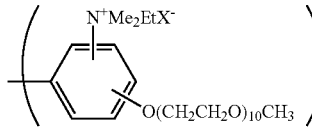
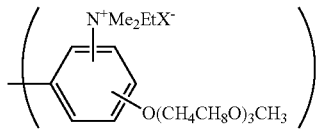

-continued

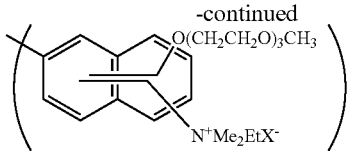
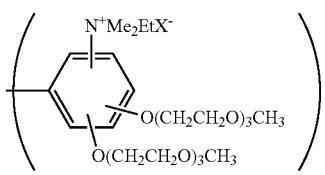
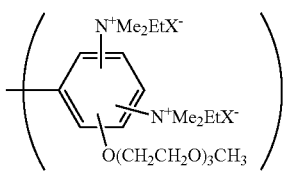
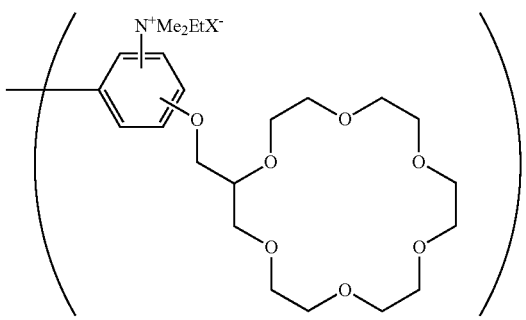

[wherein, $X^-$ represents $F^-$, $Cl^-$, $Br^-$, $I^-$, $B(C_6H_5)_4{}^-$, $CH_3COO^-$ or $CF_3SO_3{}^-$. When a plurality of $X^-$ are present, they may be the same or different.]

The constitutional unit represented by the formula (ET-1) and the formula (ET-2) includes, for example, constitutional units represented by the following formula (ET-31) to formula (ET-38)

(Chemical Formula 94)

(ET-31)

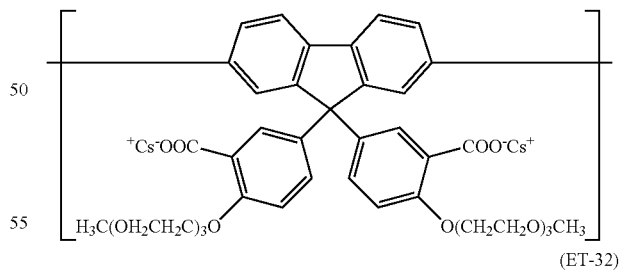

(ET-32)

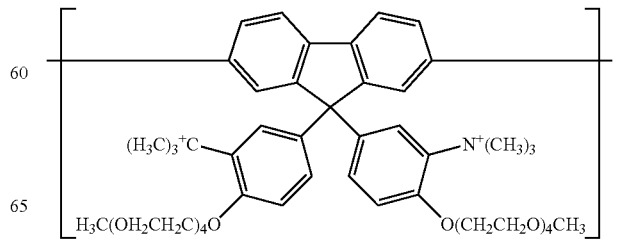

(Chemical Formula 95)

(ET-33)

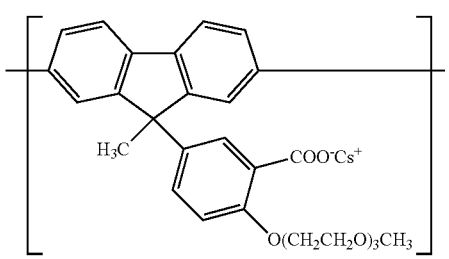

(ET-34)

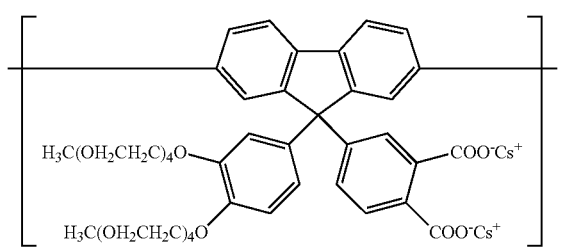

(Chemical Formula 96)

(ET-35)

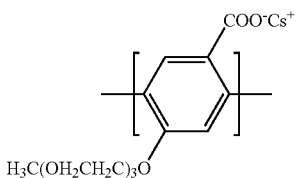

(ET-36)

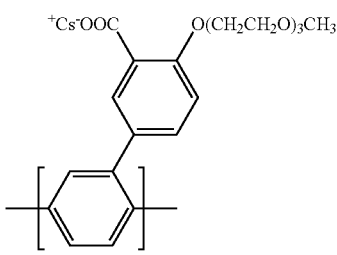

(ET-37)

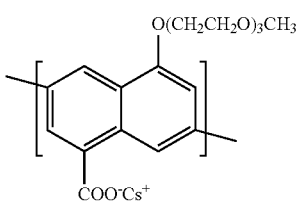

(ET-38)

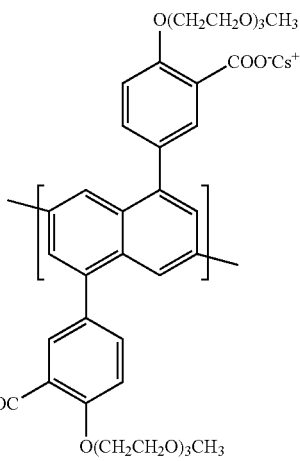

The polymer compound of the electron transporting layer can be synthesized according to methods described, for example, in JP-A No. 2009-239279, JP-A No. 2012-033845, JP-A No. 2012-216821, JP-A No. 2012-216822 and JP-A No. 2012-216815.

When the material to be used for formation of a hole injection layer described later, the material to be used for formation of a hole transporting layer, the material to be used for formation of a first light emitting layer, the material to be used for formation of a second light emitting layer, the material to be used for formation of an electron transporting layer and the material to be used for formation of an electron injection layer described later are dissolved in a solvent to be used in forming a layer adjacent to a hole injection layer, a hole transporting layer, a first light emitting layer, a second light emitting layer, an electron transporting layer and an electron injection layer, respectively, in fabrication of a light emitting device, it is preferable that dissolution of the material in the solvent is avoided. As the method for avoiding dissolution of the material, i) a method of using a material having a crosslinkable group or ii) a method of providing a difference between solubilities of adjacent layers is preferable. In the method i), a layer is formed by using a material having a crosslinkable group, then, the crosslinkable group is crosslinked, thus, the layer can be insolubilized.

For example, when an electron transporting layer is laminated on a first light emitting layer or a second light emitting layer by utilizing a difference in solubility, the electron transporting layer can be laminated by using a solution which shows low solubility for the first light emitting layer or the second light emitting layer.

As the solvent to be used when an electron transporting layer is laminated on a first light emitting layer or a second light emitting layer by utilizing a difference in solubility, preferable are water, alcohols, ethers, esters, nitrile compounds, nitro compounds, fluorinated alcohols, thiols, sulfides, sulfoxides, thioketones, amides, carboxylic acids and the like. Specific examples of the solvent include methanol, ethanol, 2-propanol, 1-butanol, tert-butyl alcohol, acetonitrile, 1,2-ethanediol, N,N-dimethylformamide, dimethyl sulfoxide, acetic acid, nitromethane, propylene carbonate, pyridine and carbon disulfide, and mixed solvents composed of these solvents. When a mixed solvent is used, it may be a mixed solvent composed of at least one solvent of water, alcohols, ethers, esters, nitrile compounds, nitro compounds, fluorinated alcohols, thiols, sulfides, sulfoxides, thioketones, amides, carboxylic acids and the like, and at least one solvent of chlorine-based solvents, aromatic hydrocarbon solvents, aliphatic hydrocarbon solvents and ketone solvents.

[Hole Injection Layer and Electron Injection Layer]

The hole injection layer is a layer comprising a hole injection material. The hole injection material contained in the hole injection layer includes, for example, hole injection materials which the first composition may comprise described above. The hole injection material contained in the hole injection layer may be contained singly, or two or more of the hole injection materials may be contained.

The electron injection layer is a layer comprising an electron injection material. The electron injection material contained in the electron injection layer includes, for example, electron injection materials which the first composition may comprise described above. The electron injection material contained in the electron injection layer may be contained singly, or two or more of the electron injection materials may be contained.

[Substrate/Electrode]

The substrate in the light emitting device may advantageously be a substrate on which an electrode can be formed and which does not chemically change in forming an organic layer, and is a substrate made of a material such as, for example, glass, plastic and silicon. In the case of using an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium•tin•oxide (ITO) and indium•zinc•oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

In the light emitting device of the present invention, at least one of the anode and the cathode is usually transparent or semi-transparent, and it is preferable that the anode is transparent or semi-transparent.

Methods for forming the anode and the cathode include, for example, vacuum vapor deposition method, sputtering method, ion plating method, plating method and lamination method.

[Production Method of Light Emitting Device]

The method of forming each of a first light emitting layer, a second light emitting layer, a hole transporting layer, an electron transporting layer, a hole injection layer, an electron injection layer and the like in the light emitting device of the present invention includes, for example, a vacuum vapor deposition method from a powder and a method by film formation from solution or melted state when a low molecular weight compound is used, and includes, for example, a method by film formation from solution or melted state when a polymer compound is used.

The first light emitting layer, the second light emitting layer, the hole transporting layer, the electron transporting layer, the hole injection layer and the electron injection layer can be formed by application methods such as a spin coat method and an inkjet printing method by using a first ink, a second ink and an ink comprising each of a fluorescent material, a hole transporting material, an electron transporting material, a hole injection material and an electron injection material described above.

[Use of Light Emitting Device]

For obtaining planar light emission by using a light emitting device, a planar anode and a planar cathode are disposed so as to overlap with each other. Patterned light emission can be produced by a method of placing a mask with a patterned window on the surface of a planer light emitting device, a method of forming an extremely thick layer intended to be a non-light emitting, thereby having the layer essentially no-light emitting or a method of forming an anode, a cathode or both electrodes in a patterned shape. By forming a pattern with any of these methods and disposing certain electrodes so as to switch ON/OFF independently, a segment type display capable of displaying numbers and letters and the like is provided. For producing a dot matrix display, both an anode and a cathode are formed in a stripe shape and disposed so as to cross with each other. Partial color display and multi-color display are made possible by a method of printing separately certain polymer compounds showing different emission or a method of using a color filter or a fluorescence conversion filter. The dot matrix display can be passively driven, or actively driven combined with TFT and the like. These displays can be used in computers, television sets, portable terminals and the like. The planar light emitting device can be suitably used as a planer light source for backlight of a liquid crystal display or as a planar light source for illumination. If a flexible substrate is used, it can be used also as a curved light source and a curved display.

Examples

The present invention will be illustrated further in detail by examples below, but the present invention is not limited to these examples.

In the examples, the polystyrene-equivalent number-average molecular weight (Mn) and the polystyrene-equivalent weight-average molecular weight (Mw) of a polymer compound were determined by the following size exclusion chromatography (SEC) using tetrahydrofuran as a mobile phase. The each measurement conditions for SEC are as described below.

A polymer compound to be measured was dissolved in tetrahydrofuran at a concentration of about 0.05 wt %, and 10 µL of the solution was injected into SEC. The mobile phase was flowed at a flow rate of 2.0 mL/min. As the column, PLgel MIXED-B (manufactured by Polymer Laboratories Ltd.) was used. As the detector, a UV-VIS detector (manufactured by Shimadzu Corp., trade name: SPD-10Avp) was used.

<Synthesis Example 1> Synthesis of Phosphorescent Compounds G1 to G3

A phosphorescent compound G1 was synthesized according to a method described in International Publication WO2009/131255.

A phosphorescent compound G2 was synthesized based on a method described in International Publication WO2004/026886.

A phosphorescent compound G3 was synthesized according to a method described in JP-A No. 2013-237789.

(Chemical Formula 97)

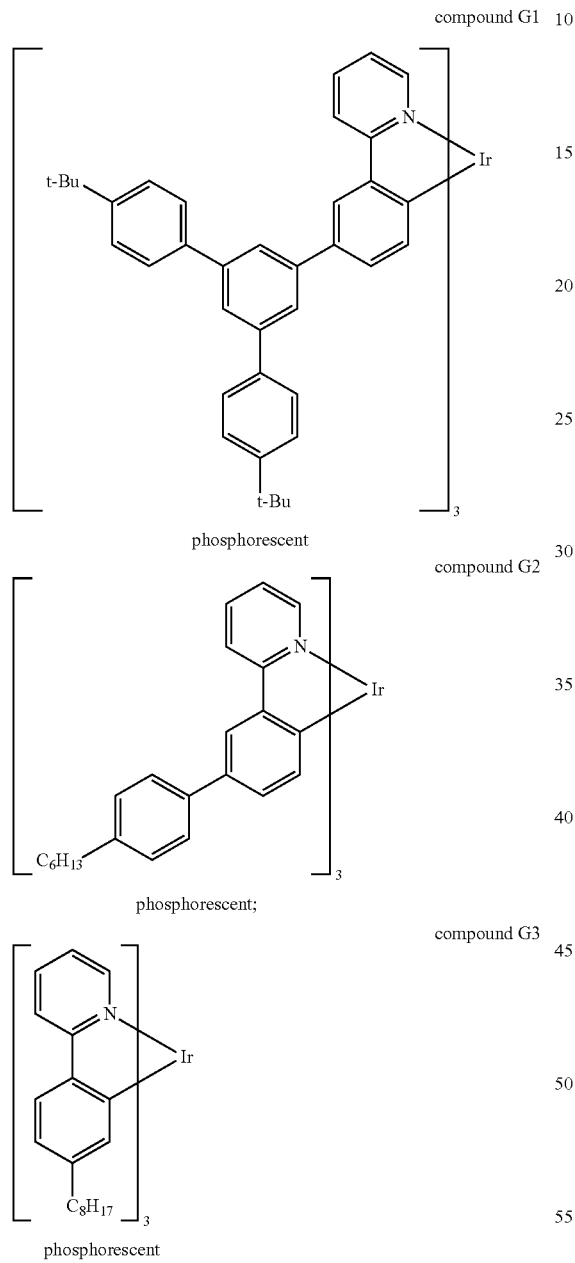

A phosphorescent compound R3 was synthesized based on a method described in International Publication WO2002/44189.

(Chemical Formula 98)

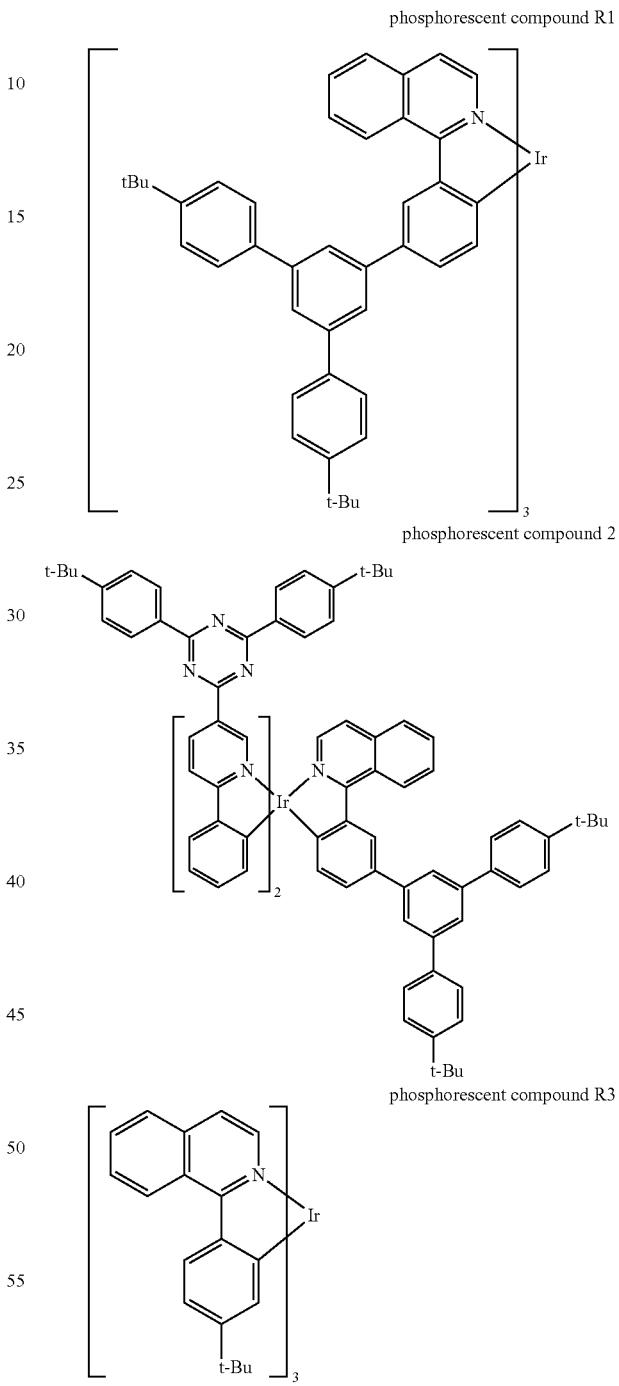

<Synthesis Example 2> Synthesis of Phosphorescent Compounds R1 to R3

A phosphorescent compound R1 was synthesized based on a method described in JP-A No. 2006-188673.

A phosphorescent compound R2 was synthesized according to a method described in JP-A No. 2011-105701.

<Synthesis Example 3> Synthesis of Phosphorescent Compounds B1 to B3

A phosphorescent compound B1 was synthesized according to a method described in JP-A No. 2013-147551.

A phosphorescent compound B2 was synthesized based on a method described in International Publication WO2006/121811.

A phosphorescent compound B3 was synthesized based on a method described in International Publication WO2006/121811 and JP-A No. 2013-048190.

(Chemical Formula 99)

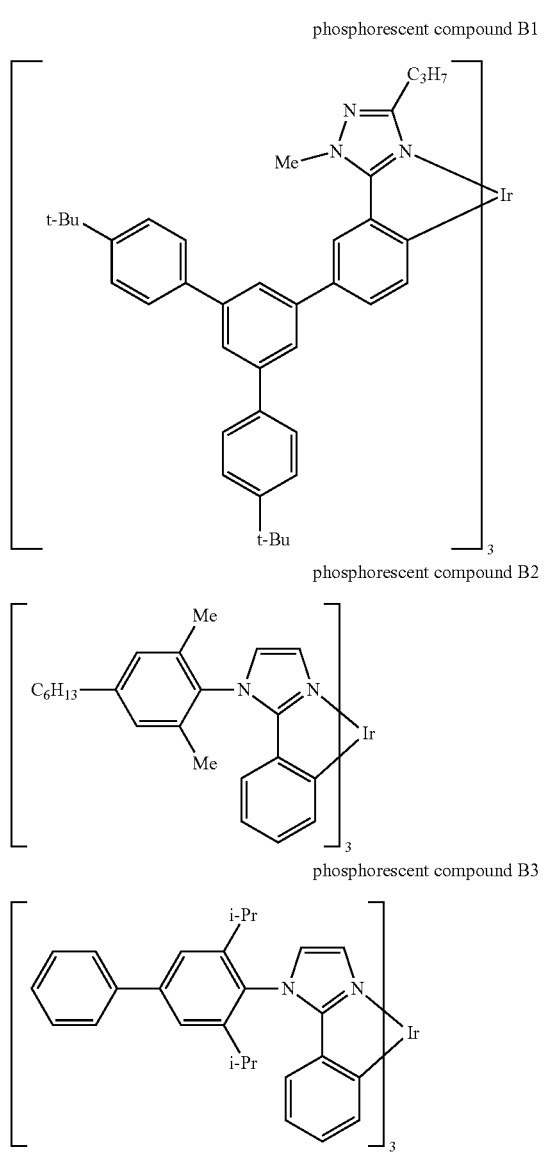

A compound M6 was synthesized according to a method described in International Publication WO2009/131255.

A compound M7 was synthesized according to a method described in JP-A No. 2004-143419.

A compound M8 was synthesized according to a method described in International Publication WO2013/191088.

A compound M9 was synthesized according to a method described in International Publication WO2013/191088.

(Chemical Formula 100)

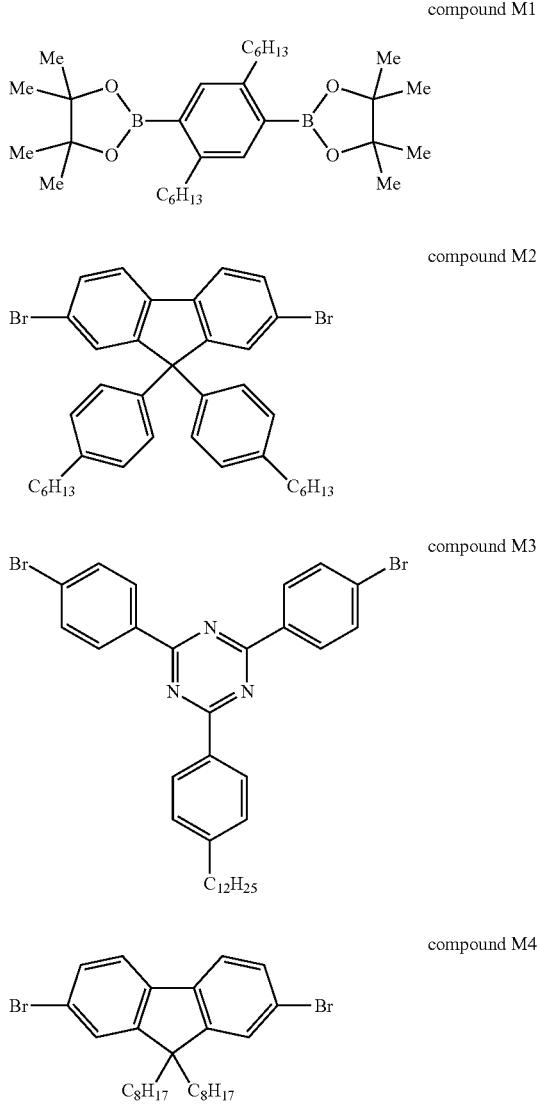

<Synthesis Example 4> Synthesis of Compounds M1 to M9

A compound M1 and a compound M3 were synthesized according to a method described in JP-A No. 2010-189630.

A compound M2 was synthesized according to a method described in International Publication WO2012/086671.

A compound M4 was synthesized according to a method described in International Publication WO2002/045184.

A compound M5 was synthesized according to a method described in JP-A No. 2015-086215.

(Chemical Formula 101)

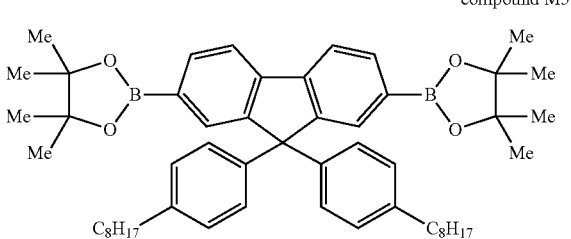

-continued

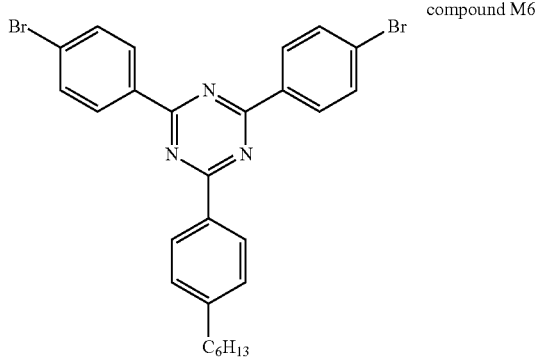
compound M6

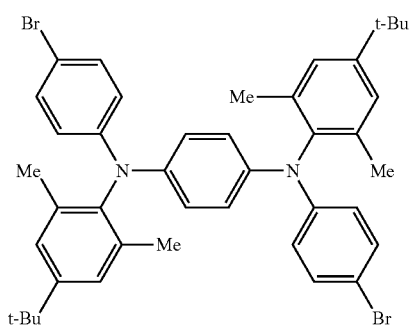
(Chemical Formula 102)
compound M7

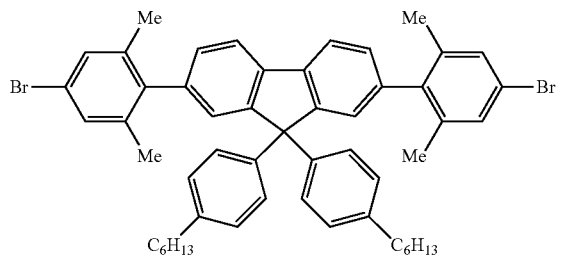
compound M8

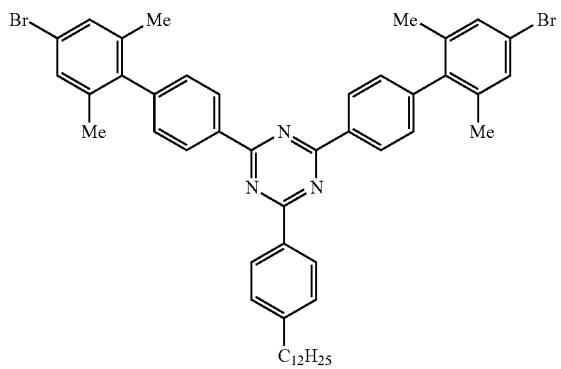
compound M9

<Synthesis Example 5> Synthesis of Polymer Compound HP-1

A polymer compound HP-1 was synthesized according to a method described in JP-A No. 2012-036388 using the compound M1, the compound M2 and the compound M3. The polymer compound HP-1 had an Mn of $9.6 \times 10^4$ and an Mw of $2.2 \times 10^5$.

The polymer compound HP-1 is a copolymer constituted of a constitutional unit derived from the compound M1, a constitutional unit derived from the compound M2 and a constitutional unit derived from the compound M3 at a molar ratio of 50:40:10 according to the theoretical values calculated from the amounts of the charged raw materials.

<Synthesis Example 6> Synthesis of Polymer Compound HP-2

An inert gas atmosphere was prepared in a reaction vessel, then, the compound M5 (4.77 g), the compound M2 (0.773 g), the compound M4 (1.97 g), the compound M6 (0.331 g), the compound M7 (0.443 g) and toluene (67 mL) were added, and the mixture was stirred while heating at 105° C.

To the resultant mixture was added bis(triphenylphosphine)palladium(II) dichloride (4.2 mg), subsequently, a 20 wt % tetraethylammonium hydroxide aqueous solution (20 mL) was dropped, then, the mixture was stirred for 3 hours under reflux.

To the resultant reaction mixture were added phenylboronic acid (0.077 g), bis(triphenylphosphine)palladium(II) dichloride (4.2 mg), toluene (60 mL) and a 20 wt % tetraethylammonium hydroxide aqueous solution (20 mL), and the mixture was stirred for 24 hours under reflux.

The organic layer and the aqueous layer of the resultant reaction mixture were separated, then, to the resultant organic layer were added sodium N,N-diethyldithiocarbamate trihydrate (3.33 g) and ion exchanged water (67 mL), and the mixture was stirred at 85° C. for 2 hours. The organic layer and the aqueous layer of the resultant reaction mixture were separated, then, the resultant organic layer was washed with ion exchanged water (78 mL) twice, with a 3 wt % acetic acid aqueous solution (78 mL) twice and with ion exchanged water (78 mL) twice in this order. The organic layer and the aqueous layer of the resultant washed product were separated, then, the resultant organic layer was dropped into methanol to cause precipitation of a solid which was then filtrated and dried, to obtain a solid. This solid was dissolved in toluene, and the solution was allowed to pass through a silica gel column and an alumina column through which toluene had passed previously. The resultant solution was dropped into methanol to cause precipitation of a solid which was then filtrated and dried, to obtain a polymer compound HP-2 (4.95 g). The polymer compound HP-2 had an Mn of $1.4 \times 10^5$ and an Mw of $4.1 \times 10^5$.

The polymer compound HP-2 is a copolymer constituted of a constitutional unit derived from the compound M5, a constitutional unit derived from the compound M2, a constitutional unit derived from the compound M4, a constitutional unit derived from the compound M6 and a constitutional unit derived from the compound M7 at a molar ratio of 50:10:30:5:5 according to the theoretical values calculated from the amounts of the charged raw materials.

<Synthesis Example 7> Synthesis of Polymer Compound HP-3

A polymer compound HP-3 was synthesized according to a method described in International Publication WO2015/008851 using the compound M1, the compound M8 and the compound M9. The polymer compound HP-3 had an Mn of $8.5 \times 10^4$ and an Mw of $2.2 \times 10^5$.

The polymer compound HP-3 is a copolymer constituted of a constitutional unit derived from the compound M1, a constitutional unit derived from the compound M8 and a constitutional unit derived from the compound M9 at a molar ratio of 50:26:24 according to the theoretical values calculated from the amounts of the charged raw materials.

<Synthesis Example 8> Synthesis of Polymer Compound ET1

(Synthesis of Polymer Compound ET1a)

A polymer compound ET1a was synthesized according to a synthesis method described in JP-A No. 2012-33845 using a compound ET1-1 synthesized according to a method described in JP-A No. 2012-33845 and a compound ET1-2 synthesized according to a method described in JP-A No. 2012-33845.

(Chemical Formula 103)

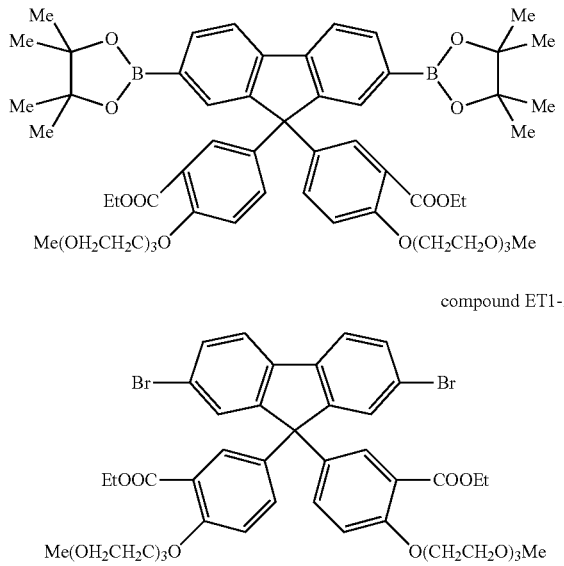

compound ET1-1 compound ET1-2

The polymer compound ET1a had an Mn of $5.2 \times 10^4$.

The polymer compound ET1a is a copolymer constituted of a constitutional unit derived from the compound ET1-1 and a constitutional unit derived from the compound ET1-2 at a molar ratio of 50:50 according to the theoretical values calculated from the amounts of the charged raw materials.

(Synthesis of Polymer Compound ET1)

An inert gas atmosphere was prepared in a reaction vessel, then, the polymer compound ET1a (200 mg), tetrahydrofuran (20 mL) and ethanol (20 mL) were added, and the mixture was heated at 55° C. To the resultant mixture was added cesium hydroxide (200 mg) dissolved in water (2 mL), and the mixture was stirred at 55° C. for 6 hours. The resultant reaction mixture was cooled down to room temperature, then, concentrated under reduced pressure, to obtain a solid. This solid was washed with water, then, dried under reduced pressure, to obtain a polymer compound ET1 (150 mg, pale yellow solid). It was confirmed by the NMR spectrum of the polymer compound ET1 that a signal derived from an ethyl group of an ethyl ester site of the polymer compound ET1a had disappeared completely.

(Chemical Formula 104)

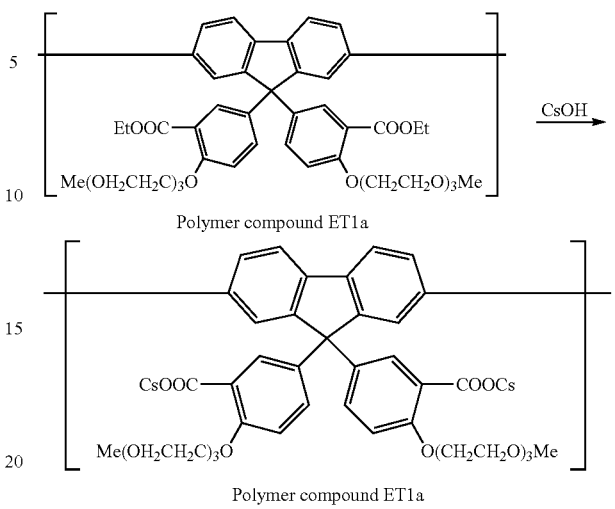

Polymer compound ET1a

Polymer compound ET1a

A compound HTL-M1 and a compound HM-1 purchased from Luminescence Technology Corp were used.

(Chemical Formula 105)

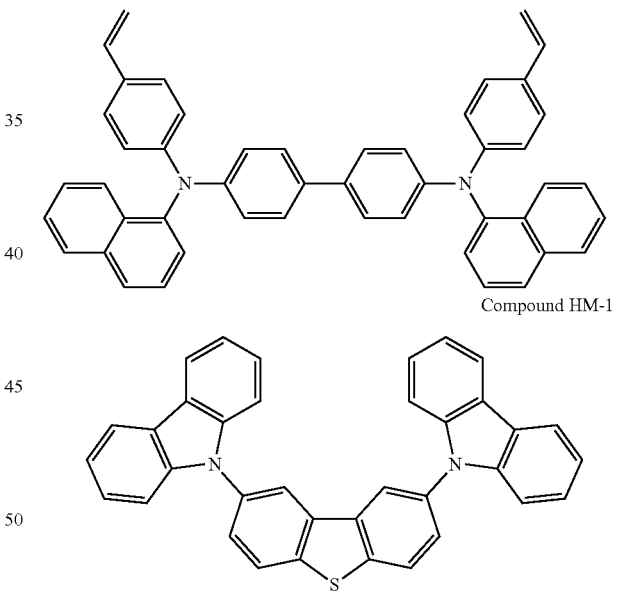

Compound HTL-M1

Compound HM-1

<Example D1> Fabrication and Evaluation of Light Emitting Device D1

(Formation of Anode and Hole Injection Layer)

An ITO film with a thickness of 45 nm was attached to a glass substrate by a sputtering method, to form an anode. On the anode, a polythiophene-sulfonic acid type hole injection agent AQ-1200 (manufactured by Plextronics) was spin-coated to form a film with a thickness of 35 nm, and the film was heated on a hot plate at 170° C. for 15 minutes under an air atmosphere, to form a hole injection layer.

(Formation of Second Organic Layer)

The compound HTL-M1 and the phosphorescent compound G1 (compound HTL-M1/phosphorescent compound G1=70 wt %/30 wt %) were dissolved in chlorobenzene at a concentration of 0.8 wt %. The resultant chlorobenzene solution was spin-coated to form a film with a thickness of 20 nm on the hole injection layer, and the film was heated on a hot plate at 180° C. for 60 minutes under a nitrogen gas atmosphere, to form a second organic layer. By this heating, the compound HTL-M1 was converted to a crosslinked body.

(Formation of First Organic Layer)

The polymer compound HP-1 and the phosphorescent compound G1 (polymer compound HP-1/phosphorescent compound G1=70 wt %/30 wt %) were dissolved in xylene at a concentration of 1.8 wt %. The resultant xylene solution was spin-coated to form a film with a thickness of 80 nm on the second organic layer, and the film was heated at 130° C. for 10 minutes under a nitrogen gas atmosphere, to form a first organic layer.

(Formation of Cathode)

The substrate carrying the first organic layer formed thereon was placed in a vapor deposition machine, and the internal pressure thereof was reduced to $1.0\times10^{-4}$ Pa or less, then, as a cathode, sodium fluoride was vapor-deposited with a thickness of about 4 nm on the first organic layer, subsequently, aluminum was vapor-deposited with a thickness of about 80 nm on the sodium fluoride layer. After vapor deposition, sealing was performed using a glass substrate, to fabricate a light emitting device D1.

(Evaluation of Light Emitting Device)

Voltage was applied to the light emitting device D1, to observe EL emission. The chromaticity coordinate (x, y) at 1000 cd/m$^2$ was (0.30, 0.64). The device was driven with constant current at a current value of 0.8 mA, and the time until the luminance reached 50% of the initial luminance was measured, to find a value of 125.1 hours.

<Example D2> Fabrication and Evaluation of Light Emitting Device D2

A light emitting device D2 was fabricated in the same manner as in Example D1 except that "The compound HTL-M1 and the phosphorescent compound G2 (compound HTL-M1/phosphorescent compound G2=70 wt %/30 wt %) were dissolved in chlorobenzene at a concentration of 0.9 wt %." instead of "The compound HTL-M1 and the phosphorescent compound G1 (compound HTL-M1/phosphorescent compound G1=70 wt %/30 wt %) were dissolved in chlorobenzene at a concentration of 0.8 wt %." in (Formation of second organic layer) of Example D1, and further, "The polymer compound HP-1 and the phosphorescent compound G2 (polymer compound HP-1/phosphorescent compound G2=70 wt %/30 wt %) were dissolved in xylene at a concentration of 1.8 wt %." instead of "The polymer compound HP-1 and the phosphorescent compound G1 (polymer compound HP-1/phosphorescent compound G1=70 wt %/30 wt %) were dissolved in xylene at a concentration of 1.8 wt %." in (Formation of first organic layer) of Example D1.

(Evaluation of Light Emitting Device)

Voltage was applied to the light emitting device D2, to observe EL emission. The chromaticity coordinate (x, y) at 1000 cd/m$^2$ was (0.30, 0.56). The device was driven with constant current at a current value of 0.8 mA, and the time until the luminance reached 50% of the initial luminance was measured, to find a value of 144.7 hours.

<Comparative Example CD1> Fabrication and Evaluation of Light Emitting Device CD1

A light emitting device CD1 was fabricated in the same manner as in Example D1 except that "The compound HTL-M1 and the phosphorescent compound G3 (compound HTL-M1/phosphorescent compound G3=70 wt %/30 wt %) were dissolved in chlorobenzene at a concentration of 0.8 wt %." instead of "The compound HTL-M and the phosphorescent compound G1 (compound HTL-M1/phosphorescent compound G1=70 wt %/30 wt %) were dissolved in chlorobenzene at a concentration of 0.8 wt %." in (Formation of second organic layer) of Example D1, and further, "The polymer compound HP-1 and the phosphorescent compound G3 (polymer compound HP-1/phosphorescent compound G3=70 wt %/30 wt %) were dissolved in xylene at a concentration of 1.8 wt %." instead of "The polymer compound HP-1 and the phosphorescent compound G1 (polymer compound HP-1/phosphorescent compound G1=70 wt %/30 wt %) were dissolved in xylene at a concentration of 1.8 wt %." in (Formation of first organic layer) of Example D1.

(Evaluation of Light Emitting Device)

Voltage was applied to the light emitting device CD1, to observe EL emission. The chromaticity coordinate (x, y) at 1000 cd/m$^2$ was (0.28, 0.63). The device was driven with constant current at a current value of 0.8 mA, and the time until the luminance reached 50% of the initial luminance was measured, to find a value of 13.2 hours.

<Comparative Example CD2> Fabrication and Evaluation of Light Emitting Device CD2

A light emitting device CD2 was fabricated in the same manner as in Example D1 except that "Only the compound HTL-M1 was dissolved in chlorobenzene at a concentration of 0.9 wt %." instead of "The compound HTL-M1 and the phosphorescent compound G1 (compound HTL-M1/phosphorescent compound G1=70 wt %/30 wt %) were dissolved in chlorobenzene at a concentration of 0.8 wt %." in (Formation of second organic layer) of Example D1, and further, "The polymer compound HP-1 and the phosphorescent compound G2 (polymer compound HP-1/phosphorescent compound G2=70 wt %/30 wt %) were dissolved in xylene at a concentration of 1.8 wt %." instead of "The polymer compound HP-1 and the phosphorescent compound G1 (polymer compound HP-1/phosphorescent compound G1=70 wt %/30 wt %) were dissolved in xylene at a concentration of 1.8 wt %." in (Formation of first organic layer) of Example D1.

(Evaluation of Light Emitting Device)

Voltage was applied to the light emitting device CD2, to observe EL emission. The chromaticity coordinate (x, y) at 1000 cd/m$^2$ was (0.26, 0.43). The device was driven with constant current at a current value of 0.8 mA, and the time until the luminance reached 50% of the initial luminance was measured, to find a value of 1.0 hour.

TABLE 2

| | Light emitting device | Formation of second organic layer | | Formation of first organic layer | | Luminance life (hr) |
|---|---|---|---|---|---|---|
| | | material | material ratio (wt %) | material | material ratio (wt %) | |
| Example D1 | D1 | HTL-M1/G1 | 70/30 | HP-1/G1 | 70/30 | 125.1 |
| Example D2 | D2 | HTL-M1/G2 | 70/30 | HP-1/G2 | 70/30 | 144.7 |
| Comparative Example CD1 | CD1 | HTL-M1/G3 | 70/30 | HP-1/G3 | 70/30 | 13.2 |
| Comparative Example CD2 | CD2 | HTL-M1 | 100 | HP-1/G2 | 70/30 | 1.0 |

<Example D3> Fabrication and Evaluation of Light Emitting Device D3

A light emitting device D3 was fabricated in the same manner as in Example D1 except that "The compound HTL-M1 and the phosphorescent compound R1 (compound HTL-M1/phosphorescent compound R1=90 wt %/10 wt %) were dissolved in chlorobenzene at a concentration of 0.9 wt %." instead of "The compound HTL-M1 and the phosphorescent compound G1 (compound HTL-M1/phosphorescent compound G1=70 wt %/30 wt %) were dissolved in chlorobenzene at a concentration of 0.8 wt %." in (Formation of second organic layer) of Example D1, and further, "The polymer compound HP-2 and the phosphorescent compound R1 (polymer compound HP-2/phosphorescent compound R1=90 wt %/10 wt %) were dissolved in xylene at a concentration of 1.7 wt %." instead of "The polymer compound HP-1 and the phosphorescent compound G1 (polymer compound HP-1/phosphorescent compound G1=70 wt %/30 wt %) were dissolved in xylene at a concentration of 1.8 wt %." in (Formation of first organic layer) of Example D1.

(Evaluation of Light Emitting Device)

Voltage was applied to the light emitting device D3, to observe EL emission. The chromaticity coordinate (x, y) at 1000 cd/m$^2$ was (0.67, 0.32). The device was driven with constant current at a current value of 0.4 mA, and the time until the luminance reached 80% of the initial luminance was measured, to find a value of 16.4 hours.

<Example D4> Fabrication and Evaluation of Light Emitting Device D4

A light emitting device D4 was fabricated in the same manner as in Example D1 except that "The compound HTL-M and the phosphorescent compound R2 (compound HTL-M1/phosphorescent compound R2=90 wt %/10 wt %) were dissolved in chlorobenzene at a concentration of 0.9 wt %." instead of "The compound HTL-M and the phosphorescent compound G1 (compound HTL-M1/phosphorescent compound G1=70 wt %/30 wt %) were dissolved in chlorobenzene at a concentration of 0.8 wt %." in (Formation of second organic layer) of Example D1, and further, "The polymer compound HP-2 and the phosphorescent compound R2 (polymer compound HP-2/phosphorescent compound R2=90 wt %/10 wt %) were dissolved in xylene at a concentration of 1.7 wt %." instead of "The polymer compound HP-1 and the phosphorescent compound G1 (polymer compound HP-1/phosphorescent compound G1=70 wt %/30 wt %) were dissolved in xylene at a concentration of 1.8 wt %." in (Formation of first organic layer) of Example D1.

(Evaluation of Light Emitting Device)

Voltage was applied to the light emitting device D4, to observe EL emission. The chromaticity coordinate (x, y) at 1000 cd/m$^2$ was (0.65, 0.35). The device was driven with constant current at a current value of 0.4 mA, and the time until the luminance reached 80% of the initial luminance was measured, to find a value of 29.9 hours.

<Comparative Example CD3> Fabrication and Evaluation of Light Emitting Device CD3

A light emitting device CD3 was fabricated in the same manner as in Example D1 except that "The compound HTL-M1 and the phosphorescent compound R3 (compound HTL-M1/phosphorescent compound R3=90 wt %/10 wt %) were dissolved in chlorobenzene at a concentration of 1.0 wt %." instead of "The compound HTL-M1 and the phosphorescent compound G1 (compound HTL-M1/phosphorescent compound G1=70 wt %/30 wt %) were dissolved in chlorobenzene at a concentration of 0.8 wt %." in (Formation of second organic layer) of Example D1, and further, "The polymer compound HP-2 and the phosphorescent compound R3 (polymer compound HP-2/phosphorescent compound R3=90 wt %/10 wt %) were dissolved in xylene at a concentration of 1.7 wt %." instead of "The polymer compound HP-1 and the phosphorescent compound G1 (polymer compound HP-1/phosphorescent compound G1=70 wt %/30 wt %) were dissolved in xylene at a concentration of 1.8 wt %." in (Formation of first organic layer) of Example D1.

(Evaluation of Light Emitting Device)

Voltage was applied to the light emitting device CD3, to observe EL emission. The chromaticity coordinate (x, y) at 1000 cd/m$^2$ was (0.67, 0.32). The device was driven with constant current at a current value of 0.4 mA, and the time until the luminance reached 80% of the initial luminance was measured, to find a value of 15.2 hours.

TABLE 3

| | Light emitting device | Formation of second organic layer | | Formation of first organic layer | | Luminance life (hr) |
|---|---|---|---|---|---|---|
| | | material | material ratio (wt %) | material | material ratio (wt %) | |
| Example D3 | D3 | HTL-M1/R1 | 90/10 | HP-2/R1 | 90/10 | 16.4 |
| Example D4 | D4 | HTL-M1/R2 | 90/10 | HP-2/R2 | 90/10 | 29.9 |
| Comparative Example CD3 | CD3 | HTL-M1/R3 | 90/10 | HP-2/R3 | 90/10 | 15.2 |

<Example D5> Fabrication and Evaluation of Light Emitting Device D5

(Formation of Anode and Hole Injection Layer)

An ITO film with a thickness of 45 nm was attached to a glass substrate by a sputtering method, to form an anode. On the anode, a polythiophene-sulfonic acid type hole injection agent AQ-1200 (manufactured by Plextronics) was spin-coated to form a film with a thickness of 35 nm, and the film was heated on a hot plate at 170° C. for 15 minutes under an air atmosphere, to form a hole injection layer.

(Formation of Second Organic Layer)

The compound HTL-M1 and the phosphorescent compound B1 (compound HTL-M1/phosphorescent compound B1=85 wt %/15 wt %) were dissolved in chlorobenzene at a concentration of 0.8 wt %. The resultant chlorobenzene solution was spin-coated to form a film with a thickness of 20 nm on the hole injection layer, and the film was heated on a hot plate at 180° C. for 60 minutes under a nitrogen gas atmosphere, to form a second organic layer. By this heating, the compound HTL-M1 was converted to a crosslinked body.

(Formation of First Organic Layer)

The polymer compound HP-3 and the phosphorescent compound B1 (polymer compound HP-3/phosphorescent compound B1=70 wt %/30 wt %) were dissolved in toluene at a concentration of 1.0 wt %. The resultant toluene solution was spin-coated to a form a film with a thickness of 60 nm on the second organic layer, and the film was heated at 130° C. for 10 minutes under a nitrogen gas atmosphere, to form a first organic layer.

(Formation of Electron Transporting Layer)

The polymer compound ET1 was dissolved in 2,2,3,3,4,4,5,5-octafluoro-1-pentanol at a concentration of 0.25 wt %. The resultant 2,2,3,3,4,4,5,5-octafluoro-1-pentanol solution was spin-coated to form a film with a thickness of 10 nm on the first organic layer, and the film was heated at 130° C. for 10 minutes under a nitrogen gas atmosphere, to form an electron transporting layer.

(Formation of Cathode)

The substrate carrying the electron transporting layer formed thereon was placed in a vapor deposition machine, and the internal pressure thereof was reduced to $1.0\times10^{-4}$ Pa or less, then, as a cathode, sodium fluoride was vapor-deposited with a thickness of about 4 nm on the electron transporting layer, subsequently, aluminum was vapor-deposited with a thickness of about 80 nm on the sodium fluoride layer. After vapor deposition, sealing was performed using a glass substrate, to fabricate a light emitting device D5.

(Evaluation of Light Emitting Device)

Voltage was applied to the light emitting device D5, to observe EL emission. The chromaticity coordinate (x, y) at 1000 cd/m² was (0.15, 0.27). The device was driven with constant current at a current value of 0.05 mA, and the time until the luminance reached 60% of the initial luminance was measured, to find a value of 86.5 hours.

<Example D6> Fabrication and Evaluation of Light Emitting Device D6

A light emitting device D6 was fabricated in the same manner as in Example D5 except that "The compound HTL-M1 and the phosphorescent compound B1 (compound HTL-M1/phosphorescent compound B1=70 wt %/30 wt %) were dissolved in chlorobenzene at a concentration of 0.8 wt %." instead of "The compound HTL-M1 and the phosphorescent compound B1 (compound HTL-M1/phosphorescent compound B1=85 wt %/15 wt %) were dissolved in chlorobenzene at a concentration of 0.8 wt %." in (Formation of second organic layer) of Example D5.

(Evaluation of Light Emitting Device)

Voltage was applied to the light emitting device D6, to observe EL emission. The chromaticity coordinate (x, y) at 1000 cd/m² was (0.15, 0.27). The device was driven with constant current at a current value of 0.05 mA, and the time until the luminance reached 60% of the initial luminance was measured, to find a value of 219.8 hours.

<Comparative Example CD4> Fabrication and Evaluation of Light Emitting Device CD4

A light emitting device CD4 was fabricated in the same manner as in Example D5 except that "Only the compound HTL-M1 was dissolved in chlorobenzene at a concentration of 0.9 wt %." instead of "The compound HTL-M1 and the phosphorescent compound B1 (compound HTL-M1/phosphorescent compound B1=85 wt %/15 wt %) were dissolved in chlorobenzene at a concentration of 0.8 wt %." in (Formation of second organic layer) of Example D5.

(Evaluation of Light Emitting Device)

Voltage was applied to the light emitting device CD4, to observe EL emission. The chromaticity coordinate (x, y) at 1000 cd/m² was (0.15, 0.27). The device was driven with constant current at a current value of 0.05 mA, and the time until the luminance reached 60% of the initial luminance was measured, to find a value of 59.5 hours.

TABLE 4

| | Light emitting device | Formation of second organic layer | | Formation of first organic layer | | Luminance life (hr) |
| --- | --- | --- | --- | --- | --- | --- |
| | | material | material ratio (wt %) | material | material ratio (wt %) | |
| Example D5 | D5 | HTL-M1/B1 | 85/15 | HP-3/B1 | 70/30 | 86.5 |
| Example D6 | D6 | HTL-M1/B1 | 70/30 | HP-3/B1 | 70/30 | 219.8 |
| Comparative Example CD4 | CD4 | HTL-M1 | 100 | HP-3/B1 | 70/30 | 59.5 |

<Example D7> Fabrication and Evaluation of Light Emitting Device D7

A light emitting device D7 was fabricated in the same manner as in Example D5 except that "The compound HTL-M1 and the phosphorescent compound B2 (compound HTL-M1/phosphorescent compound B2=70 wt %/30 wt %) were dissolved in chlorobenzene at a concentration of 1.0 wt %." instead of "The compound HTL-M1 and the phosphorescent compound B1 (compound HTL-M1/phosphorescent compound B1=85 wt %/15 wt %) were dissolved in chlorobenzene at a concentration of 0.8 wt %." in (Formation of second organic layer) of Example D5, and further, "The compound HM-1 and the phosphorescent compound B2 (compound HM-1/phosphorescent compound B2=70 wt %/30 wt %) were dissolved in toluene at a concentration of 2.0 wt %." instead of "The polymer compound HP-3 and the phosphorescent compound B1 (polymer compound HP-3/phosphorescent compound B1=70 wt %/30 wt %) were dissolved in toluene at a concentration of 1.0 wt %." in (Formation of first organic layer) of Example D5.

(Evaluation of Light Emitting Device)

Voltage was applied to the light emitting device D7, to observe EL emission. The chromaticity coordinate (x, y) at 1000 cd/m² was (0.18, 0.38). The device was driven with constant current at a current value of 0.2 mA, and the time until the luminance reached 95% of the initial luminance was measured, to find a value of 714.1 hours.

1.8 wt %." instead of "The polymer compound HP-3 and the phosphorescent compound B1 (polymer compound HP-3/phosphorescent compound B1=70 wt %/30 wt %) were dissolved in toluene at a concentration of 1.0 wt %." in (Formation of first organic layer) of Example D5.

(Evaluation of Light Emitting Device)

Voltage was applied to the light emitting device CD5, to observe EL emission. The chromaticity coordinate (x, y) at 1000 cd/m² was (0.19, 0.40). The device was driven with constant current at a current value of 0.2 mA, and the time until the luminance reached 95% of the initial luminance was measured, to find a value of 0.1 hour.

TABLE 5

| | Light emitting device | Formation of second organic layer | | Formation of first organic layer | | Luminance life (hr) |
|---|---|---|---|---|---|---|
| | | material | material ratio (wt %) | material | material ratio (wt %) | |
| Example D7 | D7 | HTL-M1/B2 | 70/30 | HM-1/B2 | 70/30 | 714.1 |
| Example D8 | D8 | HTL-M1/B3 | 85/15 | HM-1/B3 | 70/30 | 43.4 |
| Comparative Example CD5 | CD5 | HTL-M1 | 100 | HM-1/B2 | 70/30 | 0.1 |

<Example D8> Fabrication and Evaluation of Light Emitting Device D8

A light emitting device D8 was fabricated in the same manner as in Example D5 except that "The compound HTL-M1 and the phosphorescent compound B3 (compound HTL-M1/phosphorescent compound B3=85 wt %/15 wt %) were dissolved in chlorobenzene at a concentration of 0.9 wt %." instead of "The compound HTL-M1 and the phosphorescent compound B1 (compound HTL-M1/phosphorescent compound B1=85 wt %/15 wt %) were dissolved in chlorobenzene at a concentration of 0.8 wt %." in (Formation of second organic layer) of Example D5, and further, "The compound HM-1 and the phosphorescent compound B3 (compound HM-1/phosphorescent compound B3=70 wt %/30 wt %) were dissolved in toluene at a concentration of 1.8 wt %." instead of "The polymer compound HP-3 and the phosphorescent compound B1 (polymer compound HP-3/phosphorescent compound B1=70 wt %/30 wt %) were dissolved in toluene at a concentration of 1.0 wt %." in (Formation of first organic layer) of Example D5.

(Evaluation of Light Emitting Device)

Voltage was applied to the light emitting device D8, to observe EL emission. The chromaticity coordinate (x, y) at 1000 cd/m² was (0.18, 0.38). The device was driven with constant current at a current value of 0.2 mA, and the time until the luminance reached 95% of the initial luminance was measured, to find a value of 43.4 hours.

<Comparative Example CD5> Fabrication and Evaluation of Light Emitting Device CD5

A light emitting device CD5 was fabricated in the same manner as in Example D5 except that "Only the compound HTL-M1 was dissolved in chlorobenzene at a concentration of 0.9 wt %." instead of "The compound HTL-M1 and the phosphorescent compound B1 (compound HTL-M1/phosphorescent compound B1=85 wt %/15 wt %) were dissolved in chlorobenzene at a concentration of 0.8 wt %." in (Formation of second organic layer) of Example D5, and further, "The compound HM-1 and the phosphorescent compound B2 (compound HM-1/phosphorescent compound B2=70 wt %/30 wt %) were dissolved in toluene at a concentration of <Example D9> Fabrication and Evaluation of Light Emitting Device D9

A light emitting device D9 was fabricated in the same manner as in Example D5 except that "The compound HTL-M1 and the phosphorescent compound B2 (compound HTL-M1/phosphorescent compound B2=70 wt %/30 wt %) were dissolved in chlorobenzene at a concentration of 1.0 wt %." instead of "The compound HTL-M1 and the phosphorescent compound B1 (compound HTL-M1/phosphorescent compound B1=85 wt %/15 wt %) were dissolved in chlorobenzene at a concentration of 0.8 wt %." in (Formation of second organic layer) of Example D5, and further, "The compound HM-1, the phosphorescent compound B2, the phosphorescent compound G1 and the phosphorescent compound R1 (compound HM-1/phosphorescent compound B2/phosphorescent compound G1/phosphorescent compound R1=69 wt %/30 wt %/0.6 wt %/0.4 wt %) were dissolved in toluene at a concentration of 2.0 wt %." instead of "The polymer compound HP-3 and the phosphorescent compound B1 (polymer compound HP-3/phosphorescent compound B1=70 wt %/30 wt %) were dissolved in toluene at a concentration of 1.0 wt %." in (Formation of first organic layer) of Example D5.

(Evaluation of Light Emitting Device)

Voltage was applied to the light emitting device D9, to observe EL emission. The chromaticity coordinate (x, y) at 1000 cd/m² was (0.42, 0.41). The device was driven with constant current at a current value of 0.6 mA, and the time until the luminance reached 80% of the initial luminance was measured, to find a value of 18.3 hours.

<Example D10> Fabrication and Evaluation of Light Emitting Device D10

A light emitting device D10 was fabricated in the same manner as in Example D5 except that "The compound HTL-M1, the phosphorescent compound G1 and the phosphorescent compound R1 (compound HTL-M1/phosphorescent compound G1/phosphorescent compound R1=95 wt %/3 wt %/2 wt %) were dissolved in chlorobenzene at a concentration of 1.0 wt %." instead of "The compound HTL-M1 and the phosphorescent compound B1 (compound HTL-M1/phosphorescent compound B1=85 wt %/15 wt %) were dissolved in chlorobenzene at a concentration of 0.8 wt %." in (Formation of second organic layer) of Example D5, and further, "The compound HM-1, the phosphorescent compound B2, the phosphorescent compound G1 and the phosphorescent compound R1 (compound HM-1/phosphorescent compound B2/phosphorescent compound G1/phosphorescent compound R1=69 wt %/30 wt %/0.6 wt %/0.4 wt %) were dissolved in toluene at a concentration of 2.0 wt %." instead of "The polymer compound HP-3 and the phosphorescent compound B1 (polymer compound HP-3/phosphorescent compound B1=70 wt %/30 wt %) were dissolved in toluene at a concentration of 1.0 wt %." in (Formation of first organic layer) of Example D5.
(Evaluation of Light Emitting Device)

Voltage was applied to the light emitting device D10, to observe EL emission. The chromaticity coordinate (x, y) at 1000 cd/m² was (0.41, 0.42). The device was driven with constant current at a current value of 0.6 mA, and the time until the luminance reached 80% of the initial luminance was measured, to find a value of 123.1 hours.

<Comparative Example CD6> Fabrication and Evaluation of Light Emitting Device CD6

A light emitting device CD6 was fabricated in the same manner as in Example D5 except that "Only the compound HTL-M1 was dissolved in chlorobenzene at a concentration of 0.9 wt %." instead of "The compound HTL-M1 and the phosphorescent compound B1 (compound HTL-M1/phosphorescent compound B1=85 wt %/15 wt %) were dissolved in chlorobenzene at a concentration of 0.8 wt %." in (Formation of second organic layer) of Example D5, and further, "The compound HM-1, the phosphorescent compound B2, the phosphorescent compound G1 and the phosphorescent compound R1 (compound HM-1/phosphorescent compound B2/phosphorescent compound G1/phosphorescent compound R1=69 wt %/30 wt %/0.6 wt %/0.4 wt %) were dissolved in toluene at a concentration of 2.0 wt %." instead of "The polymer compound HP-3 and the phosphorescent compound B1 (polymer compound HP-3/phosphorescent compound B1=70 wt %/30 wt %) were dissolved in toluene at a concentration of 1.0 wt %." in (Formation of first organic layer) of Example D5.
(Evaluation of Light Emitting Device)

Voltage was applied to the light emitting device CD6, to observe EL emission. The chromaticity coordinate (x, y) at 1000 cd/m² was (0.38, 0.43). The device was driven with constant current at a current value of 0.6 mA, and the time until the luminance reached 80% of the initial luminance was measured, to find a value of 3.9 hours.

INDUSTRIAL APPLICABILITY

According to the present invention, a light emitting device excellent in luminance life can be provided.

The invention claimed is:
1. A light emitting device comprising
an anode,
a cathode,
a first organic layer disposed between the anode and the cathode and comprising a phosphorescent material, and
a second organic layer disposed between the anode and the cathode and comprising a phosphorescent material and a crosslinked body of a crosslinkable material,
wherein the phosphorescent material contained in the first organic layer and the phosphorescent material contained in the second organic layer comprise the same phosphorescent compound represented by the formula (1), and
the crosslinkable material is a compound represented by the formula (3):

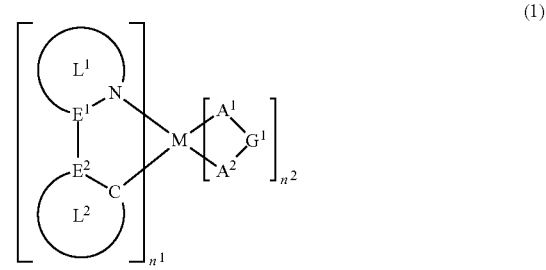

(1)

wherein
M represents a ruthenium atom, a rhodium atom, a palladium atom, an iridium atom or a platinum atom,
$n^1$ represents an integer of 1 or more, $n^2$ represents an integer of 0 or more, $n^1+n^2$ is 2 or 3, and $n^1+n^2$ is 3 when M is a ruthenium atom, a rhodium atom or an iridium atom, while $n^1+n^2$ is 2 when M is a palladium atom or a platinum atom,
$E^1$ and $E^2$ each independently represent a carbon atom or a nitrogen atom, and at least one of $E^1$ and $E^2$ is a carbon atom,
the ring $L^1$ represents an aromatic heterocyclic ring and this aromatic heterocyclic ring optionally has a substituent, and when a plurality of the substituents are present, they may be the same or different and may be combined together to form a ring together with the atoms to which they are attached, and when a plurality of rings $L^1$ are present, they may be the same or different,

TABLE 6

| | Light emitting device | Formation of second organic layer | | Formation of first organic layer | | Luminance life (hrs) |
|---|---|---|---|---|---|---|
| | | material | material ratio (wt %) | material | material ratio (wt %) | |
| Example D9 | D9 | HTL-M1/B2 | 70/30 | HM-1/B2/G1/R1 | 69/30/0.6/0.4 | 18.3 |
| Example D10 | D10 | HTL-M1/G1/R1 | 95/3/2 | HM-1/B2/G1/R1 | 69/30/0.6/0.4 | 123.1 |
| Comparative Example CD6 | CD6 | HTL-M1 | 100 | HM-1/B2/G1/R1 | 69/30/0.6/0.4 | 3.9 | the ring $L^2$ represents an aromatic hydrocarbon ring or an aromatic heterocyclic ring and these rings each optionally have a sub substituent, and when a plurality of the sub substituents are present, they may be the same or different and may be combined together to form a ring together with the atoms to which they are attached, and when a plurality of rings $L^2$ are present, they may be the same or different, at least one of the ring $L^1$ and the ring $L^2$ has a group represented by the formula (2), and $A^1$-$G^1$-$A^2$ represents an anionic bidentate ligand, and $A^1$ and $A^2$ each independently represent a carbon atom, an oxygen atom or a nitrogen atom and these atoms each may be an atom constituting a ring, and $G^1$ represents a single bond or an atomic group constituting the bidentate ligand together with $A^1$ and $A^2$, and when a plurality of $A^1$-$G^1$-$A^2$ are present, they may be the same or different:

$$-R^2 \quad (2)$$

wherein $R^2$ represents an aryl group, a monovalent heterocyclic group or an substituted amino group and these groups each optionally have a substituent:

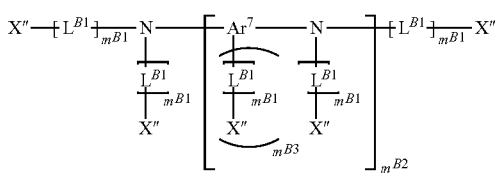

(3)

wherein $m^{B1}$ represents an integer of 0 to 10, $m^{B3}$ represents an integer of 0 to 5, $m^{B2}$ represents an integer of 1 or and the plurality of $m^{B1}$ may be the same or different, and when a plurality of $m^{B3}$ are present, they may be the same or different, $Ar^7$ represents an aromatic hydrocarbon group, a heterocyclic group or a group in which at least one aromatic hydrocarbon ring and at least one heterocyclic ring are bonded directly to each other, and these groups each optionally have a substituent, and when a plurality of $Ar^7$ are present, they may be the same or different, $L^{B1}$ represents an alkylene group, a cycloalkylene group, an arylene group, a divalent heterocyclic group, a group represented by -N(R''')-, an oxygen atom or a sulfur atom and these groups each optionally have a substituent, and R''' represents a hydrogen atom, an alkyl group, a cycloalkyl group, an aryl group or a monovalent heterocyclic group and these groups each optionally have a substituent, and when a plurality of $L^{B1}$ are present, they may be the same or different, and X" represents a crosslinkable group, a hydrogen atom, an alkyl group, a cycloalkyl group, an aryl group or a monovalent heterocyclic group and these groups each optionally have a substituent, and the plurality of X" may be the same or different, and at least one of the plurality of X" is a crosslinkable group.

2. The light emitting device according to claim 1, wherein the first organic layer and the second organic layer are adjacent to each other.

3. The light emitting device according to claim 1, wherein the second organic layer is a layer disposed between the anode and the first organic layer.

4. The light emitting device according to claim 1, wherein the crosslinkable group is at least one crosslinkable group selected from Group A of crosslinkable group:

(Group A of crosslinkable group)

(XL-1)

(XL-2)

(XL-3)

(XL-4)

(XL-5)

(XL-6)

(XL-7)

(XL-8)

(XL-9)

(XL-10)

(XL-11)

-continued

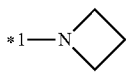 (XL-12)

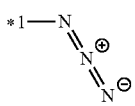 (XL-13)

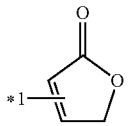 (XL-14)

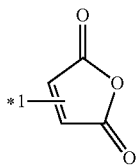 (XL-15)

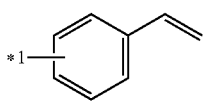 (XL-16)

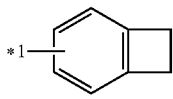 (XL-17)

wherein $R^{XL}$ represents a methylene group, an oxygen atom or a sulfur atom, and $n^{NX}$ represents an integer of 0 to 5, and when a plurality of $R^{XL}$ are present, they may be the same or different, and when a plurality of $n^{XL}$ are present, they may be the same or different, and *1 represents a binding position, and these crosslinkable groups each optionally have a substituent.

5. The light emitting device according to claim 1, wherein the phosphorescent compound represented by the formula (1) is a phosphorescent compound represented by the formula (1-A):

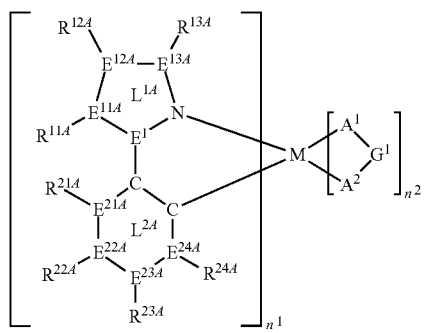 (1-A)

wherein
M, $n^1$, $n^2$, $E^1$, and $A^1$-$G^1$-$A^2$ represent the same meaning as described above,
$E^{11A}$, $E^{12A}$, $E^{13A}$, $E^{21A}$, $E^{22A}$, $E^{23A}$ and $E^{24A}$ each independently represent a nitrogen atom or a carbon atom, and when a plurality of $E^{11A}$, $E^{12A}$, $E^{13A}$, $E^{21A}$, $E^{22A}$, $E^{23A}$ and $E^{24A}$ are present, they may be the same or different at each occurrence, and $R^{11A}$ may be either present or not present when $E^{11A}$ is a nitrogen atom, $R^{12A}$ may be either present or not present when $E^{12A}$ is a nitrogen atom, $R^{13A}$ may be either present or not present when $E^{13A}$ is a nitrogen atom, $R^{21A}$ is not present when $E^{21A}$ is a nitrogen atom, $R^{22A}$ is not present when $E^{22A}$ is a nitrogen atom, $R^{23A}$ is not present when $E^{23A}$ is a nitrogen atom, and $R^{24A}$ is not present when $E^{24A}$ is a nitrogen atom, $R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, a group represented by the formula (2), an aryloxy group or a halogen atom and these groups each optionally have a substituent, and when a plurality of $R^{11A}$, $R^{12A}$, $R^{13A}$, $R^{21A}$, $R^{22A}$, $R^{23A}$ and $R^{24A}$ are present, they may be the same or different at each occurrence, and $R^{11A}$ and $R^{12A}$, $R^{12A}$ and $R^{13A}$, $R^{11A}$ and $R^{21A}$, $R^{21}$ and $R^{22A}$, $R^{22A}$ and $R^{23A}$, and $R^{23A}$ and $R^{24A}$ each may be combined together to form a ring together with the atoms to which they are attached, and at least one of $R^{11A}$, $R^{12A}$, $R^{13A}$, $R^{21A}$, $R^{22A}$, $R^{23A}$ and $R^{24A}$ is a group represented by the formula (2), the ring $L^{1A}$ represents a triazole ring or a diazole ring constituted of a nitrogen atom, $E^1$, $E^{11A}$, $E^{12A}$ and $E^{13A}$, and the ring $L^{2A}$ represents a benzene ring, a pyridine ring or a pyrimidine ring constituted of two carbon atoms, $E^{21A}$, $E^{22A}$, $E^{23A}$ and $E^{24A}$.

6. The light emitting device according to claim 5, wherein the phosphorescent compound represented by the formula (1-A) is a phosphorescent compound represented by the formula (1-A1), a phosphorescent compound represented by the formula (1-A2), a phosphorescent compound represented by the formula (1-A3) or a phosphorescent compound represented by the formula (1-A4):

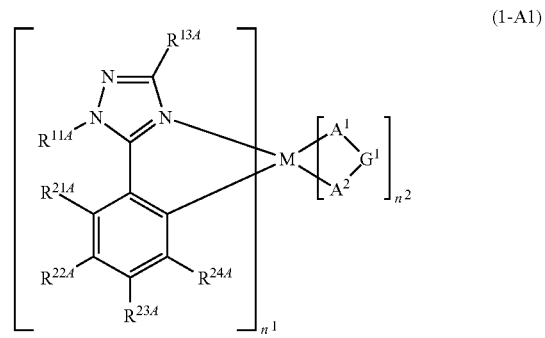 (1-A1)

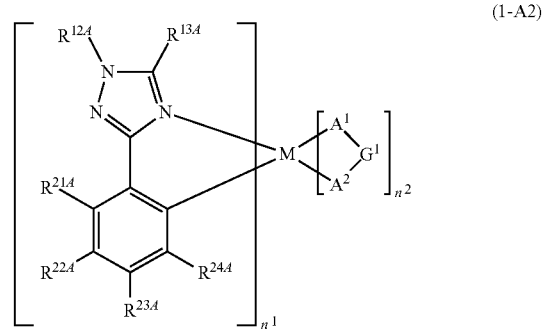 (1-A2)

-continued

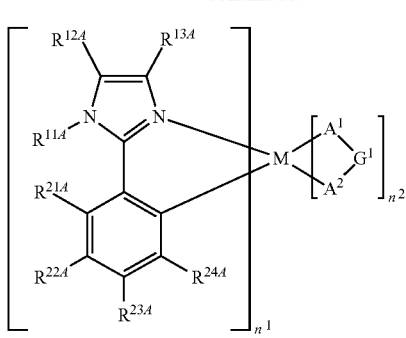

(1-A3)

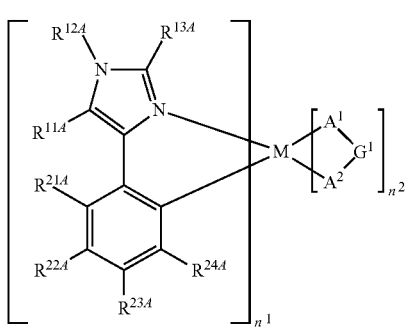

(1-A4)

wherein

M, $n^1$, $n^2$, $R^{11A}$, $R^{12A}$, $R^{13A}$, $R^{21A}$, $R^{22A}$, $R^{23A}$, $R^{24A}$ and $A^1$-$G^1$-$A^2$ represent the same meaning as described above.

7. The light emitting device according to claim 1, wherein the phosphorescent compound represented by the formula (1) is a phosphorescent compound represented by the formula (1-B):

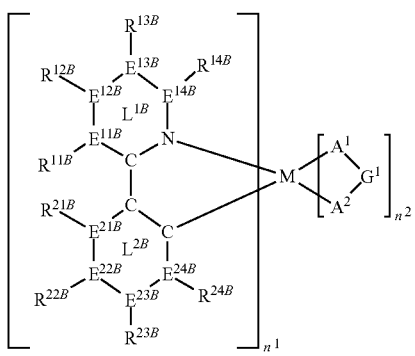

(1-B)

wherein

M, $n^1$, $n^2$ and $A^1$-$G^1$-$A^2$ represent the same meaning as described above, $E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom, and when a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence, and $R^{11B}$ is not present when $E^{11B}$ is a nitrogen atom, $R^{12B}$ is not present when $E^{12B}$ is a nitrogen atom, $R^{13B}$ is not present when $E^{13B}$ is a nitrogen atom, $R^{14B}$ is not present when $E^{14B}$ is a nitrogen atom, $R^{21B}$ is not present when $E^{21B}$ is a nitrogen atom, $R^{22B}$ is not present when $E^{22B}$ is a nitrogen atom, $R^{23B}$ is not present when $E^{23B}$ is a nitrogen atom, and $R^{24B}$ is not present when $E^{24B}$ is a nitrogen atom, $R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, a group represented by the formula (2), an aryloxy group or a halogen atom and these groups each optionally have a substituent, and when a plurality of $R^{11B}$, $R^{12B}$, $R^{13B}$, $R^{14B}$, $R^{21B}$, $R^{22B}$, $R^{23B}$ and $R^{24B}$ are present, they may be the same or different at each occurrence, and $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{24B}$ each may be combined together to form a ring together with the atoms to which they are attached, and at least one of $R^{11B}$, $R^{12B}$, $R^{13B}$, $R^{14B}$, $R^{21B}$, $R^{22B}$, $R^{23B}$ and $R^{24B}$ is a group represented by the formula (2), the ring $L^{1B}$ represents a pyridine ring or a pyrimidine ring constituted of a nitrogen atom, a carbon atom, $E^{11B}$, $E^{12B}$, $E^{13B}$ and $E^{14B}$, and the ring $L^{2B}$ represents a benzene ring, a pyridine ring or a pyrimidine ring constituted of two carbon atoms, $E^{21B}$, $E^{22B}$, $E^{23B}$ and $E^{14B}$.

8. The light emitting device according to claim 7, wherein the phosphorescent compound represented by the formula (1-B) is a phosphorescent compound represented by the formula (1-B1), a phosphorescent compound represented by the formula (1-B2), a phosphorescent compound represented by the formula (1-B3), a phosphorescent compound represented by the formula (1-B4) or a phosphorescent compound represented by the formula (1-B5):

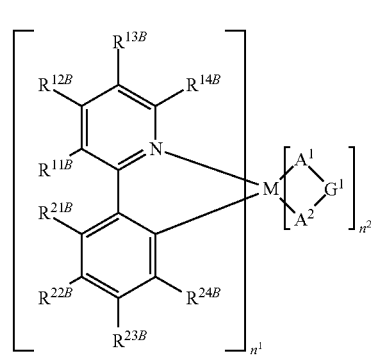

(1-B1)

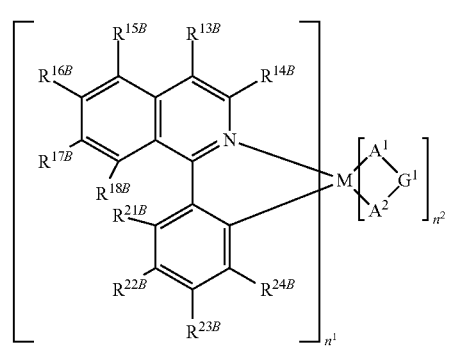

(1-B2)

(1-B3)

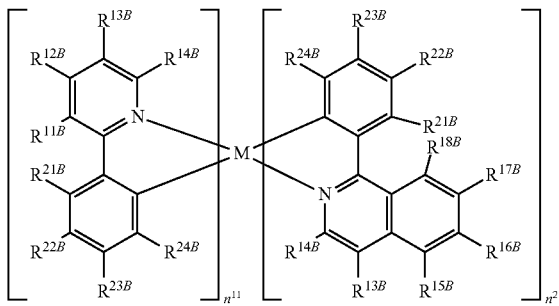

(1-B4)

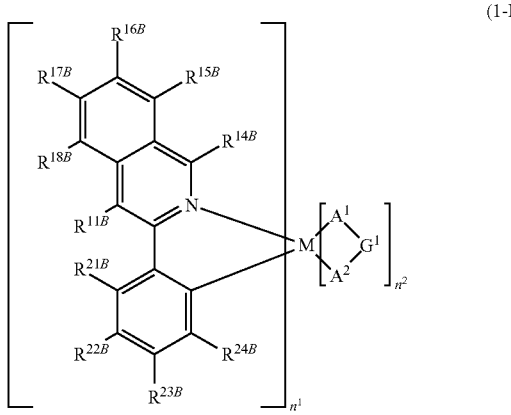

(1-B5)

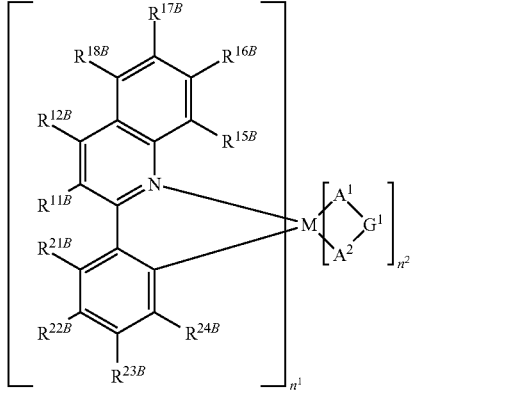

wherein
M, $n^1$, $n^2$, $A^1$-$G^1$-$A^2$, $R^{11B}$, $R^{12B}$, $R^{13B}$, $R^{14B}$, $R^{21B}$, $R^{22B}$, $R^{23B}$ and $R^{24B}$ represent the same meaning as described above, $n^{11}$ and $n^{12}$ each independently represent an integer of 1 or more, $n^{11}+n^{12}$ is 2 or 3, and $n^{11}+n^{12}$ is 3 when M is ruthenium atom, a rhodium atom or an iridium atom, while $n^{11}+n^{12}$ is 2 when M is a palladium atom or a platinum atom, $R^{15B}$, $R^{16B}$, $R^{17B}$ and $R^{18B}$ each independently represent a hydrogen atom, an alkyl group, a cycloalkyl group, an alkoxy group, a cycloalkoxy group, a group represented by the formula (2), an aryloxy group or a halogen atom and these groups each optionally have a substituent, and when a plurality of $R^{15B}$, $R^{16B}$, $R^{17B}$ and $R^{18B}$ are present, they may be the same or different at each occurrence, and $R^{13B}$ and $R^{15B}$ and $R^{16B}$, $R^{16B}$ and $R^{17B}$, $R^{17B}$ and $R^{18B}$, and $R^{18B}$ and $R^{21B}$ each may be combined together to form a ring together with the atoms to which they are attached, and at least one of $R^{11B}$, $R^{12B}$, $R^{13B}$, $R^{14B}$, $R^{21B}$, $R^{22B}$, $R^{23B}$ and $R^{24B}$ is a group represented by the formula (2).

9. The light emitting device according to claim 1, wherein the group represented by the formula (2) is a group represented by the formula (D-A), a group represented by the formula (D-B) or a group represented by the formula (D-C):

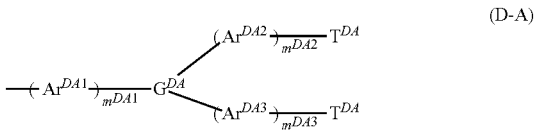

(D-A)

wherein
$m^{DA1}$, $m^{DA2}$ and $m^{DA3}$ each independently represent an integer of 0 or more, $G^{DA}$ represents a nitrogen atom, an aromatic hydrocarbon group or a heterocyclic group and these groups each optionally have a substituent, $Ar^{DA1}$, $Ar^{DA2}$ and $Ar^{DA3}$ each independently represent an arylene group or a divalent heterocyclic group and these groups each optionally have a substituent, and when a plurality of $Ar^{DA1}$, $Ar^{DA2}$ and $Ar^{DA3}$ are present, they may be the same or different at each occurrence, and $T^{DA}$ represents an aryl group or a monovalent heterocyclic group and these groups each optionally have a substituent, and the plurality of $T^{DA}$ may be the same or different:

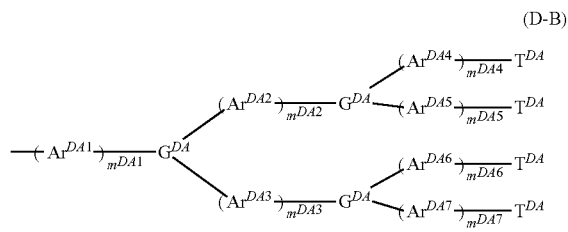

(D-B)

wherein
$M^{DA1}$, $m^{DA2}$, $m^{DA3}$, $m^{DA4}$, $m^{DA5}$, $m^{DA6}$ and $m^{DA7}$ each independently represent an integer of 0 or more, $G^{DA}$ represents a nitrogen atom, an aromatic hydrocarbon group or a heterocyclic group and these groups each optionally have a substituent, and the plurality of $G^{DA}$ may be the same or different, $Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group and these groups each optionally have a substituent, and when a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence, and $T^{DA}$ represents an aryl group or a monovalent heterocyclic group and these groups each optionally have a substituent, and the plurality of $T^{DA}$ may be the same or different:

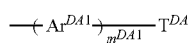
(D-C)

wherein m$^{DA1}$ represents an integer of 0 or more,

Ar$^{DA1}$ represents an arylene group or a divalent heterocyclic group and these groups each optionally have a substituent, and when a plurality of Ar$^{DA1}$ are present, they may be the same or different, and T$^{DA}$ represents an aryl group or a monovalent heterocyclic group and these groups each optionally have a substituent.

10. The light emitting device according to claim 9, wherein the group represented by the formula (D-A) is a group represented by the formula (D-A1), a group represented by the formula (D-A2), a group represented by the formula (D-A3) or a group represented by the formula (D-A4):

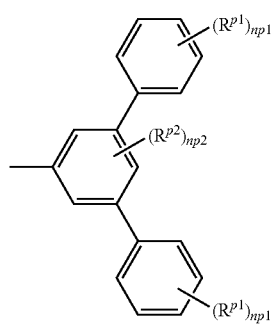
(D-A1)

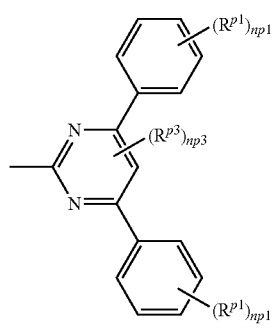
(D-A2)

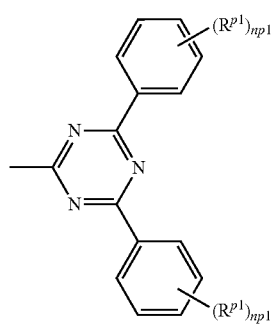
(D-A3)

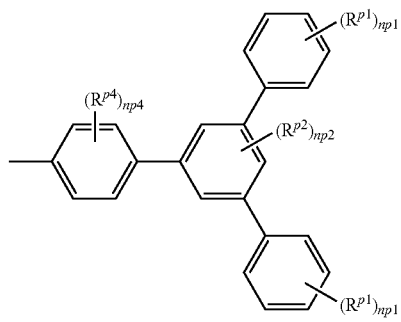
(D-A4)

wherein

R$^{p1}$, R$^{p2}$, R$^{p3}$ and R$^{p4}$ each independently represent an alkyl group, a cycloalkyl group, an alkoxy group, a cycloalkoxy group or a halogen atom, and when a plurality of R$^{p1}$, R$^{p2}$ and R$^{p4}$ are present, they may be the same or different at each occurrence, and np1 represents an integer of 0 to 5, np2 represents an integer of 0 to 3, np3 represents 0 or 1 and np4 represents an integer of 0 to 4, and the plurality of np1 may be the same or different.

11. The light emitting device according to claim 9, wherein the group represented by the formula (D-B) is a group represented by the formula (D-B1), a group represented by the formula (D-B2) or a group represented by the formula (D-B3):

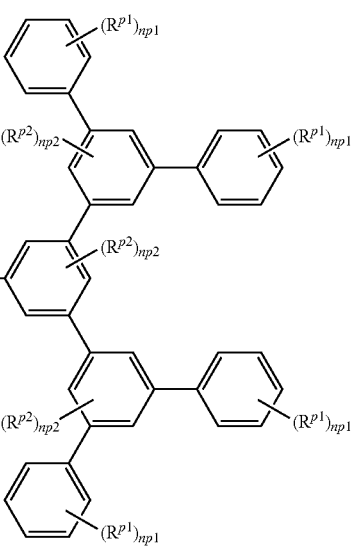
(D-B1)

-continued (D-B2)

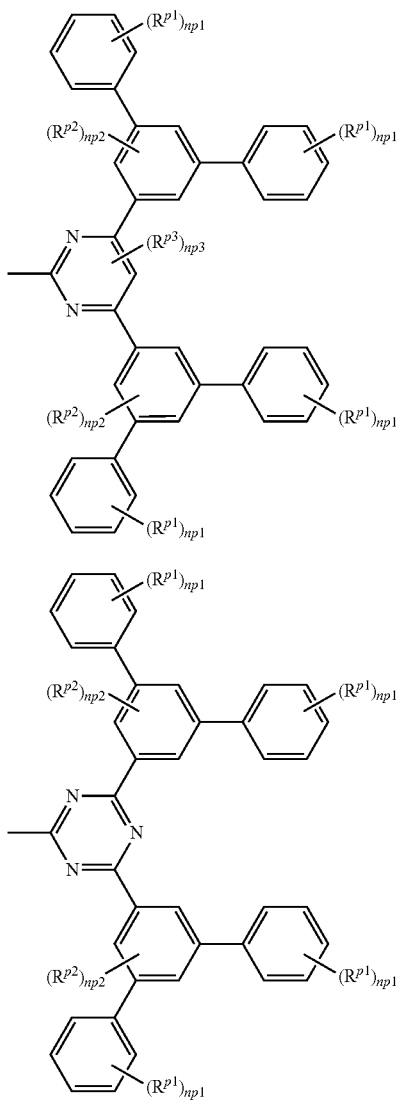

(D-B3)

wherein
R$^{P1}$, R$^{P2}$ and R$^{P3}$ each independently represent an alkyl group, a cycloalkyl group, an alkoxy group, a cycloalkoxy group or a halogen atom, and when a plurality of R$^{P1}$ and R$^{P2}$ are present, they may be the same or different at each occurrence, and
np1 represents an integer of 0 to 5, np2 represents an integer of 0 to 3, and np3 represents 0 or 1, and when a plurality of np1 and np2 are present, they may be the same or different at each occurrence.

12. The light emitting device according to claim 9, wherein the group represented by the formula (D-C) is a group represented by the formula (D-C1), a group represented by the formula (D-C2), a group represented by the formula (D-C3) or a group represented by the formula (D-C4):

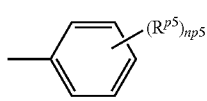

(D-C1)

-continued

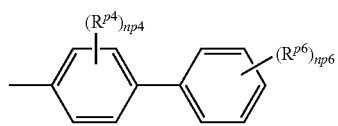

(D-C2)

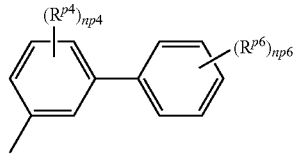

(D-C3)

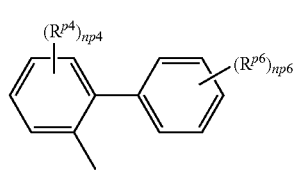

(D-C4)

wherein
R$^{P4}$, R$^{P5}$ and R$^{P6}$ each independently represent an alkyl group, a cycloalkyl group, an alkoxy group, a cycloalkoxy group or a halogen atom, and when a plurality of R$^{P4}$, R$^{P5}$ and R$^{P6}$ are present, they may be the same or different at each occurrence, and
np4 represents an integer of 0 to 4, np5 represents an integer of 0 to 5, and np6 represents an integer of 0 to 5.

13. The light emitting device according to claim 1, wherein the first organic layer is a layer further comprising a compound represented by the formula (H-1):

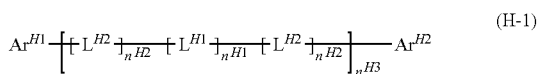

(H-1)

wherein
Ar$^{H1}$ and Ar$^{H2}$ each independently represent an aryl group or a monovalent heterocyclic group and these groups each optionally have a substituent,
n$^{H1}$ and n$^{H2}$ each independently represent 0 or 1, and when a plurality of n$^{H1}$ are present, they may be the same or different, and the plurality of n$^{H2}$ may be the same or different,
n$^{H3}$ represents an integer of 0 or more,
L$^{H1}$ represents an arylene group, a divalent heterocyclic group or a group represented by —[C(R$^{H11}$)$_2$]n$^{H11}$— and these groups each optionally have a substituent, and when a plurality of L$^{H1}$ are present, they may be the same or different, and n$^{H11}$ represents an integer of 1 to 10, and R$^{H11}$ represents a hydrogen atom, an alkyl group, a cycloalkyl group, an alkoxy group, a cycloalkoxy group, an aryl group or a monovalent heterocyclic group and these groups each optionally have a substituent, and the plurality of R$^{H11}$ may be the same or different and may be combined together to form a ring together with the carbon atoms to which they are attached, and
L$^{H2}$ represents a group represented by —N(—L$^{H21}$—R$^{H21}$) and when a plurality of L$^{H2}$ are present, they may be the same or different, and L$^{H21}$ represents a single bond, an arylene group or a divalent heterocyclic group and these groups each optionally have a substituent, and $R^{H21}$ represents a hydrogen atom, an alkyl group, a cycloalkyl group, an aryl group or a monovalent heterocyclic group and these groups each optionally have a substituent.

14. The light emitting device according to claim 1, wherein the first organic layer is a layer further comprising a polymer compound comprising a constitutional unit represented by the formula (Y):

(Y)

wherein $Ar^{Y1}$ represents an arylene group, a divalent heterocyclic group or a divalent group in which at least one arylene group and at least one divalent heterocyclic group are bonded directly to each other, and these groups each optionally have a substituent.

* * * * *